US012625435B2

(12) United States Patent
Chiu et al.

(10) Patent No.: US 12,625,435 B2
(45) Date of Patent: May 12, 2026

(54) RETICLE STORAGE CABINET SYSTEM AND METHOD USING THE SAME

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Hsin-Min Hsueh, New Taipei (TW); Hsing-Min Wen, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 185 days.

(21) Appl. No.: 18/513,844

(22) Filed: Nov. 20, 2023

(65) Prior Publication Data

US 2024/0160116 A1     May 16, 2024

Related U.S. Application Data

(63) Continuation of application No. 17/684,879, filed on Mar. 2, 2022, now Pat. No. 11,822,257.

(60) Provisional application No. 63/249,155, filed on Sep. 28, 2021, provisional application No. 63/160,066, filed on Mar. 12, 2021.

(51) Int. Cl.
*G03F 7/20*          (2006.01)
*G03F 7/00*          (2006.01)
(52) U.S. Cl.
CPC ............................... *G03F 7/70741* (2013.01)

(58) Field of Classification Search
CPC .......... G03F 7/70741; G03F 1/66; G03F 1/22; H01L 21/67359; H01L 21/67294; H01L 21/67769
See application file for complete search history.

(56) References Cited

U.S. PATENT DOCUMENTS

| | | | | |
|---|---|---|---|---|
| 6,098,809 | A * | 8/2000 | Okada ............... | H01L 21/67373 |
| | | | | 206/711 |
| 2003/0082030 | A1* | 5/2003 | del Puerto ................ | G03F 1/24 |
| | | | | 414/217 |
| 2015/0262855 | A1* | 9/2015 | Yoshioka .......... | H01L 21/67379 |
| | | | | 414/277 |
| 2018/0224311 | A1* | 8/2018 | Ueda ................. | H01L 21/67253 |
| 2018/0286726 | A1* | 10/2018 | Rebstock .......... | H01L 21/02041 |
| 2023/0011873 | A1* | 1/2023 | Rebstock ............ | G03F 7/70866 |

FOREIGN PATENT DOCUMENTS

WO     WO-2021104681 A1 *  6/2021   ....... H01L 21/67389

* cited by examiner

*Primary Examiner* — Mesfin T Asfaw
(74) *Attorney, Agent, or Firm* — Troutman Pepper Locke LLP; Tim Tingkang Xia, Esq.

(57) ABSTRACT

The present invention discloses a reticle storage pod including an outer pod which includes an outer cover and an outer base. The outer cover and the outer base can be coupled to securely accommodate one of a first inner pod and a second inner pod that are differently structured in the outer pod. The first inner pod and the second inner pod are for individually accommodating a reticle. The outer cover is provided with at least one first hold-down mechanism and at least one second hold-down mechanism, and the first hold-down mechanism and the second hold-down mechanism respectively act on a cover of the first inner pod and a cover of the second inner pod that are differently structured.

19 Claims, 50 Drawing Sheets

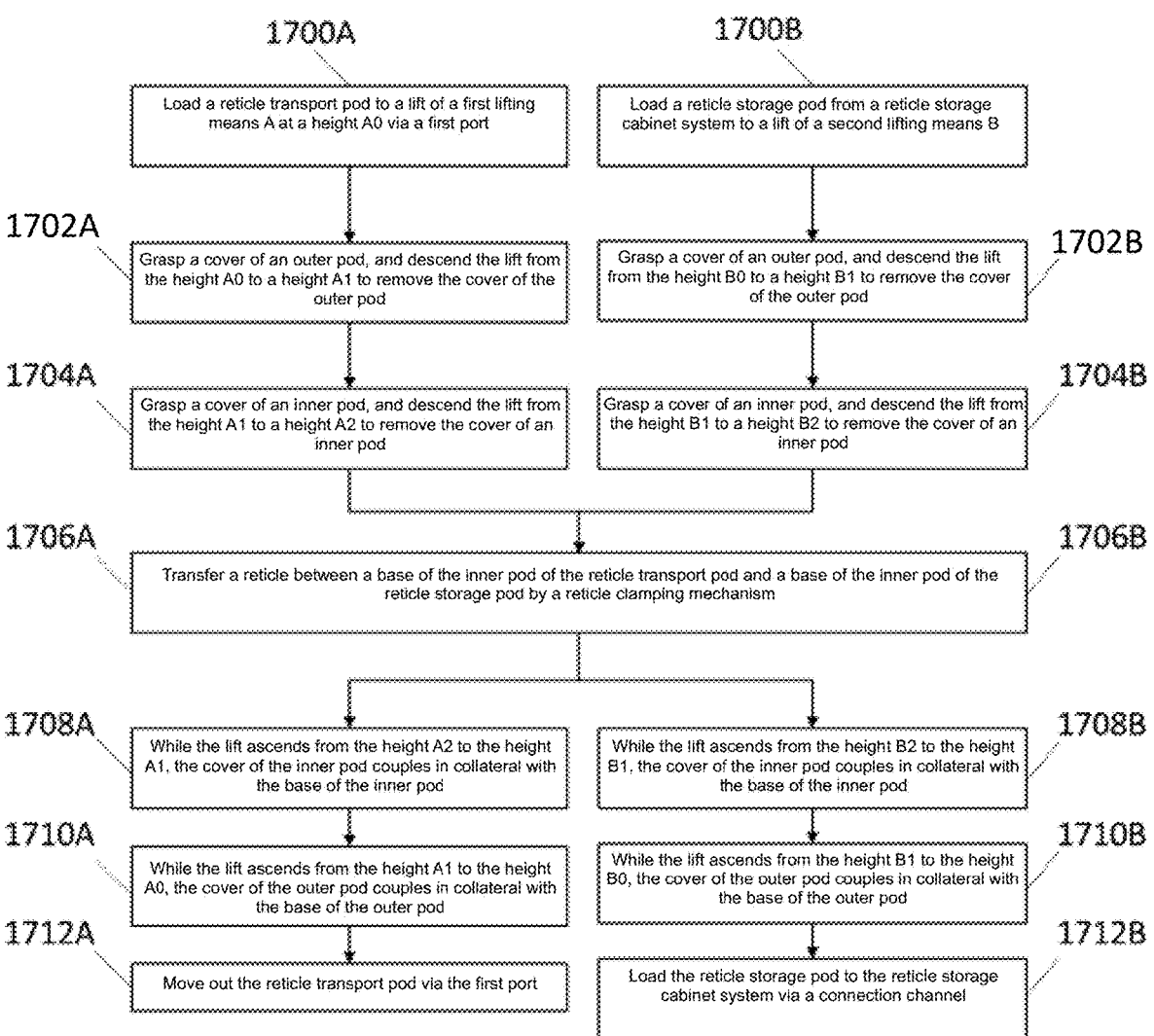

1700A

Load a reticle transport pod to a lift of a first lifting means A at a height A0 via a first port

1700B

Load a reticle storage pod from a reticle storage cabinet system to a lift of a second lifting means B

1702A

Grasp a cover of an outer pod, and descend the lift from the height A0 to a height A1 to remove the cover of the outer pod

1702B

Grasp a cover of an outer pod, and descend the lift from the height B0 to a height B1 to remove the cover of the outer pod

1704A

Grasp a cover of an inner pod, and descend the lift from the height A1 to a height A2 to remove the cover of an inner pod

1704B

Grasp a cover of an inner pod, and descend the lift from the height B1 to a height B2 to remove the cover of an inner pod

1706A

Transfer a reticle between a base of the inner pod of the reticle transport pod and a base of the inner pod of the reticle storage pod by a reticle clamping mechanism

1706B

1708A

While the lift ascends from the height A2 to the height A1, the cover of the inner pod couples in collateral with the base of the inner pod

1708B

While the lift ascends from the height B2 to the height B1, the cover of the inner pod couples in collateral with the base of the inner pod

1710A

While the lift ascends from the height A1 to the height A0, the cover of the outer pod couples in collateral with the base of the outer pod

1710B

While the lift ascends from the height B1 to the height B0, the cover of the outer pod couples in collateral with the base of the outer pod

1712A

Move out the reticle transport pod via the first port

1712B

Load the reticle storage pod to the reticle storage cabinet system via a connection channel

FIG.17

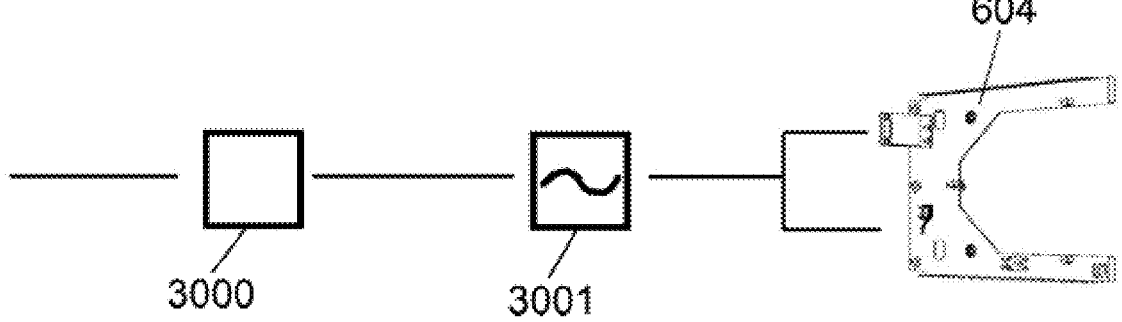
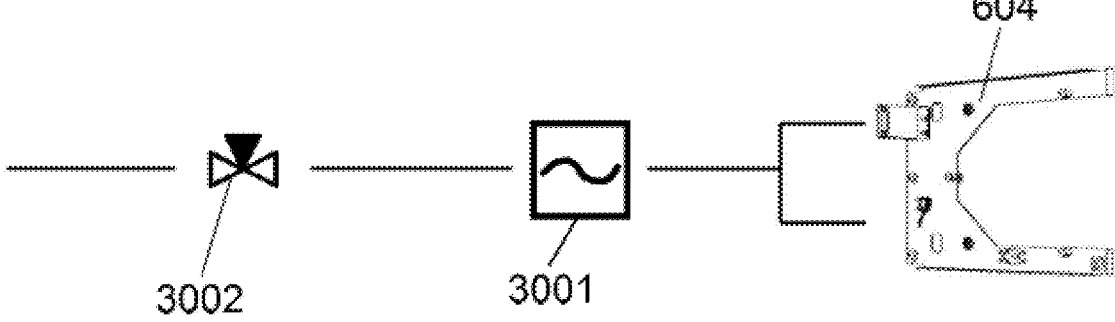
FIG.30

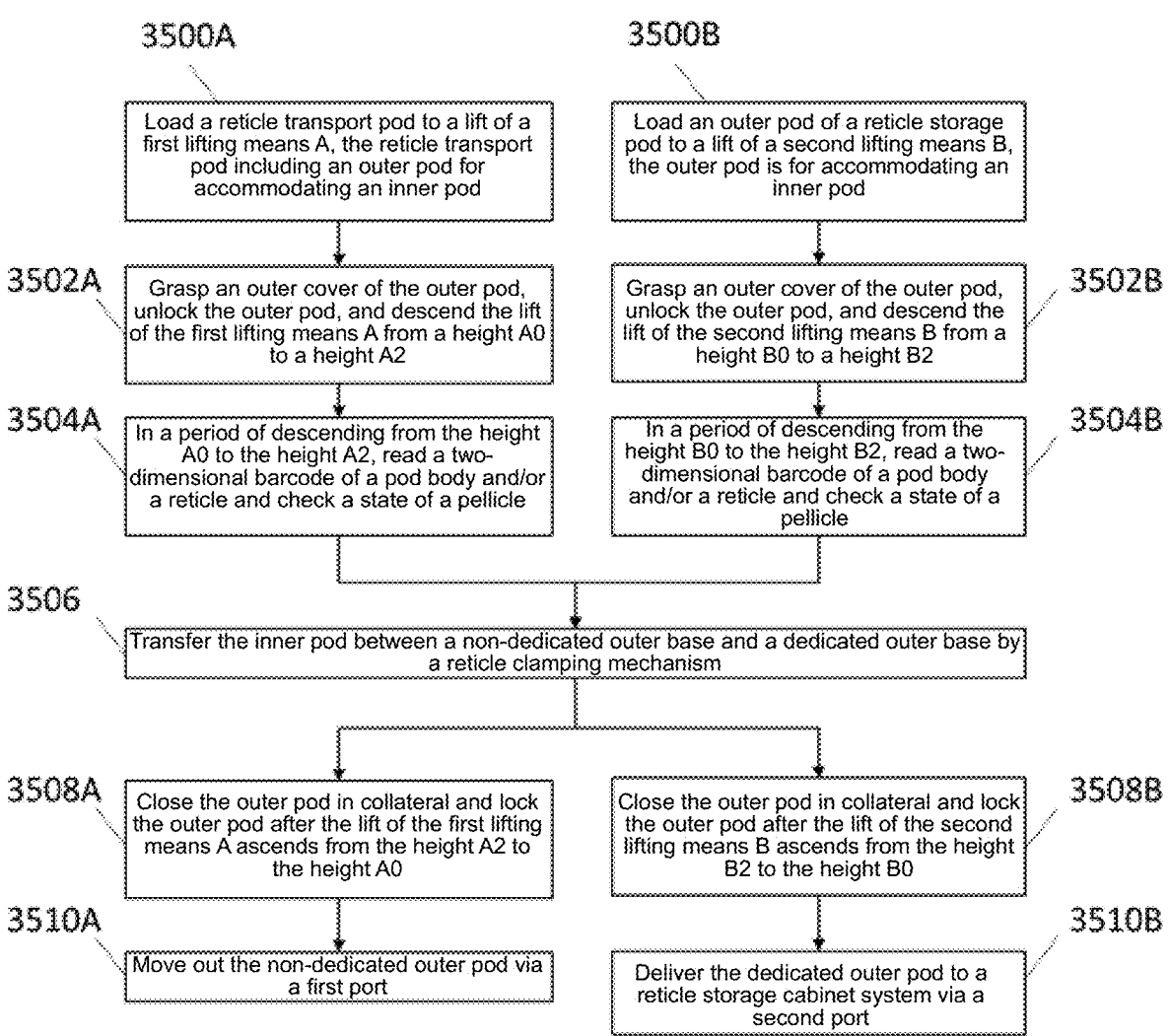

3500A

3500B

Load a reticle transport pod to a lift of a first lifting means A, the reticle transport pod including an outer pod for accommodating an inner pod Load an outer pod of a reticle storage pod to a lift of a second lifting means B, the outer pod is for accommodating an inner pod

3502A

Grasp an outer cover of the outer pod, unlock the outer pod, and descend the lift of the first lifting means A from a height A0 to a height A2

Grasp an outer cover of the outer pod, unlock the outer pod, and descend the lift of the second lifting means B from a height B0 to a height B2

3502B

3504A

In a period of descending from the height A0 to the height A2, read a two-dimensional barcode of a pod body and/or a reticle and check a state of a pellicle In a period of descending from the height B0 to the height B2, read a two-dimensional barcode of a pod body and/or a reticle and check a state of a pellicle

3504B

3506

Transfer the inner pod between a non-dedicated outer base and a dedicated outer base by a reticle clamping mechanism

3508A

Close the outer pod in collateral and lock the outer pod after the lift of the first lifting means A ascends from the height A2 to the height A0

Close the outer pod in collateral and lock the outer pod after the lift of the second lifting means B ascends from the height B2 to the height B0

3508B

3510A

Move out the non-dedicated outer pod via a first port

Deliver the dedicated outer pod to a reticle storage cabinet system via a second port

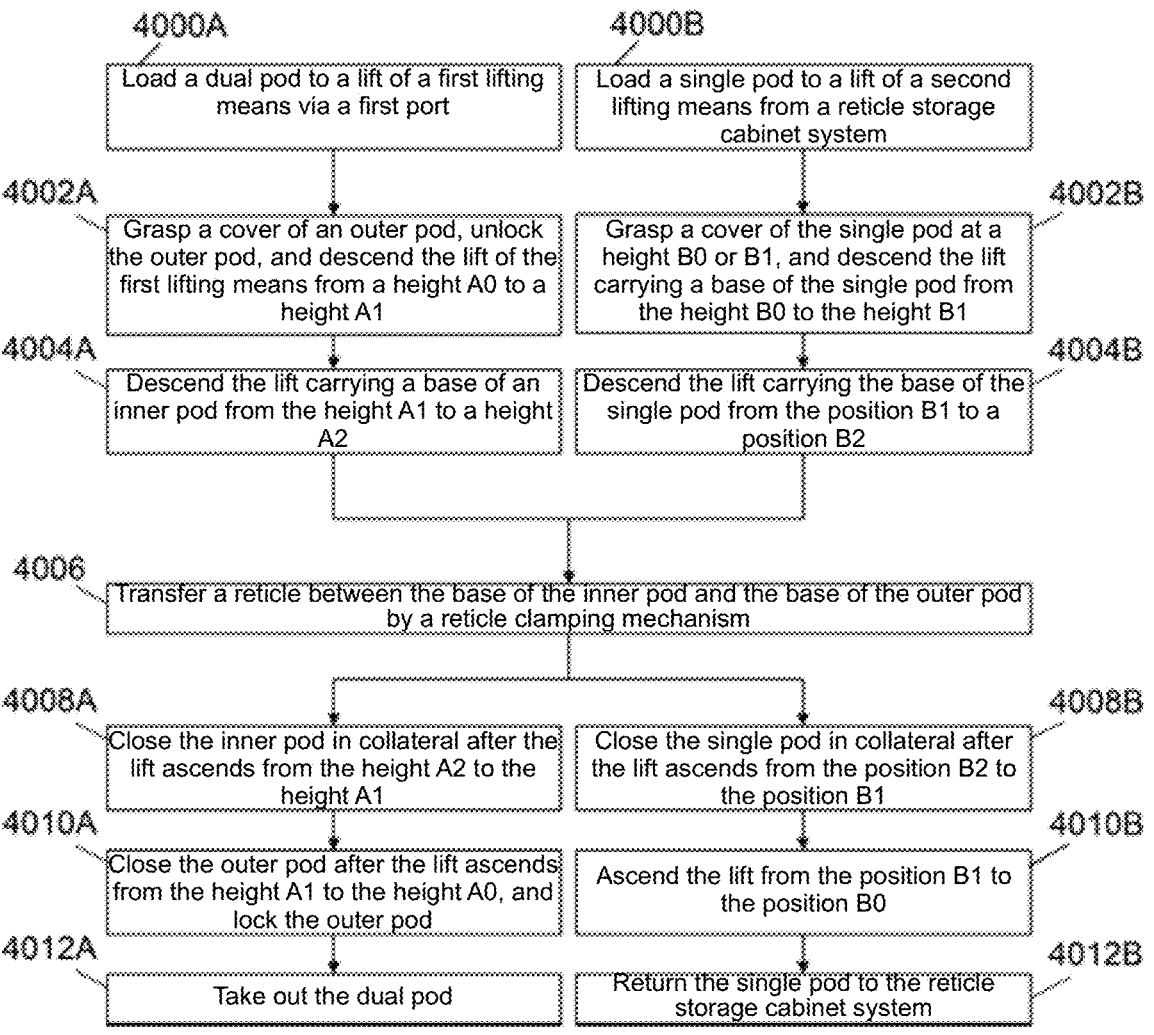

4000A

Load a dual pod to a lift of a first lifting means via a first port

4000B

Load a single pod to a lift of a second lifting means from a reticle storage cabinet system

4002A

Grasp a cover of an outer pod, unlock the outer pod, and descend the lift of the first lifting means from a height A0 to a height A1

4002B

Grasp a cover of the single pod at a height B0 or B1, and descend the lift carrying a base of the single pod from the height B0 to the height B1

4004A

Descend the lift carrying a base of an inner pod from the height A1 to a height A2

4004B

Descend the lift carrying the base of the single pod from the position B1 to a position B2

4006

Transfer a reticle between the base of the inner pod and the base of the outer pod by a reticle clamping mechanism

4008A

Close the inner pod in collateral after the lift ascends from the height A2 to the height A1

4008B

Close the single pod in collateral after the lift ascends from the position B2 to the position B1

4010A

Close the outer pod after the lift ascends from the height A1 to the height A0, and lock the outer pod

4010B

Ascend the lift from the position B1 to the position B0

4012A

Take out the dual pod

4012B

Return the single pod to the reticle storage cabinet system

FIG.40

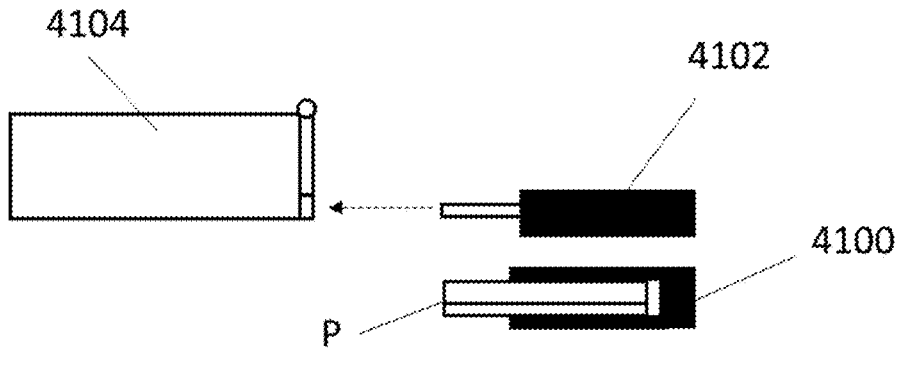
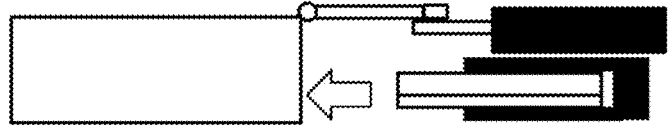
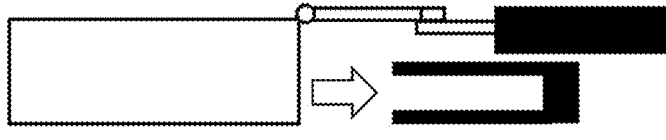
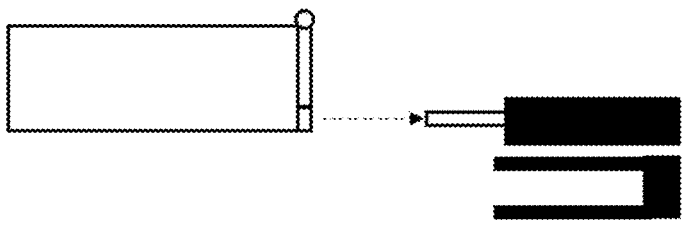
FIG.41A

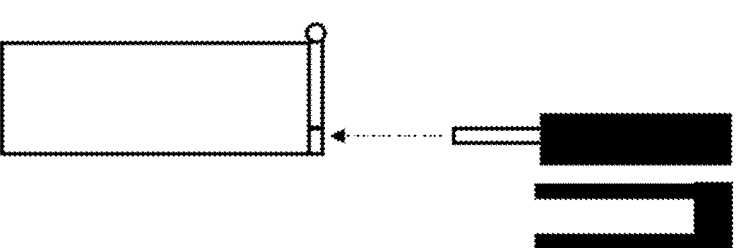
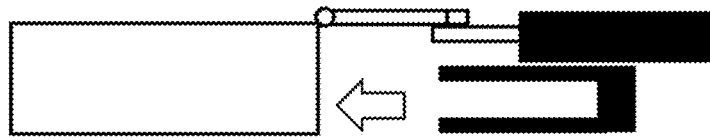
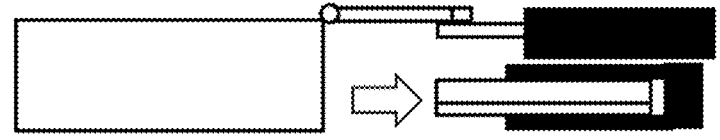
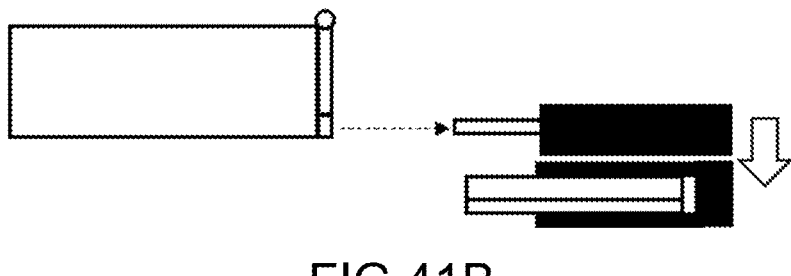
FIG.41B

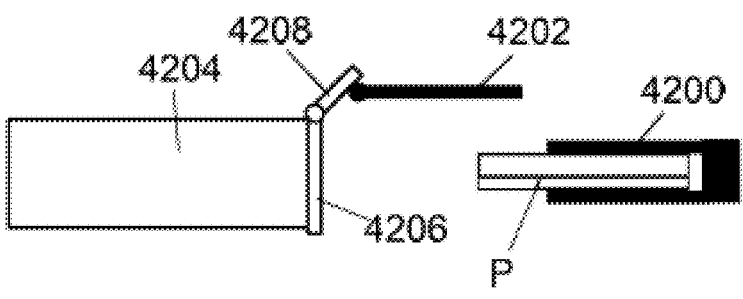
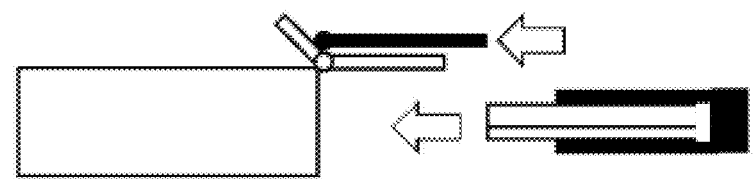
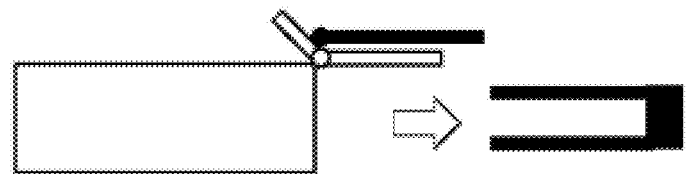
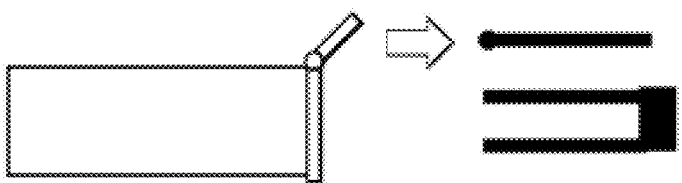
FIG.42A

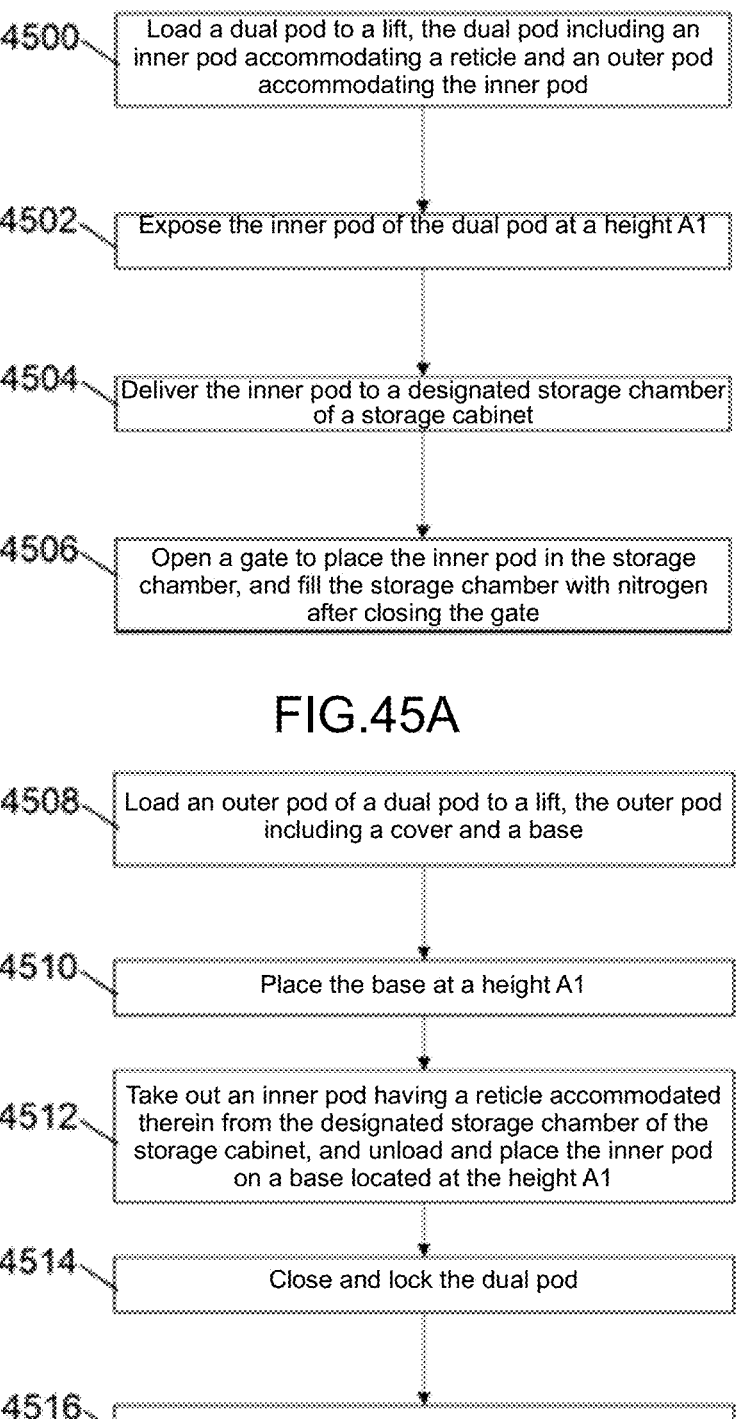

4500 — Load a dual pod to a lift, the dual pod including an inner pod accommodating a reticle and an outer pod accommodating the inner pod 4502 — Expose the inner pod of the dual pod at a height A1

4504 — Deliver the inner pod to a designated storage chamber of a storage cabinet 4506 — Open a gate to place the inner pod in the storage chamber, and fill the storage chamber with nitrogen after closing the gate

FIG.45A

4508 — Load an outer pod of a dual pod to a lift, the outer pod including a cover and a base 4510 — Place the base at a height A1

4512 — Take out an inner pod having a reticle accommodated therein from the designated storage chamber of the storage cabinet, and unload and place the inner pod on a base located at the height A1

4514 — Close and lock the dual pod

4516 — Take out the dual pod

FIG.45B

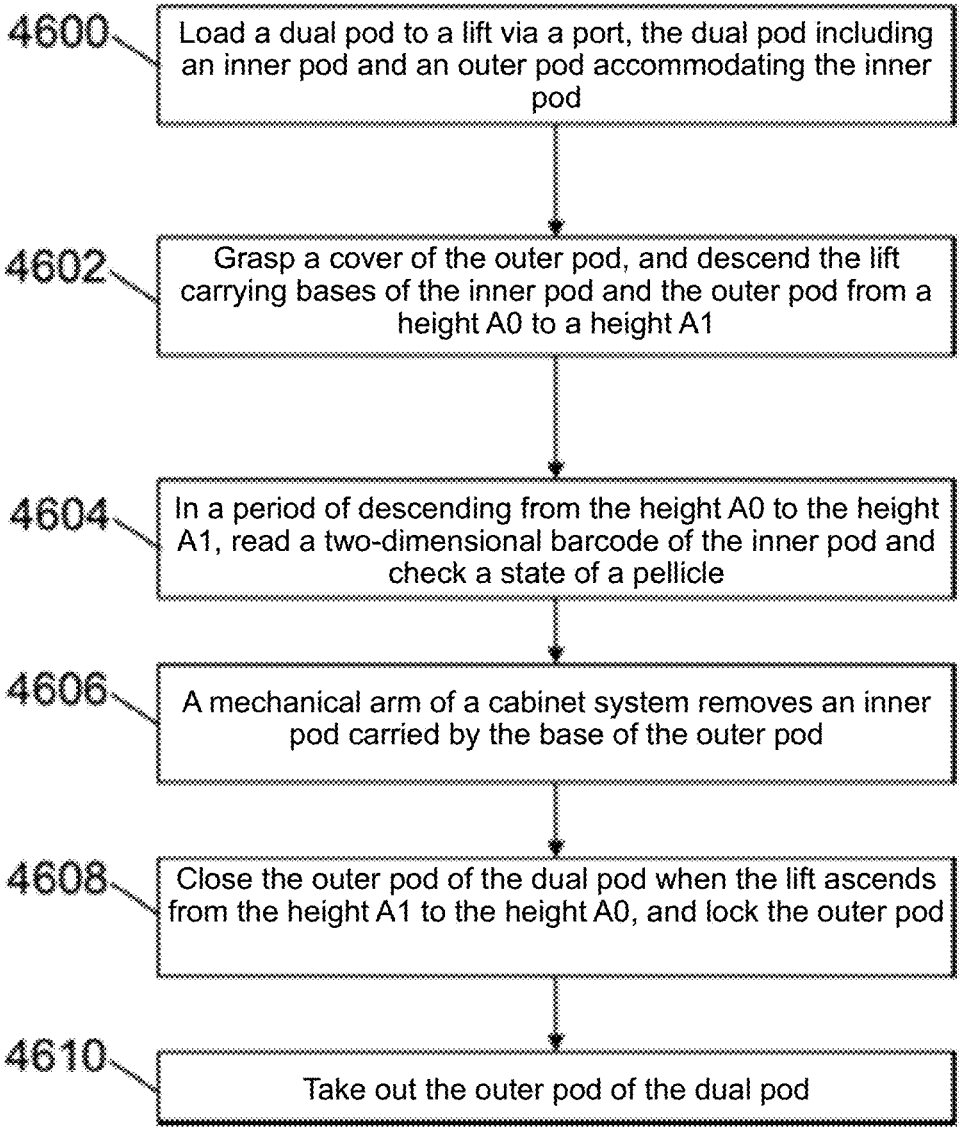

4600 — Load a dual pod to a lift via a port, the dual pod including an inner pod and an outer pod accommodating the inner pod 4602 — Grasp a cover of the outer pod, and descend the lift carrying bases of the inner pod and the outer pod from a height A0 to a height A1

4604 — In a period of descending from the height A0 to the height A1, read a two-dimensional barcode of the inner pod and check a state of a pellicle 4606 — A mechanical arm of a cabinet system removes an inner pod carried by the base of the outer pod 4608 — Close the outer pod of the dual pod when the lift ascends from the height A1 to the height A0, and lock the outer pod 4610 — Take out the outer pod of the dual pod

FIG.46A

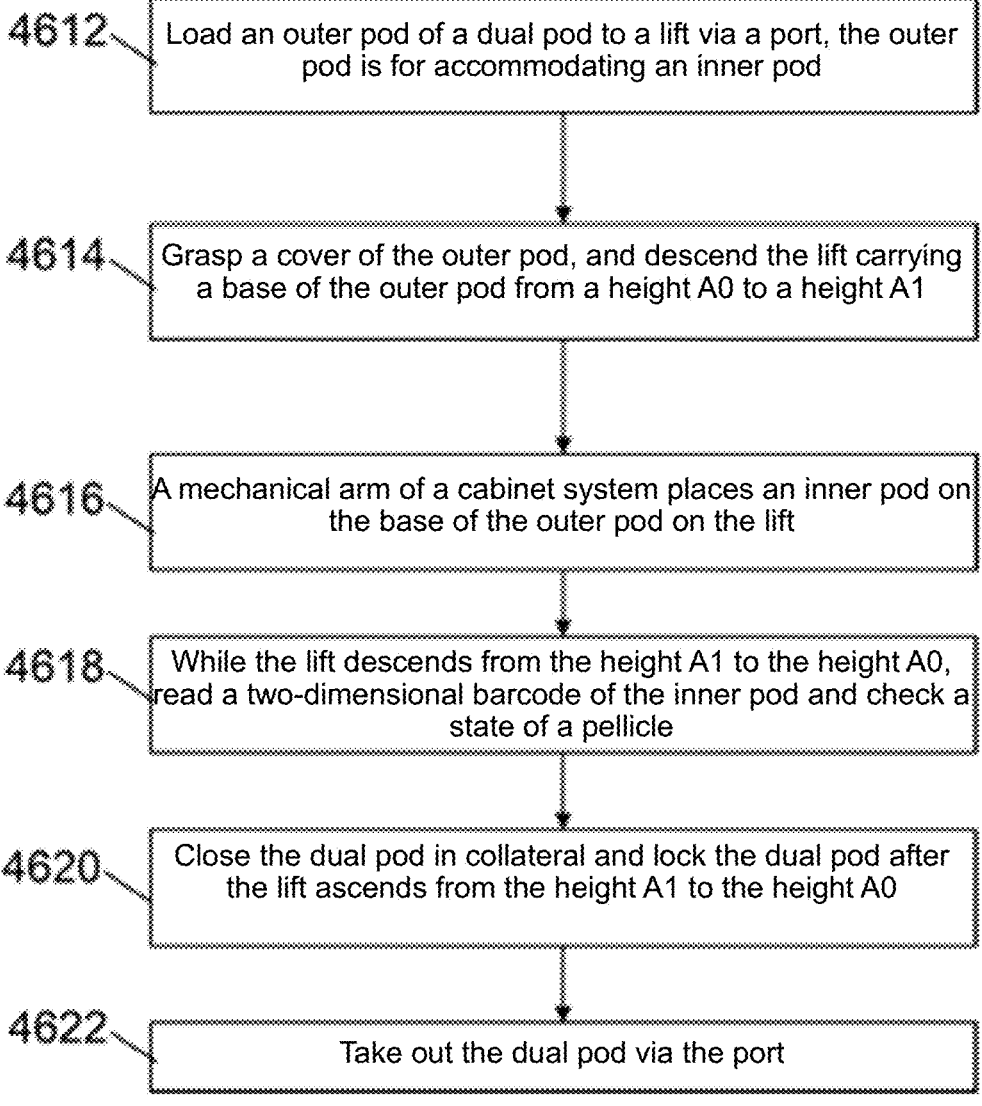

4612 — Load an outer pod of a dual pod to a lift via a port, the outer pod is for accommodating an inner pod 4614 — Grasp a cover of the outer pod, and descend the lift carrying a base of the outer pod from a height A0 to a height A1

4616 — A mechanical arm of a cabinet system places an inner pod on the base of the outer pod on the lift 4618 — While the lift descends from the height A1 to the height A0, read a two-dimensional barcode of the inner pod and check a state of a pellicle 4620 — Close the dual pod in collateral and lock the dual pod after the lift ascends from the height A1 to the height A0

4622 — Take out the dual pod via the port

FIG.46B

RETICLE STORAGE CABINET SYSTEM AND METHOD USING THE SAME

RELATED APPLICATIONS

This application is a continuation application of U.S. application Ser. No. 17/684,879 filed on Mar. 2, 2022, now approved and claims the benefits of U.S. Provisional Application Ser. No. 63/249,155 filed on Sep. 28, 2021 and claims the benefits of U.S. Provisional Application Ser. No. 63/160, 066 filed on Mar. 12, 2021, which is expressly incorporated by reference herein in its entirety.

BACKGROUND OF THE INVENTION

Field of the Invention

The present invention relates to a reticle storage pod and a method for securing a reticle, and more particularly to a reticle storage pod including an outer pod and an inner pod and a reticle securing method implemented by the outer pod and the inner pod, wherein the reticle storage pod is applied in a reticle storage system and method.

Description of the Prior Art

In the current extreme ultraviolet (EUV) lithography processes, a reticle needs to be protected by a conventional dual reticle transport pod (EUV pod) consisting of an EUV inner pod (EIP) and an EUV outer pod (EOP). To store a reticle, the reticle is placed in the inner pod, the inner pod is stored in the outer pod, and the entire conventional reticle transport pod is placed in a nitrogen cabinet that is then filled with nitrogen, thereby storing the reticle.

Moreover, the design of such conventional reticle transport pod can avoid particle contamination and reticle damage caused by vibration and deflection during long-distance transportation of the inner pod accommodating the reticle. In addition, the conventional reticle transport pod may be configured to be suitably loaded in different process apparatuses to receive various types of tests and inspections. As a result, the structure of the inner pod is more complicated compared to that of the outer pod, and hence has a higher cost. An inner pod of the reticle transport pod with the design purpose above may not be fully utilized with maximum benefits if such inner pod is stored in a nitrogen cabinet for a long period of time.

Referring to FIG. 1 and FIG. 2, a conventional reticle transport pod (10) is a dual pod structure, and includes an inner pod (11) and an outer pod (12). The inner pod (11) stores a reticle (R), and the outer pod (12) accommodates the inner pod (11). The inner pod (11) includes a base (20) and a cover (30), which coordinate with each other to seal and accommodate the reticle (R). The outer pod (12) includes an outer base (40) and an outer cover (50). The outer base (40) includes a support means for the inner pod (11), and the outer cover (50) and the outer base (40) are coupled to define an accommodating space of the inner pod (11). An appropriate hold-down means may be usually provided on an inner side of the outer cover (50) so that the inner pod (11) can be held downward when the outer cover (50) and the outer base (40) are coupled, thereby forming secure accommodation. The outer base (40) generally further includes a latch means for locking the outer cover (50) at the outer base (40). Because transfer of the reticle transport pod (10) in the factory is performed by an overhead hoist transfer (OHT) system, a top end of the outer cover (50) may be provided with a handle (52) for being grasped by an arm of the OHT system. Thus, the height of the handle (52) of the conventional reticle transport pod (10) may disfavor storage in stacked manner, and the height of the handle (52) also occupies an additional storage space.

Moreover, in a common design, a corresponding mutual coordinating mechanism is present between a conventional inner pod and a conventional outer pod, so that the conventional outer pod can only be used in coordination with the corresponding inner pod instead of also being adaptively used in coordination with inner pods of different mechanism designs. That is to say, only specific outer pod and inner pod that are compatible can achieve the effect of securely accommodating a reticle, and the expected stability cannot be achieved if an outer pod and an inner pod that are incompatible with each other are used. Considering production costs and storage efficiency, the current outer pod design of a reticle storage pod cannot satisfy requirements.

Therefore, there is a need for a dedicated reticle storage pod and an associated method suitable for long-term storage, and a reticle storage system and method for storing the dedicated reticle storage pod in industry. Moreover, the technique of developing one single outer pod to be compatible with inner pods of at least two types of different mechanism designs of the present invention helps reduce storage costs.

In a generally known reticle transport pod, an inner pod is provided with a securing mechanism using an external force applied by an outer pod, that is, a hold-down pin. The mechanism acts on a reticle in the inner pod only when the inner pod is accommodated in the outer pod. For example, a top end of the hold-down pin is exposed on an outside of a top portion of the inner pod. When the inner pod is transported without using the outer pod, the stability of the reticle in the inner pod is insufficient such that vibration and impact are likely caused.

Further, if a reticle is stored in a dedicated reticle storage cabinet system for a long period of time, the reticle needs to be taken out from the dual reticle transport pod and be transferred to a dedicated pod. Hence, before storing a reticle in a reticle storage cabinet system, an associated reticle loading system and an associated method that are compatible also need to be developed.

Moreover, since a reticle is suitable for high-precision processes of semiconductor manufacturing apparatuses, strict environment conditions and requirements need to be fully met in order to store such reticle with high production costs in a storage cabinet for a long period of time. Therefore, there is a need for development of a reticle storage cabinet pipeline inflation system and an associated method for long-term storage of a reticle, as well as a reticle storage cabinet management system and an associated method suitable for scheduling the reticle storage cabinet system.

SUMMARY OF THE INVENTION

To store more reticles within a same space, the present invention provides a storage means for enhancing storage efficiency of reticles. More specifically, the present invention provides a dedicated reticle storage pod different from conventional reticle transport pods. In the description of the disclosure, for the purpose of differentiation, the term "reticle transport pod" refers to a conventional reticle pod, and the term "reticle storage pod" refers to a dedicated reticle pod provided by the present invention in response to an efficiency enhanced storage means.

If a reticle storage pod is transported only in a reticle loading system and a storage rack of a reticle storage cabinet system, apart from needing a protection mechanism for preventing invasion of external particles, the design of a reticle storage pod for the purpose above does not involve any complicated structure or processing, and this helps reduce production costs.

It is an object of the present invention to provide a reticle storage pod including: a base, having a plurality of support members, each of the support members configured for supporting a corner of a reticle and each of the supporting members extending upward to form a pair of limiting blocks, the pair of limiting blocks respectively located on two side surfaces of the corner; and a cover, having a plurality of elastic hold-down mechanisms respectively corresponding to the plurality of support members, each of the elastic hold-down mechanisms having at least one elastic arm, the elastic arms acting on the corner of the reticle supported by the corresponding support member. When the cover covers the base to accommodate the reticle, the pair of limiting blocks limit a horizontal movement of the elastic arms.

In a specific embodiment, the support member has a pair of inclined surfaces, and the pair of inclined surfaces are respectively engaged with lower edges of two sides of the corner.

In a specific embodiment, the elastic hold-down mechanism includes a body and the pair of elastic arms extending in different directions from the body. Each of the elastic arms has a limiting portion and an inclined surface extending from the limiting portion, and the two inclined surfaces of the pair of elastic arms are respectively engaged with upper edges of the two sides of the corner.

In a specific embodiment, the pair of limiting blocks limit the two limiting portions of the pair of elastic arms.

In a specific embodiment, the two inclined surfaces of the pair of elastic arms extend away from the limiting portion and are coupled to each other.

It is another object of the present invention to provide a reticle storage pod including: an inner pod, including a cover, a base and a securing mechanism, the cover and the base engaging with each other to define an accommodating space, the securing mechanism configured to secure a reticle in the storage space; and an outer pod, including an outer cover and an outer base, the outer cover and the outer base engaging with each other to accommodate the inner pod therein. The outer cover has a flat top surface and a surrounding side surface extending downward from the flat top surface, the surrounding side surface is provided with at least a pair of handles, and the pair of handles do not exceed a height of the flat top surface.

In a specific embodiment, a top surface of the outer base is provided with a plurality of coupling pins, which support the base of the inner pod.

In a specific embodiment, the outer cover is provided with at least one hold-down mechanism, which acts on the cover to secure the inner pod.

In a specific embodiment, the hold-down mechanism is a hold-down column, which acts on the cover of the inner pod.

In a specific embodiment, the securing mechanism includes at least one support member provided on the base, and at least one elastic hold-down mechanism provided correspondingly to the support member on the cover. The outer cover and the outer base are engaged to accommodate the inner pod, and the hold-down column produces pressure against the elastic hold-down mechanism so that the elastic hold-down mechanism secures the reticle.

In a specific embodiment, the hold-down mechanism is a hold-down rib, and the hold-down rib presses against an upper surface of the cover of the inner pod when the outer cover and the outer base are engaged to accommodate the inner pod.

In a specific embodiment, the upper surface of the cover has a recess at a position corresponding to the hold-down rib, so that the hold-down rib presses in the corresponding recess when the outer cover and the outer base are coupled to accommodate the inner pod.

In a specific embodiment, the hold-down rib presses in the corresponding recess so as to securely position and couple the cover on the base.

In a specific embodiment, the securing mechanism includes a support member provided at the base, and a reticle retainer provided correspondingly to the support member at the cover and the reticle retainer includes at least one elastic arm. When the cover and the base are coupled to accommodate the reticle, the support member supports a corner of the reticle, and the elastic arm of the reticle retainer is engaged with the corresponding corner so that the securing mechanism secures the reticle.

It is yet another object of the present invention to provide a reticle storage pod including: an inner pod suitably to be accommodated in an outer pod, an inner surface of the outer pod provided with a plurality of hold-down mechanisms, the inner pod including a cover, a base and a plurality of securing mechanism, the cover and the base coupled to define a storage space, the securing mechanisms configured to secure a reticle to be accommodate in the storage space. An upper cover of the cover has a plurality of recesses formed thereon at positions respectively corresponding to the plurality of hold-down mechanisms. When the inner pod is accommodated in the outer pod, the recesses of the cover are respectively engaged with the hold-down mechanisms to obtain a hold-down force for securing and positioning the inner pod so as to enhance securing of the reticle by the securing mechanism.

In a specific embodiment, the recess has a lower surface and a surrounding side surface surrounding the lower surface, the surrounding side surface has an outline, and the cover exposes the securing mechanism on a lower surface of the recess.

In a specific embodiment, the hold-down mechanism is a hold-down rib, which has an outline corresponding to the recess. When the inner pod is accommodated in the outer pod, the hold-down rib correspondingly presses against the lower surface of the recess.

It is yet another object of the present invention to provide a reticle storage pod including: an outer pod, including an outer cover and an outer base, the outer cover and the outer base engaged with each other to securely individually accommodate a first inner pod and a second inner pod that are differently structured, the first inner pod and the second inner pod respectively accommodate a reticle. The outer cover is provided with at least one first hold-down mechanism and at least one second hold-down mechanism, which respectively act on a cover of the first inner pod and a cover of the second inner pod that are differently structured.

In a specific embodiment, the first hold-down mechanism and the second hold-down mechanism respectively extend from a lower surface of the outer cover by different heights, so that the first hold-down mechanism and the second hold-down mechanism are able to engage with a corresponding structure of the cover of the first inner pod and another corresponding structure of the cover of the second inner pod respectively.

In a specific embodiment, the first hold-down mechanism is a hold-down column, the second hold-down mechanism is a hold-down rib having a horseshoe-shaped outline, and the hold-down column is located inside the horseshoe-shaped outline of the hold-down rib.

In a specific embodiment, the cover of the first inner pod is provided with an elastic hold-down mechanism at a position corresponding to the first hold-down mechanism. The elastic hold-down mechanism includes a hold-down pin, and the hold-down column presses against the hold-down pin when the first inner pod is accommodated in the outer pod, so as to secure the reticle accommodated in the first inner pod.

In a specific embodiment, the elastic hold-down mechanism includes a cap that limits the hold-down pin, and the horseshoe-shaped outline of the hold-down rib limits a horizontal movement of the cap when the first inner pod is accommodated in the outer pod.

In a specific embodiment, the cover of the second inner pod is provided with a recess at a position corresponding to the second hold-down mechanism. The recess has a bottom surface and a surrounding side surface surrounding the lower surface, and the surrounding side surface has a horseshoe-shaped outline corresponding to the hold-down rib. When the second inner pod is accommodated in the outer pod, the hold-down rib presses against the lower surface of the recess, and the hold-down rib limits a horizontal movement of the cover.

It is another object of the present invention to provide a method for securing a reticle. The method is applied to a reticle storage pod to secure the reticle, and includes: providing a plurality of support members on a base of the reticle storage pod, each of the support members extending upward to form a pair of limiting blocks; providing, at a cover of the reticle storage pod, a plurality of elastic hold-down mechanisms respectively corresponding the plurality of support members, each of the elastic hold-down mechanisms including at least one elastic arm; and engaging the cover with the base to accommodate the reticle such that each of the support members supports a corner of the reticle and the elastic arm of each of the elastic hold-down mechanisms acts on the corresponding corner, and the pair of limiting blocks limits a horizontal movement of the elastic arm.

In a specific embodiment, the pair of limiting blocks are respectively located on two side surfaces of the corner.

In a specific embodiment, the elastic hold-down mechanism includes a body and a pair of elastic arms, wherein each of the elastic arms has a limiting portion and an inclined surface extending from the limiting portion.

In a specific embodiment, the method includes engaging the two inclined surfaces of the pair of elastic arms respectively with upper edges of two sides of the corner when the cover and the base are engaged with each other to accommodate the reticle.

In a specific embodiment, the pair of elastic arms extend in different directions from the body.

In a specific embodiment, distal ends of the pair of elastic arms are coupled to each other.

BRIEF DESCRIPTION OF THE DRAWINGS

Reference can be made to the drawings and description below to better understand the present invention. Non-limiting and non-exhaustive embodiments are described with reference to the drawings below. It is to be noted that the elements in the drawings are not necessarily drawn to their actual sizes, and are depicted to focus on the description on structures and principles.

FIG. 17 is a specific flowchart of reticle transfer of the present invention;

FIG. 30 is a diagram of connection to an upstream air supply pipeline of the storage rack according to two specific embodiments;

FIG. 35 is a specific flowchart of transferring a reticle according to the embodiment in FIG. 32;

FIG. 40 is a specific flowchart of transferring a reticle according to the embodiment in FIG. 37;

FIG. 41A is an example of a mechanical arm and a storage chamber of a cabinet system to place a pod to the storage chamber according to an interaction embodiment;

FIG. 41B is an example of a mechanical arm and a storage chamber of a cabinet system to take out a pod from the storage chamber according to an interaction embodiment;

FIG. 42A is an example of a mechanical arm and a storage chamber of a cabinet system to place a pod to the storage chamber according to another interaction embodiment;

FIG. 45A is a flowchart of loading a reticle according to the embodiment in FIG. 44;

FIG. 45B is a flowchart of unloading a reticle according to the embodiment in FIG. 44;

FIG. 46A is another flowchart of loading a reticle according to the embodiment in FIG. 44; and FIG. 46B is another flowchart of unloading a reticle according to the embodiment in FIG. 44.

DETAILED DESCRIPTION OF THE EMBODIMENTS

To better describe the present invention, specific examples and specific embodiments are given with the accompanying drawings below. However, the subject matter of the application may be specifically implemented in various different forms, and the construction covered or asserted by the subject matter of the application is not limited to any exemplary specific embodiments disclosed in the detailed description of the application; it should be understood that the specific embodiments are non-limiting and are not to be construed as restrictive. Similarly, the present invention is to provide a reasonably broad scope for the subject matter applied or covered by the subject matter.

The expression "in one embodiment" used in the literature of the application does not necessarily refer to the same specific embodiment, and the expression "in other (some/certain) embodiments" used in the literature of the application does not necessarily refer to different specific embodiments. The object of the above is, for example, to include combination of all or part of the exemplary specific embodiments by the subject matter set forth.

The term "dedicated" used in the embodiments below relates to a technical means provided in response to a storage issue to be solved by the present invention, for example, a dedicated pod, a dedicated outer pod or a dedicated inner pod. Moreover, the term "non-dedicated" refers to a technical means related to in response to a non-storage purpose, and may be an existing or other novel reticle inner or outer pod. The non-dedicated pod in the literature can be understood as an existing reticle pod, such as the conventional dual pod shown in FIG. 1, but does not mean that the non-dedicated pod only can be an existing reticle pod. More specifically, the non-dedicated pod in the literature should be understood as a reticle pod that is not dedicatedly used for storage purposes, and is, for example, a reticle pod suitable for common transport purposes in a factory.

Figure 3:
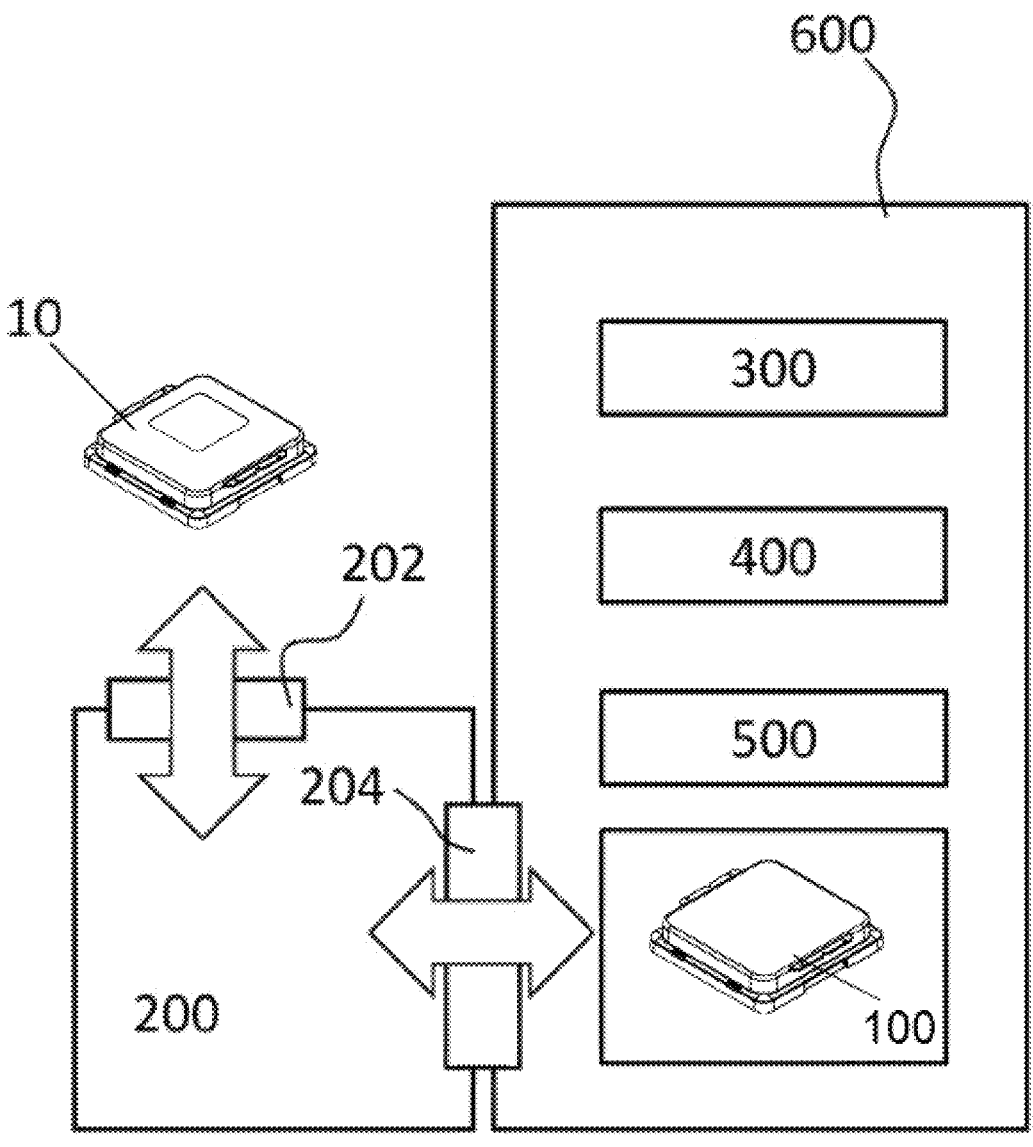
FIG. 3 is a block diagram of a reticle storage system of the present invention.

FIG. 3 shows a block diagram of a reticle storage system of the present invention. The present invention provides a reticle storage means for storing a reticle inside a reticle transport pod (10). The reticle storage system includes a reticle loading system (200) and a reticle storage cabinet system (600). The reticle loading system (200) is for transferring a reticle between the reticle transport pod (10) and a dedicated reticle storage pod (100), or for placing an inner pod accommodating a reticle in the reticle transport pod (10) or the dedicated reticle storage pod (100). It should be understood that, the reticle transport pod (10) described herein may be a conventional reticle transport pod or a reticle transport pod coordinating with an OHT system in a factory. The reticle storage pod (100) provided by the present invention is a storage means different from a conventional reticle pod and dedicatedly used for the reticle storage cabinet system (600) of the present invention.

The reticle loading system (200) includes a first port (202) connected to a factory environment and a second port (204) connected to the reticle storage cabinet system (600). The first port (202) allows the reticle transport pod (10) to be transferred between the factory environment and a loading environment provided by the reticle loading system (200), and the second port (204) allows the reticle storage pod (100) to be transferred between the loading environment and a storage environment of the reticle storage cabinet system (600). The first port (202) and the second port (204) may include valve means for individually separating the factory environment, the loading environment and the storage environment. The first port (202) may be further configured to coordinate with an OHT system.

The reticle storage cabinet system (600) includes one or more reticle cabinet racks (not shown) capable of storing a plurality of reticle storage pods (100), a reticle storage cabinet control system (300) in charge of storing and fetching the reticle storage pods (100), a reticle storage cabinet pipeline inflation system (400) in charge of a gas environment of each reticle cabinet rack and a reticle storage cabinet management system (500) in charge of all processes, with associated details to be described later.

Figure 4:
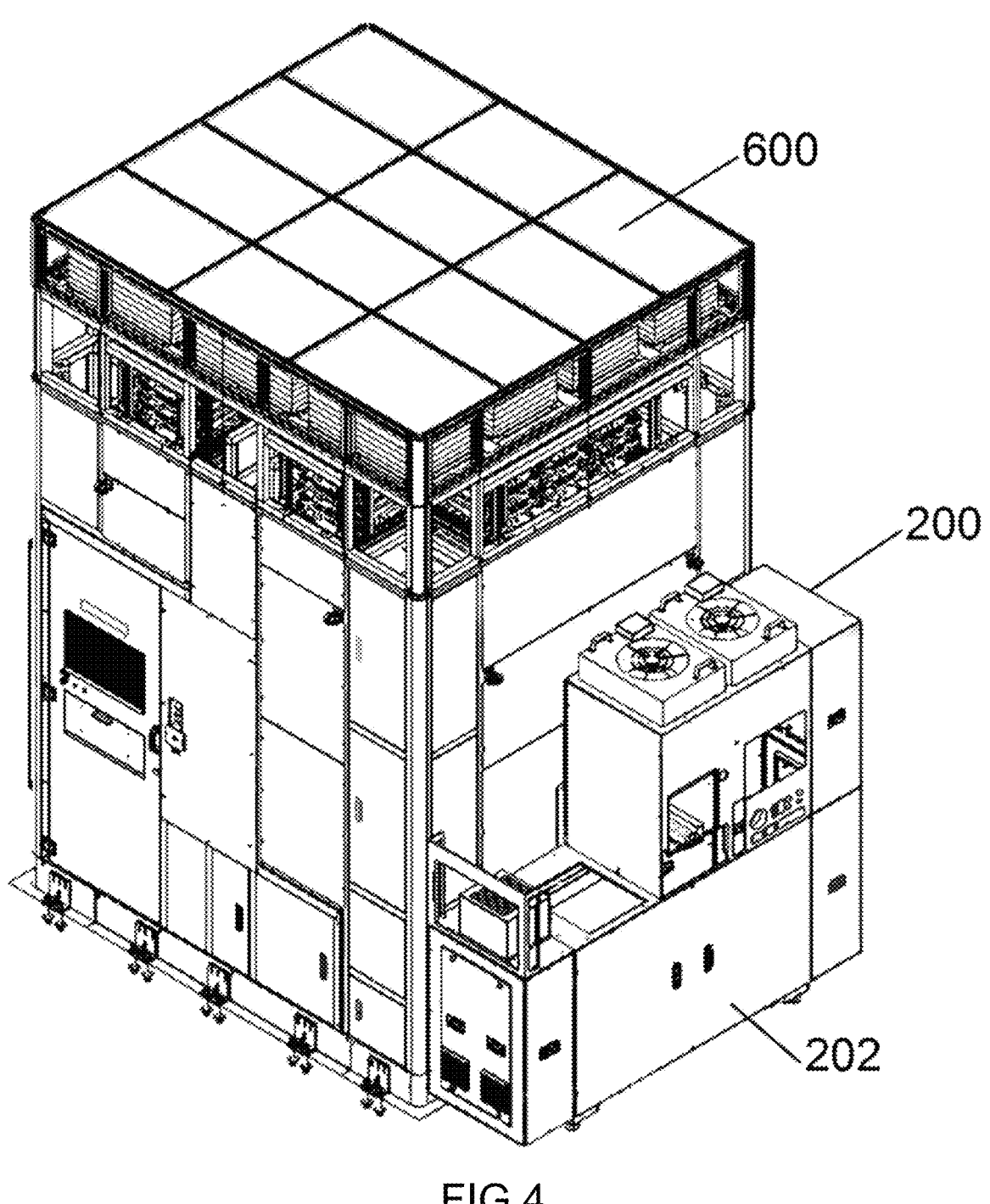
FIG. 4 is a three-dimensional diagram of a reticle storage system of the present invention.

FIG. 4 shows an example of a specific outer configuration of the reticle storage cabinet system (600) of the present invention, wherein the reticle loading system (200) is close to one side of the reticle storage cabinet system (600); however, the present invention is not limited to the example above. The first port (202) of the reticle loading system (200) basically faces upward to facilitate coordination with an OHT system, so as to vertically load or fetch the reticle transport pod (10). The second port (not shown) is located on a side surface of the reticle loading system (200) and faces the reticle storage cabinet system (600), so as to horizontally load or fetch the reticle storage pod (100).

The reticle loading system (200) is configured to include an identification means with respect to the reticle transport pod (10) and the reticle storage pod (100), for example, for identifying a radio-frequency identification (RFID) or two-dimensional barcode on an inner pod and/or an outer pod, wherein such information may be associated with an identity number of a pod or a reticle. The identification means may further include detecting whether a pellicle in a pod is damaged or not through the window of the pod and reading the two-dimensional barcode.

The first port (202) and the second port (204) respectively correspond to different lift means in the reticle loading system (200), which means that the reticle transport pod (10) and the reticle storage pod (100) are respectively held by respective lift means after entering the loading environment. The loading environment further includes a clamping means with respect to the reticle to transfer the reticle between the reticle transport pod (10) and the reticle storage pod (100). Details associated with the lifting means and the clamping means are to be described in the paragraphs below.

When the reticle loading system (200) cannot be used (for example, under maintenance), the reticle storage cabinet system (600) may deliver the reticle storage pod (100) together with the required reticle to the second port (204), and the reticle storage cabinet system (600) provides a manual operated door for operating staff to take out the reticle storage pod (100) using the manually operated door, so that the reticle can be safely taken out under protection of the reticle storage pod (100). A top portion of the reticle storage cabinet system (600) may be configured with a fan-filter unit (FFU) in charge of drawing air from the outside for the use of the reticle storage cabinet system (600). Moreover, a corresponding exhaust unit is also needed.

Figure 5A:
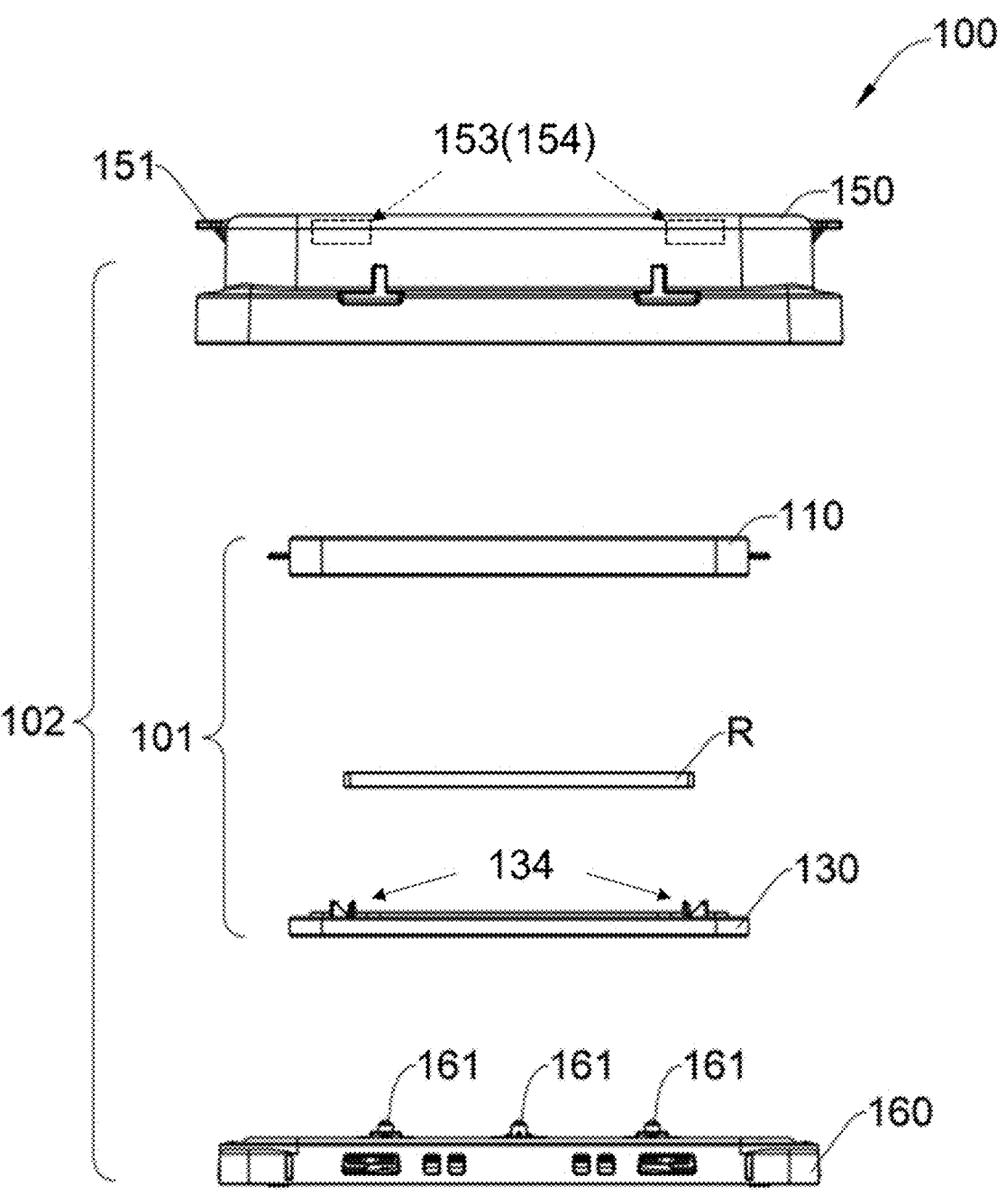
FIG. 5A is an exploded side view of a reticle storage pod of the present invention.

FIG. 5A shows an exploded side view of a reticle storage pod of the present invention, wherein the reticle storage pod of the present invention includes a dedicated inner pod and a dedicated outer pod. In a preferred embodiment of the present invention, the reticle storage pod (100) is a dual pod structure, and dedicatedly used for a storage cabinet rack of the reticle storage cabinet system (600) of the present invention. Despite being dedicatedly used for storage, the reticle storage pod (100) of the present invention, similar to the conventional reticle transport pod (10), also includes a sealing means for reticle protection, that is, a contact surface of a pod body has a good sealing and particle blocking design.

The reticle storage pod (100) dedicatedly used for the reticle storage cabinet system (600) of the present invention includes a dedicated outer pod (102) and a dedicated inner pod (101). The dedicated outer pod (102) accommodates the dedicated inner pod (101), and the reticle (R) is placed in the dedicated inner pod (101). The dedicated outer pod (102) consists of an outer cover (150) and an outer base (160) (or referred to as a door), and the dedicated inner pod (101) consists of a cover (110) and a base (130).

Figure 1:
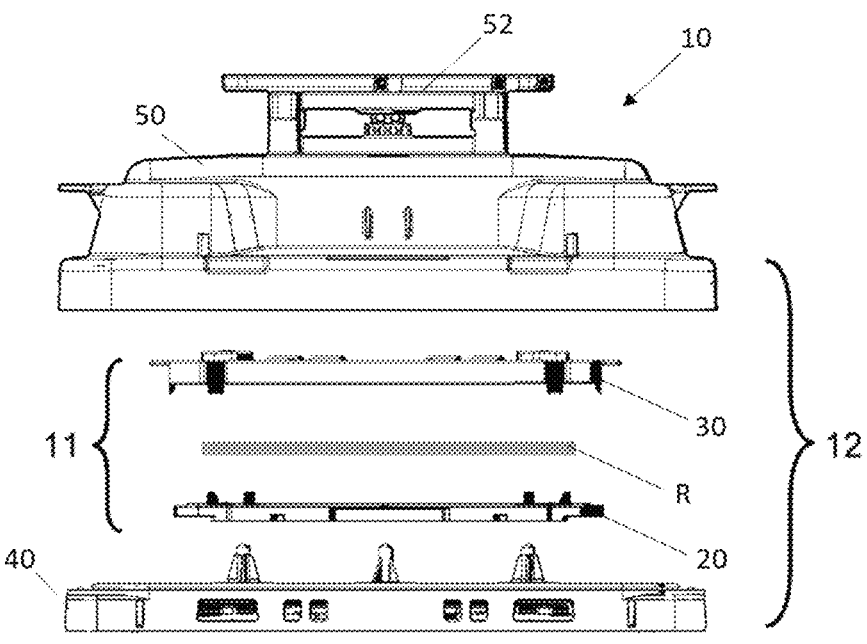
FIG. 1 is an exploded side view of a conventional reticle storage pod.

Compared to the conventional reticle transport pod (10) in FIG. 1, the outer cover (150) of the reticle storage pod (100) in FIG. 5A is not required to coordinate with an OHT system, so the handle (52) of the conventional reticle transport pod (10) is eliminated. As a result, an overall height of the reticle storage pod (100) is lower than the overall height of the conventional reticle transport box (10). Moreover, compared to the conventional reticle transport pod (10) in FIG. 1, coupling pins (161) provided on an inner side of the outer base (160) of the present invention in FIG. 5A are also shorter, so that heights of the outer cover (150) and the outer base (160) of the present invention are shorter than heights of the outer cover (150) and the outer base (160) of the conventional reticle transport pod (10) in FIG. 1. In order to minimize the overall height of the reticle storage pod (100) of the present invention, a pair of handles (151) provided on two sides of the outer cover (150) are not higher than a top surface of the outer cover (150). The shortened coupling pins (161) allow a height of a space for accommodating the dedicated inner pod (101) to also be reduced. Thus, the overall height of the reticle storage pod (100) of the present invention is significantly less than the height of the conventional reticle transport pod (10), enabling the reticle storage cabinet system (600) of the present invention to accommodate larger numbers of dedicated reticle storage pods (100) and reticles.

Figure 5B:
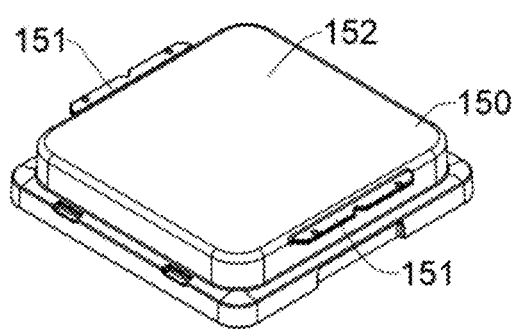
FIG. 5B is a three-dimensional diagram of an outer cover of a dedicated outer pod of the present invention.

FIG. 5B shows a three-dimensional diagram of the outer cover (150) of a dedicated outer pod of the present invention, from which a structural design for coordinating with an OHT system is eliminated. The outer cover (150) has a flat top surface (152) and a surrounding side surface extending downward from the flat top surface (152). The handles (151) extend out from the surrounding side surface and basically do not exceed the flat top surface (152), or exceed the flat top surface (152) by a very small height.

Figure 5C:
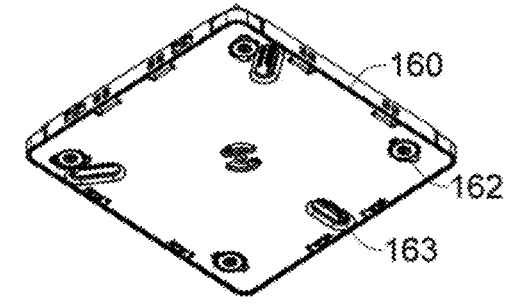
FIG. 5C is a three-dimensional diagram of an outer base of a dedicated outer pod of the present invention.

FIG. 5C shows a three-dimensional diagram of the outer base (160) of a dedicated outer pod of the present invention, wherein a configuration of a bottom portion thereof includes a plurality of air valves (162) and positioning slots (163). The air valves (162) may coordinate with predetermined connection ports so as to supply a predetermined gas into the dedicated outer pod (102) or discharging a predetermined gas from the dedicated outer pod (102). The positioning slots (163) are for positioning the dedicated outer pod (102) at a certain position in an apparatus.

Figure 5D:
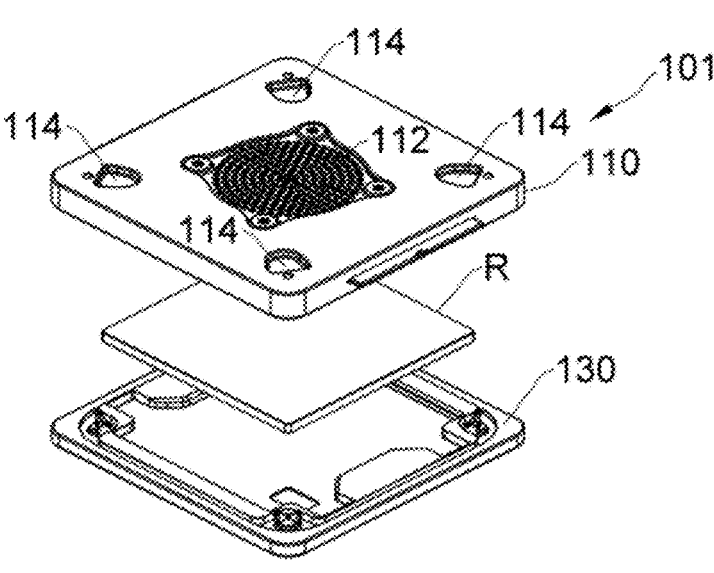
FIG. 5D is a three-dimensional exploded diagram of a dedicated inner pod of the present invention.
Figure 5E:
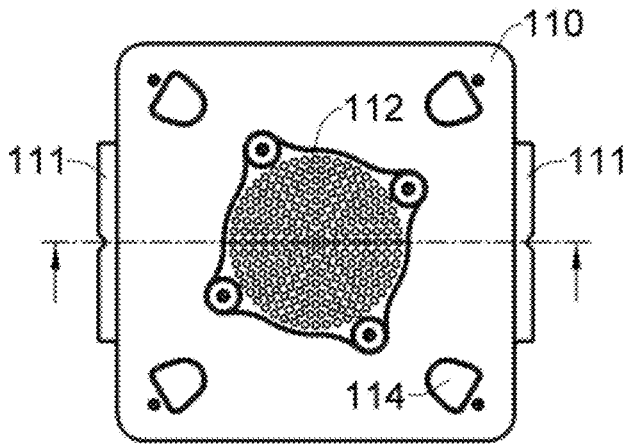
FIG. 5E is a top view of a cover of a dedicated inner pod of the present invention.

FIG. 5D shows a three-dimensional exploded diagram of the dedicated inner pod (101) of the present invention, wherein the dedicated inner pod (101) includes a cover (110), a base (130) and a securing mechanism. The cover (110) and the base (130) engaging with each other to define a storage space, and the securing mechanism is configured to support and limit the reticle (R) so as to be accommodated in the storage space. A top portion of the cover (110) is basically a flat surface, is configured with a filter membrane cover (112) and has a plurality of recesses (114) having predetermined shape and arrangement formed thereon. In this embodiment, four recesses (114) having predetermined shape and arrangement are configured as an example.

Figure 5F:
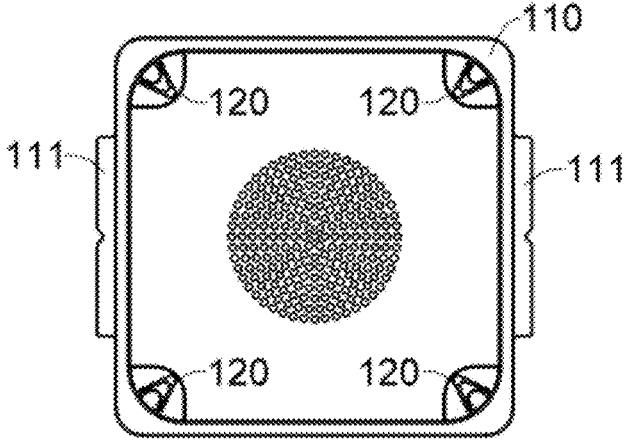
FIG. 5F is a bottom view of a cover of a dedicated inner pod of the present invention.
Figure 5G:
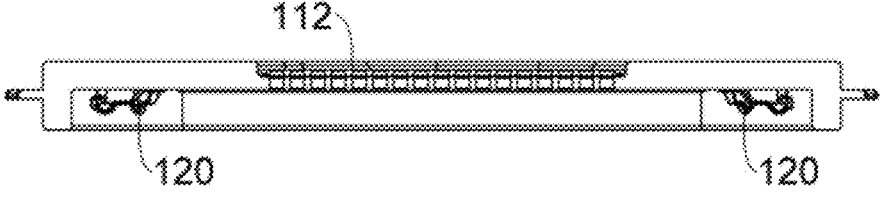
FIG. 5G is a section diagram of a cover of a dedicated inner pod of the present invention along a dotted line in FIG. 5E.
Figure 5H:
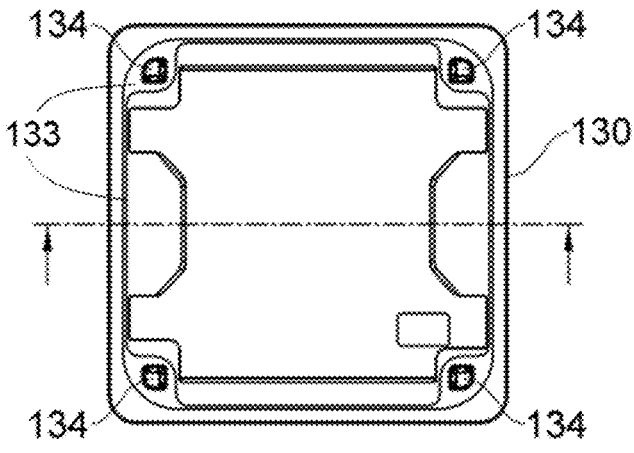
FIG. 5H is a top view of a base of a dedicated inner pod of the present invention.
Figure 5I:
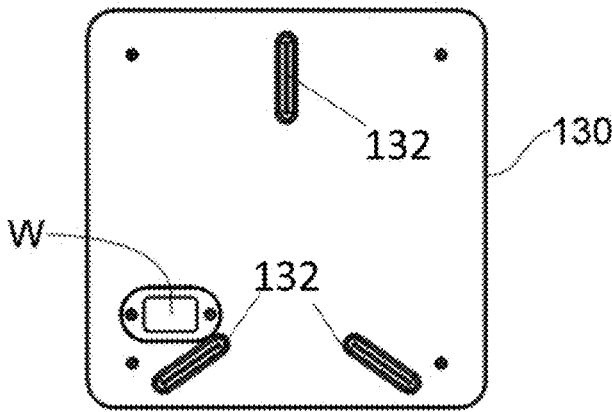
FIG. 5I is a bottom view of a base of a dedicated inner pod of the present invention.
Figure 5J:
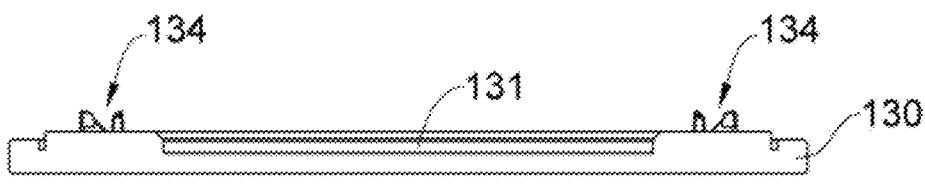
FIG. 5J is a section diagram of a base of a dedicated inner pod of the present invention along a dotted line in FIG. 5H.

Referring to FIG. 5E to FIG. 5J, compared to the structure of the inner pod (11) of the reticle transport pod (10) in FIG. 1, the securing mechanism of the dedicated inner pod (101) of the reticle storage pod (100) of the present invention and the reticle (R) are in a chamfered contact. As shown in FIG. 5F and FIG. 5H, the securing mechanism includes elastic hold-down mechanisms (that is, reticle retainers 120) disposed on four inner corners of the cover (110), and four support members (134) disposed on an upper side of the base (130). The numbers and positions of the elastic hold-down mechanisms and the support members (134) are designed in coordination with the positions of the recesses (114) on the top portion of the cover (110). Thus, the positions of the reticle retainers (120) and the support members (134) correspond to each other. When the cover (110) and the base (130) are engaged to accommodate the reticle (R), the four support members (134) and the corresponding reticle retainers (120) come into contact with and retain the four corners of the reticle (R). A plurality of air channels are provided at a center of the cover (110), and the filter membrane cover (112) is provided thereon to cover the air channels. More specifically, the filter membrane cover (112) is mounted at a central recessed position of a top surface of the cover (110), as shown in FIG. 5G, in a way that the filter membrane cover (112) does not protrude from the top surface of the cover (110). A pair of handles (111) respectively extending outward from side surfaces of the cover (110) can interact with predetermined mechanisms during a cover opening process of the reticle loading system (200), with associated details to be described in the paragraphs below.

Moreover, positions of the recesses (114) on the top portion of the cover (110) correspond to positions of the reticle retainers (120). Thus, when the dedicated inner pod (101) is accommodated in the dedicated outer pod (102), the recesses (114) of the cover (110) can be correspondingly engaged with the hold-down mechanisms disposed on inner sides of the cover (150) to provide the cover (110) with a downward pressing force, thereby reinforcing coupling of the dedicated inner pod (101) and securing of the reticle (R), with associated details to be described in the paragraphs below.

Compared to the inner pod (11) of the reticle transport pod (10) in FIG. 1, the dedicated inner pod (101) of the reticle storage pod (100) of the present invention more securely accommodates the reticle (R). By exerting an external force by the outer cover (150) of the dedicated outer pod (102) on the top surface of the cover (110) of the dedicated inner pod (101), the elastic hold-down mechanisms (that is, the reticle retainers 120) disposed on an inner side surface of the cover (110) are prompted to securely press the four corners of the reticle (R). More specifically, in order to secure the reticle during long-distance transportation, the outer cover (50) of the outer pod (12) of the reticle transport pod (10) in FIG. 1 directly exerts an external force on the elastic hold-down mechanisms disposed at the cover (30) of the inner pod (11), so that the elastic hold-down mechanisms act on the upper surface of the reticle. In other words, the outer cover (50) in FIG. 1 does not act on the cover (30).

Compared to the base (20) of the inner pod (11) of the reticle transport pod (10) in FIG. 1, complicated structures of the base (20) are eliminated from the base (130) of the dedicated inner pod (101) of the reticle storage pod (100) of the present invention, wherein the eliminated complicated structures may include a reflection laser inscription on the bottom surface of the base (20), part of a window frame and a stepped structure, so that costs of the base (130) of the present invention can be significantly reduced without involving additional processing operations, and a configuration of the bottom surface of the base (130) apart from positioning slots (132) and a window (W) can be a flat surface. The base (130) includes the window (W) for detecting a two-dimensional code and a pellicle on the reticle (R). The bottom surface and sides of the base (130) are a continuous flat surface, and such non-stepped design better facilitates blowing and cleaning.

Moreover, a pellicle groove (131) on the base (130) has a larger depth compared to a depth of a pellicle groove of the base (20) in FIG. 1, providing better airflow replacement efficiency inside the pod and increasing a drop rate of relative humidity (RH %), further facilitating long-term storage of the reticle. A surrounding groove (133) is formed at the base (130) (as shown in FIG. 6), and the surrounding groove (133) is provided with the four support members (134) at positions corresponding to the four corners of the reticle (R). When the cover (110) and the base (130) are airtightly coupled, the configuration of the surrounding groove (133) helps capturing of particles entering the pod.

Figure 5K:
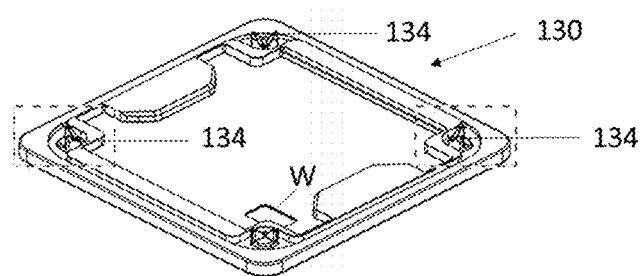
FIG. 5K is a three-dimensional diagram of a base of a dedicated inner pod of the present invention.
Figure 5L:
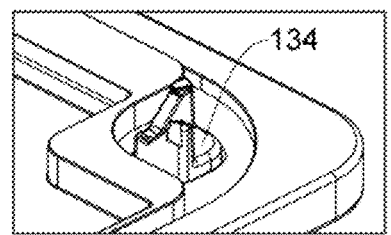
FIG. 5L is a three-dimensional diagram of a corner of a base of the present invention.
Figure 5M:
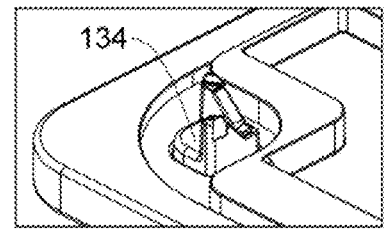
FIG. 5M is a three-dimensional diagram of another corner of a base of the present invention.

FIG. 5K shows a three-dimensional diagram of the base (130) of a dedicated inner pod of the present invention, and FIG. 5L and FIG. 5M respectively show enlarged diagrams of the support members (134) disposed in the surrounding groove according to the dotted frames in FIG. 5K.

Figure 5N:
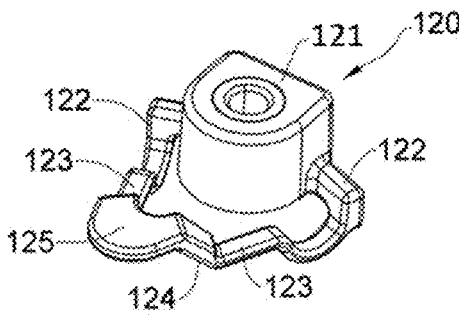
FIG. 5N is a diagram of a reticle retainer provided on an inner side of a cover of the present invention.

FIG. 5N shows a diagram of an individual reticle retainer (120) provided on the inner side of the cover (110) of the present invention. The elastic hold-down mechanism of the cover (110) of the present invention can be implemented by the reticle retainer (120) shown in FIG. 5N. The reticle retainer (120) includes a body (121) and a pair of elastic arms (122) extending in different directions from two sides of the body (121). One end of each of the elastic arms (122) is connected to the body (121), and the other end is connected to a limiting portion (123). One end of the limiting portion (123) is connected to the elastic arm (122), and the other end is connected to an inclined surface (124). The two inclined surfaces (124) extend upward in an inclined manner from the limiting portion (123), and ends of the two inclined surfaces (124) away from the limiting portion (123) are connected. Specifically, the ends of the two inclined surfaces (124) are commonly connected to a pressing portion (125). However, the present invention is not limited to the example above; for example, the pressing portion (125) may be omitted.

The body (121) of the reticle retainer (120) may be provided with a screw hole, so that the reticle retainer (120) can be fixed to the inner side of the cover (110) by a known locking means. The two inclined surfaces (124) connecting the pair of elastic arms (122) are for respectively contacting upper edges of two sides of a corner of the reticle. In this embodiment, the limiting portion (123) is basically a horizontal extension structure so as to coordinate with the support members (134) shown in FIG. 5L and FIG. 5M, achieving the effect of limiting a horizontal movement of the pair of elastic arms (122) so as to limit a swaying of the corner of the reticle.

Figure 6A:
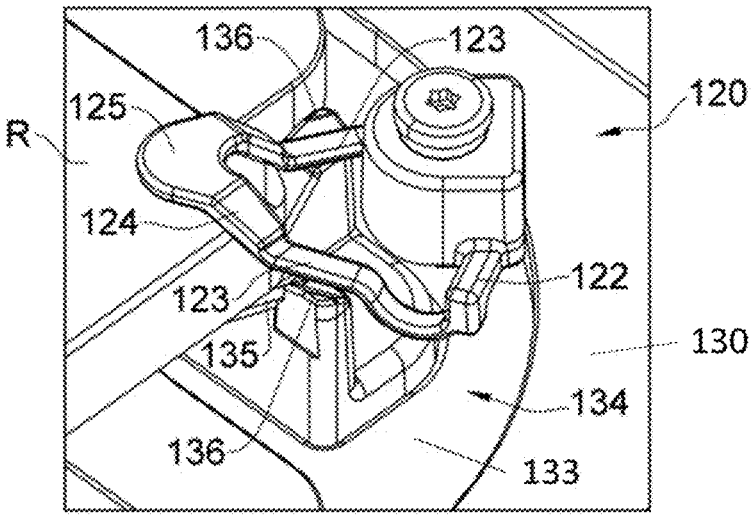
FIG. 6A is a diagram of a reticle retainer and a corresponding support member of a dedicated inner pod of the present invention for retaining a corner of a reticle.
Figure 6B:
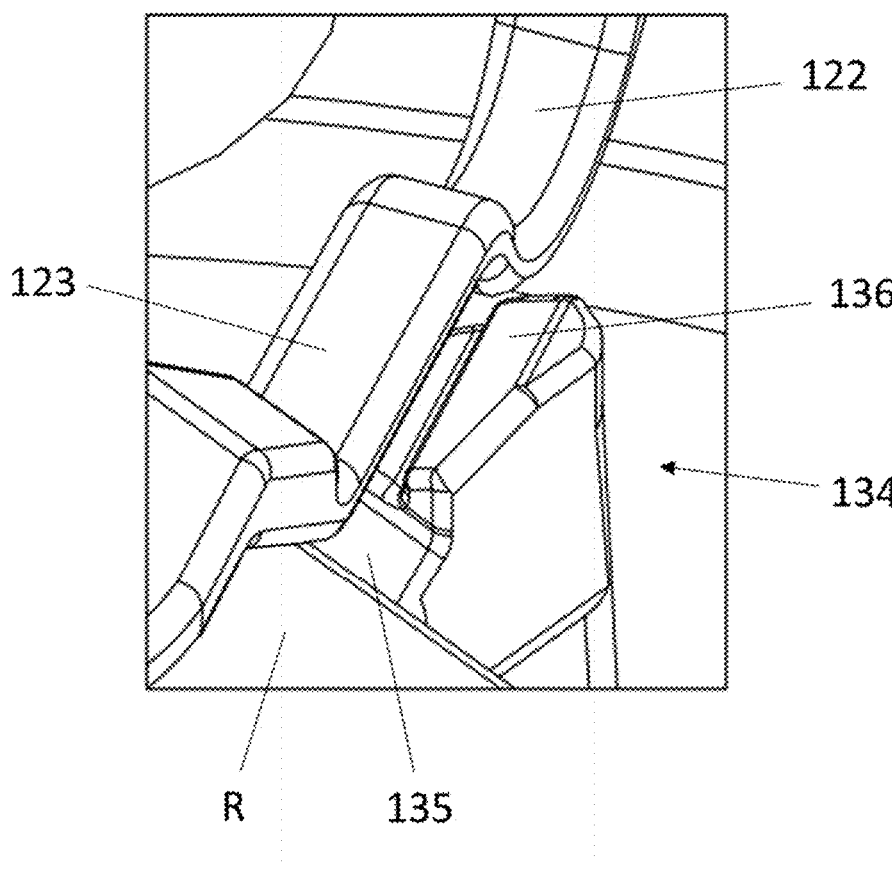
FIG. 6B is an enlarged partial diagram of a support member of the present invention limiting a horizontal movement of a reticle retainer.

FIG. 6A shows a diagram of the reticle retainer (120) and the corresponding support member (134) of a dedicated inner pod of the present invention retaining and supporting a corner of a reticle. FIG. 6B shows an enlarged partial diagram of the support member (134) of the present invention limiting a horizontal movement of the reticle retainer (120).

The four support members (134) of the base (130) of the present invention are respective disposed in the surrounding groove (133) of the four corners of the base (130), and are for respectively supporting the corresponding corners of the reticle (R). The support member (134) has two support portions protruding upward from inside the surrounding groove (133), and each support portion has an inclined surfaces (135) that faces the reticle (R) and inclining downward toward the reticle (R). The pair of inclined surfaces (135) are basically orthogonal, and respectively contact and engage with the lower edges of two sides of the corresponding corner of the reticle (R), as shown in FIG. 6A. A top end of each of the support portions of the support member (134) extends upward to form a limiting block (136). The limiting block (136) is located on a top end of the inclined surface (135), and does not interfere with the reticle (R). When the reticle (R) is placed on the support member (134), the two limiting blocks (136) of each support member (134) are respectively located on two side surfaces of a corner of the reticle (R). When the cover (110) and the base (130) are engaged, the two limiting blocks (136) of each support member (134) are respectively located on outer sides of the limiting portion (123) of the reticle retainer (120), so as to limit a horizontal movement of the limiting portion (123) connected to the pair of elastic arms (122), as shown in FIG. 6A and FIG. 6B. Thus, when the cover (110) and the base (130) are coupled, the two limiting portions (123) of the reticle retainer (120) are retained between two support portions of each support member (134) so that the horizontal movement of the pair of limiting portions (123) is limited, hence reducing a swaying of the reticle retainer (120). In other possible embodiments, the limiting blocks (136) may also be located on the inner side of the limiting portion (123). Preferably, as shown in FIG. 6B, a buffering gap is present between the limiting portion (123) and the limiting block (136) to prevent particles from being generated due to abrasion of hardware.

Figure 7A:
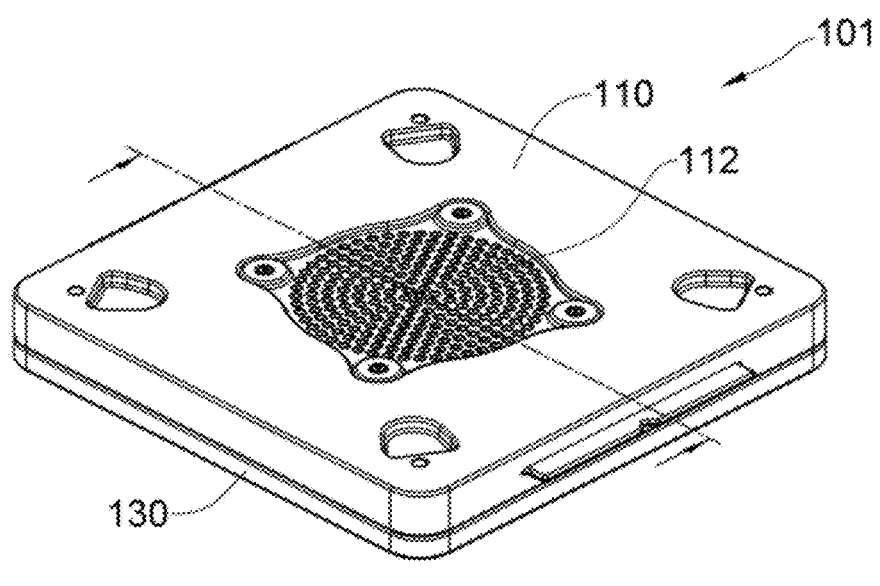
FIG. 7A is a three-dimensional diagram of a dedicated inner pod of the present invention.
Figure 7B:
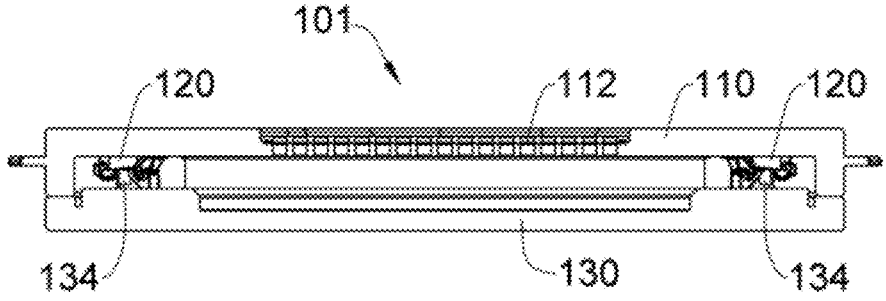
FIG. 7B is a section diagram of a dedicated inner pod of the present invention along a dotted line in FIG. 7A.

FIG. 7A shows three-dimensional diagram of a dedicated inner pod of the present invention, and FIG. 7B shows a section diagram of a dedicated inner pod of the present invention along the dotted line in FIG. 7A. Compared to the structure of the inner pod (11) of the reticle transport pod (10) in FIG. 1, the cover (110) of the dedicated inner pod (101) and the base (130) do not have a specific coupling direction in between, and the top surface of the cover (110) is a flat surface having a large area without a step structure, that is, structures such as slots and corners are greatly in overall eliminated from the cover (110). Designs such as laser marking, window, counterweight block and stepped structure are also greatly cut back or eliminated from the bottom surface of the base (130), so that the cover (110) and the base (130) of the dedicated inner pod (101) of the present invention have reduced processing processes, and this facilitates manufacturing and helps improving a yield rate. Moreover, the base (130) has a pellicle groove (131) formed with an increased depth, so that the storage space of the dedicated inner pod (101) can be provided with better replacement efficiency of inner and outer air to help control the relative humidity (RH %) of the storage space.

In addition, the securing mechanism of the dedicated inner pod (101) of the present invention includes a chamfer coordinating with the edge of the reticle by the pair of elastic arms (122) of the reticle retainer (120), and the pair of limiting portions (123) that limit the reticle retainer (120) by the pair of limiting blocks (136) of the support member (134), thereby securing the reticle. The support member (134) and the reticle retainer (120) contact the reticle via the inclined surface (135) so as to prevent marks generated on upper and lower surfaces of the reticle, and also helps maintain a horizontal state of the reticle and guide the reticle at right position. A contact surface between the cover (110) and the base (130) may form a sealed contact by a known means. In this embodiment, the contact surface of the base (130) is lower than a highest surface of the base (130), and the contact surface of the base (130) is separated from the highest surface by the surrounding groove (133), thus facilitating prevention of particles from entering an area of the pellicle.

Figure 8A:
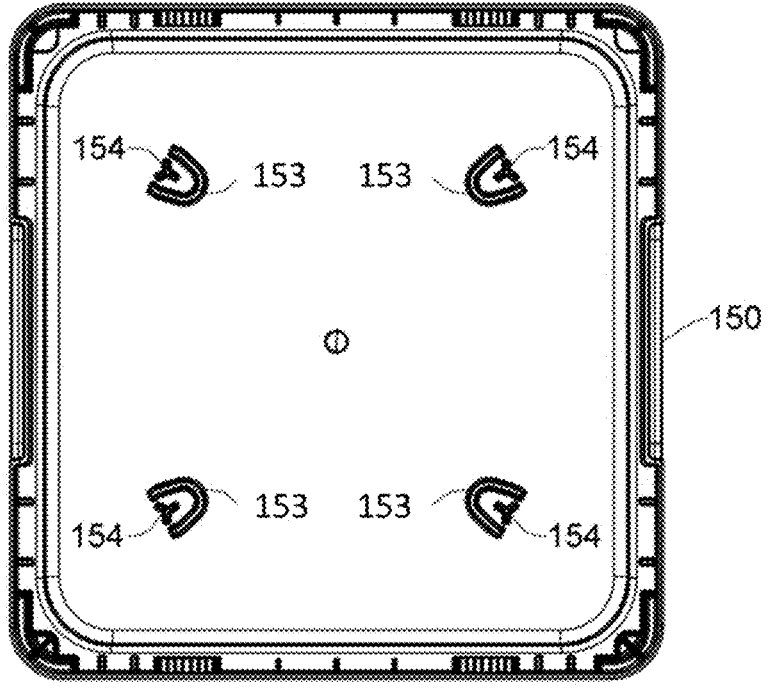
FIG. 8A is a bottom view of an outer cover of a dedicated outer pod of the present invention.
Figure 8B:
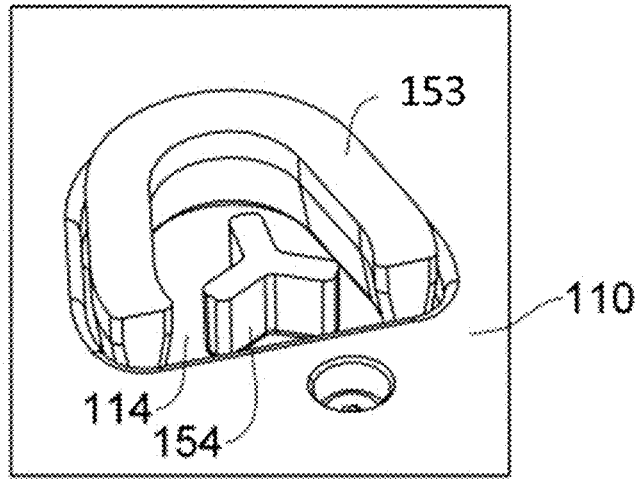
FIG. 8B is an enlarged diagram of a hold-down mechanism acting on a cover of the dedicated inner pod.
Figure 9A:
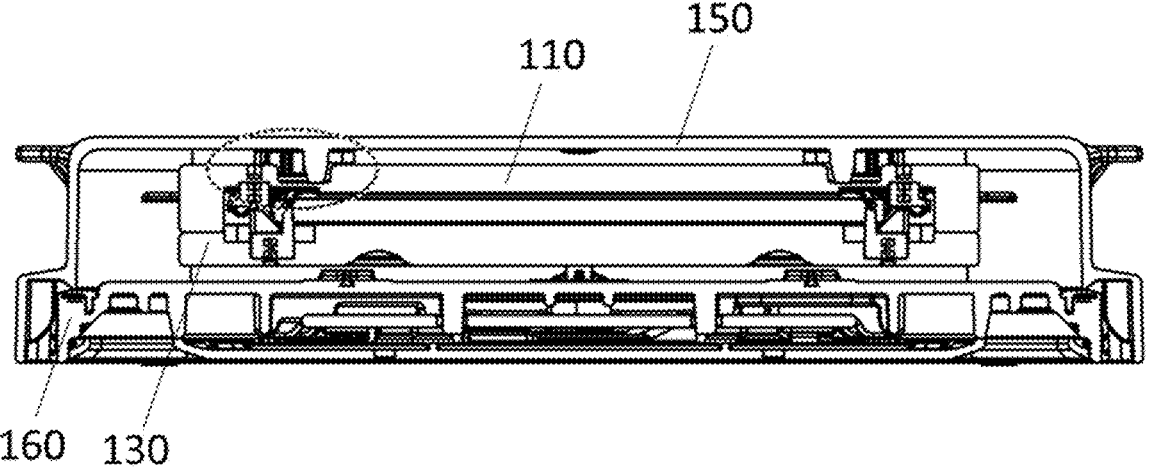
FIG. 9A is a section diagram of the reticle storage pod in FIG. 5A that is coupled.
Figure 9B:
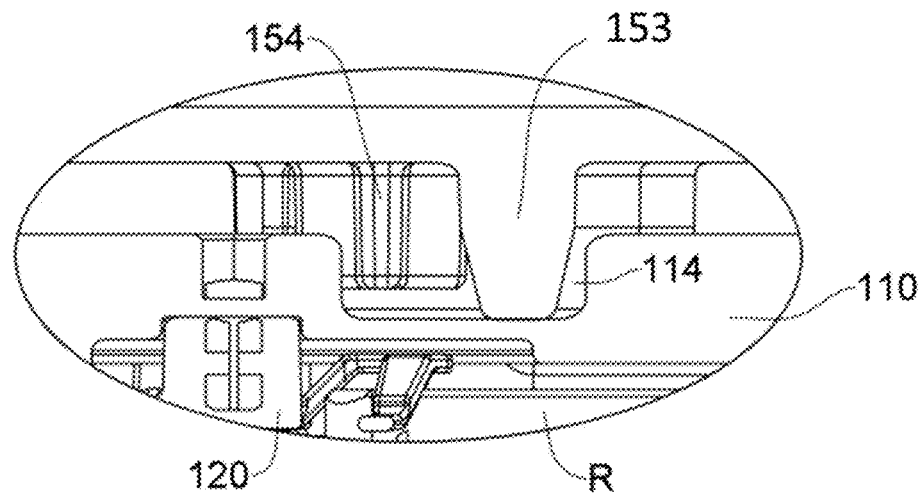
FIG. 9B is an enlarged partial diagram of an area indicated by a dotted line in FIG. 9A.

FIG. 8A shows a bottom view of the outer cover (150) of the dedicated outer pod (102) of the present invention, and it is seen that there are four hold-down mechanisms. FIG. 8B shows details of the hold-down mechanism acting on the cover (110) of the dedicated inner pod, wherein the outer cover (150) is omitted from the drawing. FIG. 9A shows a section diagram of the reticle storage pod (100) in FIG. 5A that is coupled. FIG. 9B shows an enlarged partial diagram of an area indicated by a dotted line in FIG. 9A.

Figure 2:
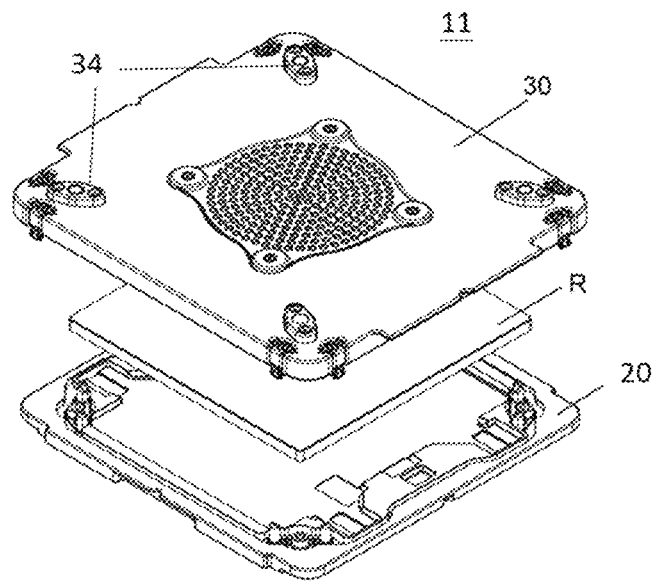
FIG. 2 is a three-dimensional exploded diagram of a conventional inner pod and a reticle.

When the dedicated outer pod (102) of the present invention is configured with the hold-down mechanisms at the inner sides and is used for accommodating the dedicated inner pod (101), the outer cover (150) provides an external downward pressing force acting on the dedicated inner pod (101) accommodated in the dedicated outer pod (102). Also referring to FIG. 5B and FIG. 5C, the dedicated outer pod (102) of the present invention includes the outer cover (150) and the outer base (160). According to the hold-down mechanism further provided by the present invention, the outer cover (150) and the outer base (160) may be used to accommodate differently structured inner pods, that is, the inner pod (11) in FIG. 2 or the dedicated inner pod (101) in FIG. 5D. In this embodiment, the differently structured inner pods are illustrated by the dedicated inner pod (101) of the present invention and the inner pod (11) of the reticle transport pod (10), wherein the two have different configurations on the top surfaces of the covers (110 and 30). However, the present invention is not limited to these two types of inner pods.

The positions of the individual hold-down mechanism provided on the downward facing surface of the inner side of the outer cover (150) substantially respectively correspond to the positions of the four corners of the differently structured inner pods (101 and 11) securing the reticle. Each hold-down mechanism includes a first hold-down mechanism and a second hold-down mechanism. The first hold-down mechanism is configured to provide a downward pressing force acting on only the cover (30) of the inner pod (11) of the reticle transport pod (10), but not on the cover (110) of the dedicated inner pod (101) of the present invention. In contrast, the second hold-down mechanism is configured to provide a downward pressing force acting on only the cover (110) of the dedicated inner pod (101) of the present invention, but not on the cover (30) of the inner pod (11) of the reticle transport pod (10). Moreover, the present invention does not define whether the first hold-down mechanism and the second hold-down mechanism are discrete elements or one single element formed as an integral.

Referring to FIG. 8A, the hold-down mechanisms of the present invention are configured on the downward facing surface of the outer cover (150), and substantially correspond to the corners of the reticle. In this embodiment, the first hold-down mechanism is a horseshoe-shaped hold-down rib (153), and the second hold-down mechanism is a hold-down column (154), wherein the two may be in elastic materials. Specifically, the horseshoe-shaped hold-down rib (153) is a winding U-shaped extension structure, and the hold-down column (154) is located on an inner side of the horseshoe-shaped hold-down rib (153), or the hold-down column (154) is surrounded by the horseshoe-shaped hold-down rib (153). The hold-down column (154) of this embodiment is a Y-shaped structure; however, the present invention is not limited to the example above.

Referring to FIG. 8B, in order to allow coordination between the recess (114) of the cover (110) and the first hold-down mechanism, the horseshoe-shaped hold-down rib (153) is in a predetermined size and shape. When the dedicated inner pod (101) is accommodate in the dedicated outer pod (102) of the reticle storage pod (100) of the present invention, the horseshoe-shaped hold-down rib (153) configured at the inner side surface of the outer cover (150) of the dedicated outer pod (102) exactly enters the corresponding recess (114) of the cover (110), and the lower surface of the horseshoe-shaped hold-down rib (153) contacts with the bottom surface of the recess (114), such that the weight of the outer cover (150) acts on the cover (110) via the horseshoe-shaped hold-down rib (153), with however the hold-down column (154) not contacting the bottom surface of the recess (114) due to its size. As shown in FIG. 9A and FIG. 9B, when the outer cover (150) is coupled with the outer base (160) to accommodate the dedicated inner pod (101), since a vertical dimension of the horseshoe-shaped hold-down rib (153) is greater than a vertical dimension of the hold-down column (154), a lower end of the horseshoe-shaped hold-down rib (153) is allowed to enter the recess (114) and press against the bottom surface of the recess (114), while the hold-down column (154) is suspended in the recess (114). In other words, when the dedicated outer pod (102) accommodates the dedicated inner pod (101), the hold-down column (154) does not act on the cover (110). Moreover, a sidewall of the recess (114) may limit a horizontal movement of the horseshoe-shaped hold-down rib (153), preventing the dedicated inner pod (101) from a transverse swaying in the dedicated outer pod (102).

Figure 10A:
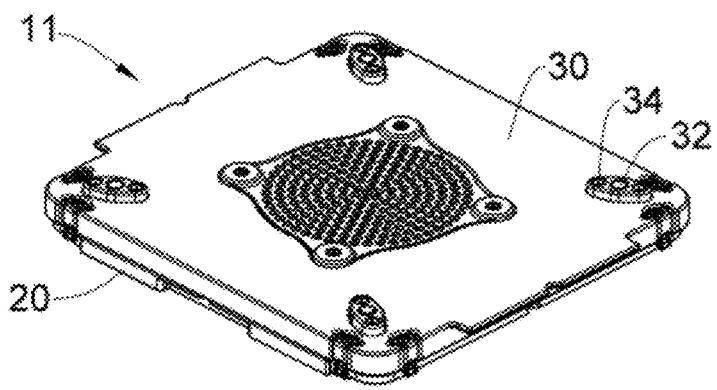
FIG. 10A is a three-dimensional diagram of a conventional reticle transport inner pod.
Figure 10B:
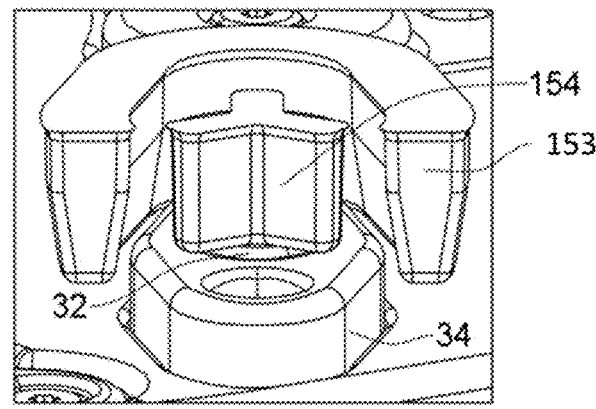
FIG. 10B is a diagram of a hold-down mechanism acting on a corresponding mechanism of a cover of a conventional reticle transport inner pod.
Figure 10C:
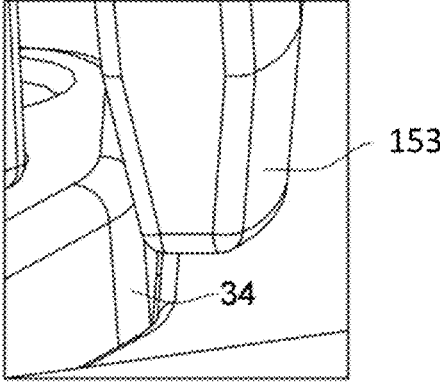
FIG. 10C is an enlarged diagram of a hold-down mechanism and a corresponding mechanism of an inner pod of a reticle transport pod.

FIG. 10A shows a three-dimensional diagram of the reticle transport inner pod (11). FIG. 10B shows a diagram of a hold-down mechanism acting on a corresponding mechanism of the cover (30) of the inner pod (11) of the reticle transport pod (10), with the outer cover (150) omitted from the drawing. FIG. 10C shows an enlarged diagram of a hold-down mechanism and a corresponding mechanism of the inner pod (11) of the reticle transport pod (10).

On positions substantially corresponding to the corners of the reticle, corresponding elastic hold-down mechanisms are provided on the cover (30) of the inner pod (11). Each elastic hold-down mechanism includes a hold-down pin (32) and a cap (34) securing the hold-down pin (32). Specifically, a top end of the hold-down pin (32) is exposed at a top portion of the cover (30), and a lower end of the hold-down pin (32) extends to an inner side of the cover (30) and is exposed in the storage space of the inner pod (11). When the inner pod (11) accommodates a reticle and the top end of the hold-down pin (32) is applied with a downward pressing force, the hold-down pin (32) is forced to descend, such that the lower end of the hold-down pin (32) presses against the upper surface of the reticle so as to secure the reticle.

When the dedicated outer pod (102) of the reticle storage pod (100) of the present invention accommodates the inner pod (11) in FIG. 10A, the hold-down mechanism provided at the inner side surface of the outer cover (150) of the dedicated outer pod (102) can act on the elastic hold-down mechanism of the inner pod (11). Specifically, as shown in FIG. 10B, due to different vertical dimensions of the horseshoe-shaped hold-down rib (153) and the hold-down column (154), the bottom end of the hold-down column (154) of the hold-down mechanism can press against the exposed top end of the hold-down pin (32), such that the weight of the outer cover (150) presses downward at the exposed top surface of the hold-down pin (32) via the hold-down column (154), while the horseshoe-shaped hold-down rib (153) is around the cap (34) and does not act on the cover (30). As shown in FIG. 10C, an inner wall of the horseshoe-shaped hold-down rib (153) can limit a horizontal movement of the cap (34), preventing the inner pod (11) from a transverse sway-ing in the dedicated outer pod (102).

The purpose of the Y-shaped structure of the hold-down column (154) of this embodiment is to produce structural interference between the hold-down column (154) and the cap (34), so as to prevent the hold-down column (154) from overly pressing down the hold-down pin (32) and hence preventing the reticle from receiving an inappropriate force. Preferably, a buffering gap is present between the horseshoe-shaped hold-down rib (153) and the cap (34) to prevent particles from being generated due to abrasion of hardware.

Figure 11A:
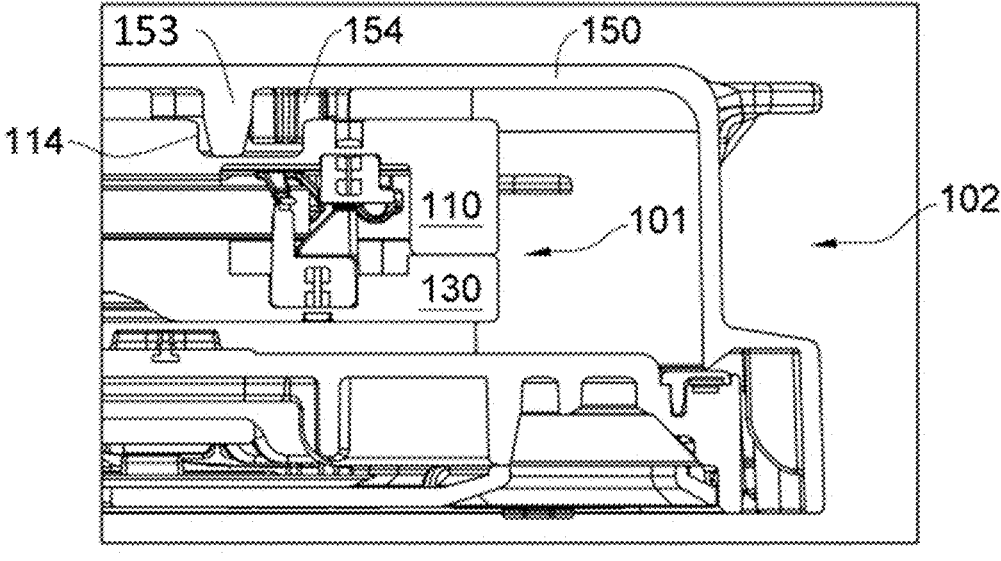
FIG. 11A is a section diagram of a dedicated outer pod accommodating a dedicated inner pod of a reticle storage pod of the present invention.
Figure 11B:
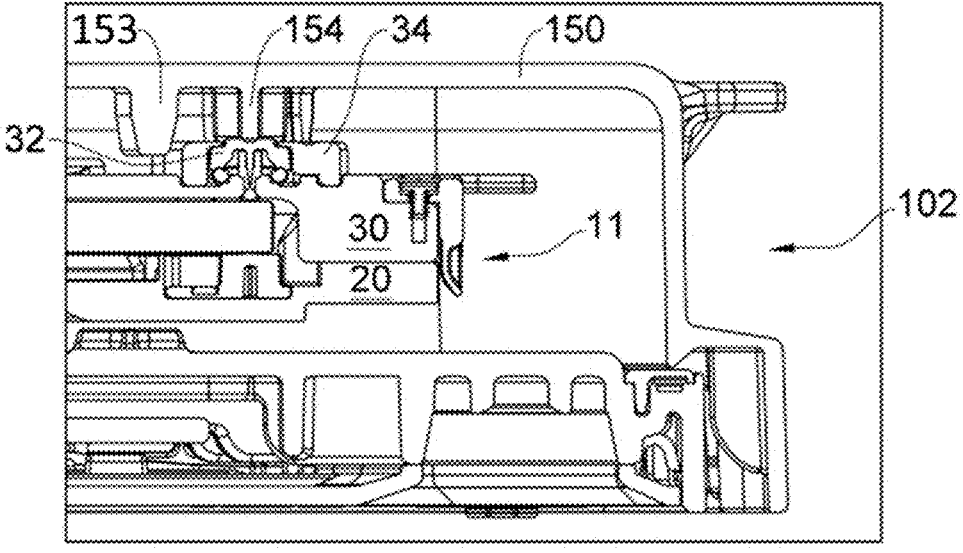
FIG. 11B is a section diagram of a dedicated outer pod accommodating a non-dedicated inner pod of a reticle storage pod of the present invention.

FIG. 11A is a section diagram of the dedicated outer pod (102) accommodating the dedicated inner pod (101) of a reticle storage pod of the present invention. FIG. 11B is a section diagram of the dedicated outer pod (102) accommo-dating the non-dedicated inner pod (11) of a reticle storage pod of the present invention. That is to say, the dedicated outer pod (102) provided by the present invention, with a hold-down mechanism consisting of two structures included, can accommodate the existing inner pod (11) extensively applied in the present field in addition to also being capable of accommodating the dedicated inner pod (101) provided in response to the storage purpose. More-over, such hold-down mechanism can achieve the effect of secure accommodation for both the inner pods (11 and 101) having different configurations and utilization purposes.

Figure 12:
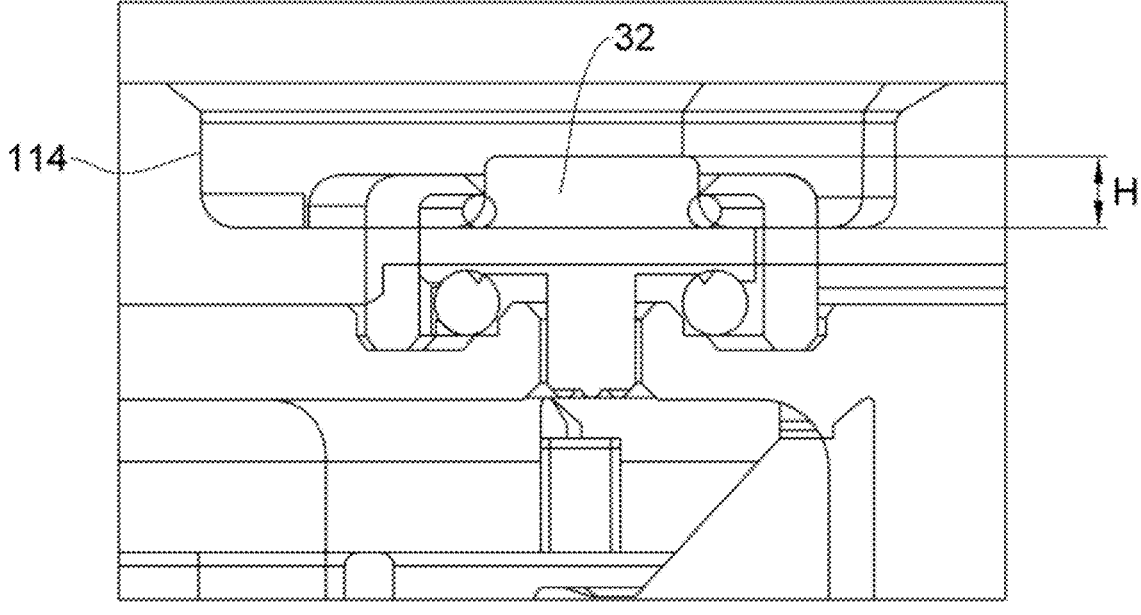
FIG. 12 shows overlapping diagrams of a cover of a dedicated inner pod and a cover of an inner pod of a reticle transport pod of the present invention.

FIG. 12 shows overlapping diagrams of the cover (110) of the dedicated inner pod (101) and the cover (30) of the non-dedicated inner pod (101) of the present invention. A volume of the recess (114) is greater than that of the cap (34) of the hold-down mechanism, and a height of a top portion of the hold-down pin (32) of the elastic hold-down mecha-nism is higher than the bottom surface of the recess (114), as shown by a vertical difference (H) in the drawing. Thus, when the dedicated inner pod (101) or the non-dedicated inner pod (11) is accommodated in the dedicated outer pod (102), the horseshoe-shaped hold-down rib (153) can exactly press against the bottom surface of the recess (114), or the bottom surface of the hold-down column (154) of the outer cover (150) can exactly press against the top end of the hold-down pin (32). In other words, in order to coordinate with the dedicated inner pod and the non-dedicated inner pod, vertical dimensions of the first hold-down mechanism (such as the horseshoe-shaped hold-down rib 153) and the second hold-down mechanism (such as the hold-down col-umn 154) provided at the inner sides of the outer cover (150) of the present invention basically also have height differ-ences similar to the vertical difference (H).

Figure 13:
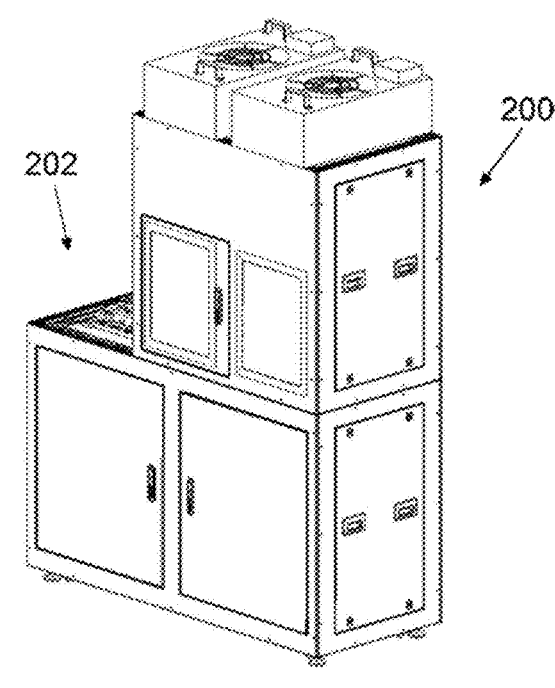
FIG. 13 is a three-dimensional appearance diagram of a reticle loading system of the present invention.
Figure 14:
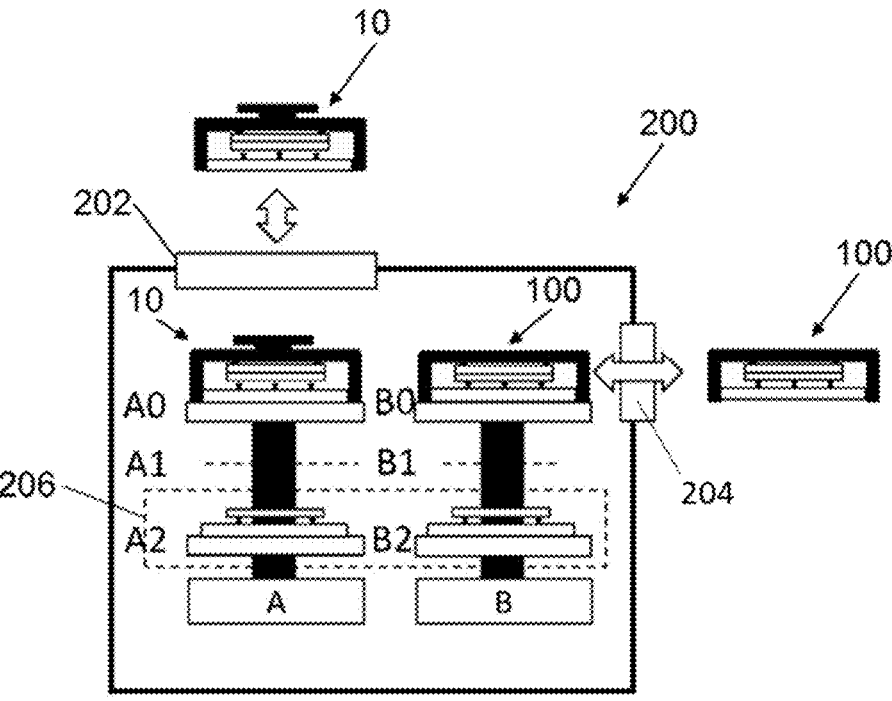
FIG. 14 is a schematic diagram of a reticle loading system of the present invention.

FIG. 13 shows a three-dimensional appearance diagram of the reticle loading system (200) of the present invention. FIG. 14 shows a schematic diagram of a configuration of the reticle loading system (200) of the present invention.

The reticle loading system (200) of the present invention has a first port (202) that supports the E84 standard to allow loading or unloading of the reticle transport pod (10), and a second port (204) that is connected to such as a connection channel of the reticle storage cabinet system (600) in FIG. 4 to allow loading or unloading of the reticle storage pod (100). Specifically, an OHT system in a factory may coor-dinate with the first port (202) to load the reticle transport pod (10) to the reticle loading system (200) or to take out the reticle transport pod (10) from the reticle loading system (200); the second port (204) may coordinate with a mechani-cal arm in the reticle storage cabinet system (600) so as to transfer the reticle storage pod (100) between the environ-ment of the reticle storage cabinet system (600) and the environment of the reticle loading system (200). In this embodiment, the second port (204) is located on a back surface of the reticle loading system (200), and is thus not seen in FIG. 13.

The reticle loading system (200) is configured to include an identification and checking means for the reticle transport pod (10) and the reticle storage pod (100), such as an RFID reading means, two-dimensional barcode reading means and reticle pellicle checking means associated with the pod body and the reticle.

The first port (202) and the second port (204) respectively correspond to a first lifting means and a second lifting means. In this embodiment, the first lifting means (A) primarily controls a lift for carrying the reticle transport pod (10), and the second lifting means (B) primarily controls another lift for carrying the reticle storage pod (100). The first lifting means (A) enables the lift to reside at different vertical heights, which are respectively A0, A1 to A2 from high to low. Similarly, the second lifting means (B) enables the lift to reside at different vertical heights, which are respectively B0, B1 to B2 from high to low. As shown in FIG. 14, the reticle transport pod (10) and the reticle storage pod (100) at the height A0 and the height B0 are both in a non-open state, the reticle transport pod (10) and the reticle storage pod (100) at the height A1 and the height B1 are both in an open state (not shown in the drawing), and the reticle transport pod (10) and the reticle storage pod (100) at the height A2 and the height B2 are both open and one of them may expose the reticle. More specifically, when the reticle transport pod (10) and the reticle storage pod (100) are at the heights A1 and B1, a cover opening means intervenes to separate the outer cover and the inner cover from the outer base and the inner base. More specifically, when the reticle transport pod (10) and the reticle storage pod (100) are located at the height A2 and B2, only the respective outer base and inner base are left on the lifts, and the inner and outer covers do not descend to the heights A2 and B2 as being blocked, and at this point, the reticle may be located in a reticle transfer environment (206).

Conditions of the reticle transfer environment (206) may be different from those at the heights A0, A1, B0 and B1, to ensure lower risks of transfer of the reticle. The reticle transfer environment (206) includes a reticle clamping mechanism configured to pick up the reticle from the base or place the reticle on the base, so that the reticle can be transferred between the base of the reticle transport pod (10) and the base of the reticle storage pod (100).

Moreover, the mechanical arm of the reticle storage cabinet system (600) may fetch the reticle storage pod (100) in the reticle loading system (200) via the second port (204). If the reticle loading system (200) malfunctions and becomes inoperable while having the reticle storage pod (100) therein, the mechanical arm of the reticle storage cabinet system (600) may temporarily take out the reticle storage pod (100), to ensure that a dedicated pod of the reticle storage cabinet system (600) is not contaminated due to maintenance of the reticle loading system (200).

To ensure that the environment in the reticle loading system (200) also has a certain level of cleanliness, as shown in FIG. 13, a fan-filter unit (FFU) in charge of air intake, filtration and exhaust is provided above the cabinet.

Figure 15:
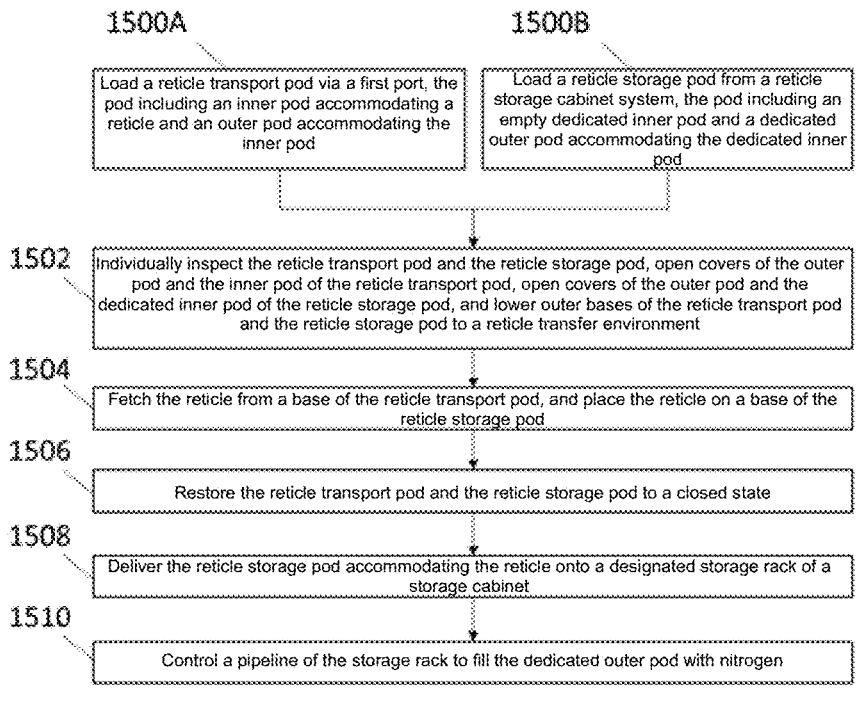
FIG. 15 is a flowchart of loading of a reticle storage method of the present invention.
Figure 16:
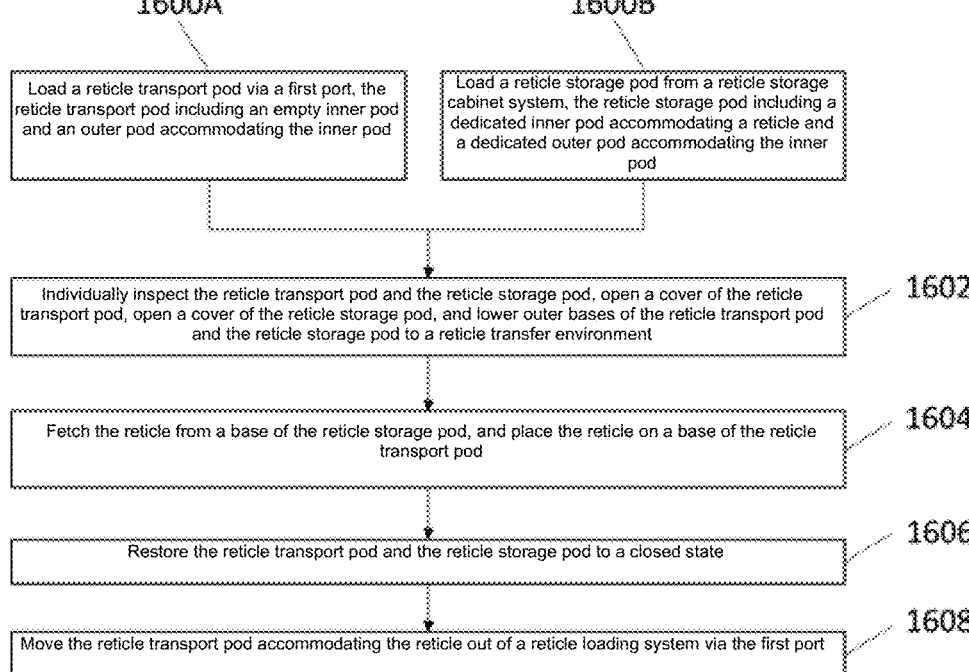
FIG. 16 is a flowchart of unloading of a reticle storage method of the present invention.

FIG. 15 and FIG. 16 are flowcharts of loading and unloading of a reticle according to the embodiment in FIG. 14.

In step 1500A, the reticle transport pod (10) is loaded via the first port (202). The reticle transport pod (10) includes an inner pod accommodating a reticle and an outer pod accommodating the inner pod, wherein the reticle that is not yet used or has been used needs to be stored. The inner pod and the outer pod may respectively correspond to the inner pod (11) and the outer pod (12) in FIG. 1.

In step 1500B, the reticle storage pod (100) is loaded from the reticle storage cabinet system (600), wherein the reticle storage pod (100) includes an empty dedicated inner pod and a dedicated outer pod accommodating the dedicated inner pod. The reticle storage cabinet system (600) has a plurality of reticle storage pods (100) stored therein. An empty dedicated pod is loaded in this step. The dedicated inner pod and the dedicated outer pod may respectively correspond to the dedicated inner pod (101) and the dedicated outer pod (102) in FIG. 5A.

In step 1502, the reticle loading system (200) individually inspects the reticle transport pod (10) and the reticle storage pod (100), opens covers of the inner pod and the outer pod of the reticle transport pod (10), opens covers of the dedicated outer pod and the dedicated inner pod of the reticle storage pod (100), and lowers the outer base of the reticle transport pod (10) and the outer base of the reticle storage pod (100) to the reticle transfer environment (206). Specifically, this step can cover the positions A0 to A2 and B0 to B2 of the first lifting means A and the second lifting means B in FIG. 14.

In step 1504, the reticle is fetched from the base of the reticle transport pod (10), and the reticle is transferred onto the base of the reticle storage pod (100). The transfer in this step is implemented by a reticle clamping mechanism, and the reticle is moved in the reticle transfer environment (206) having a high level of cleanliness so as to reduce contamination risks of the reticle.

In step 1506, the reticle transport pod (10) and the reticle storage pod (100) are restored to a closed state. At this point, the reticle transport pod (10) is an empty pod, and the reticle storage pod (100) is loaded with the reticle to be stored.

In step 1508, the reticle storage pod (100) loaded with the reticle is transported to a designated storage rack of the reticle storage cabinet system (600). Preferably, the storage rack is designated according to a shortest movement route of the mechanical arm between the storage rack and the second port (204) in FIG. 14.

In step 1510, an air filling means is performed to fill the reticle storage pod (100) by a non-reactive gas to complete storage of the reticle. Specifically, the storage rack has a dedicated pipeline and a connector connected to the reticle storage pod (100), and can fill the dedicated outer pod of the reticle storage cabinet system (600) by nitrogen. In other words, the dedicated inner pod for storage is placed in a specific gas environment.

In step 1600A, the reticle transport pod (10) is loaded via the first port (202), wherein the reticle transport pod (10) includes an empty inner pod and an outer pod accommodating the inner pod. The inner pod and the outer pod may respectively correspond to the inner pod (11) and the outer pod (12) in FIG. 1.

In step 1600B, the reticle storage pod (100) is loaded from the reticle storage cabinet system (600) to the reticle loading system (200), wherein the reticle storage pod (100) includes a dedicated inner pod accommodating a reticle and a dedicated outer pod accommodating the dedicated inner pod. The dedicated inner pod and the dedicated outer pod may respectively correspond to the dedicated inner pod (101) and the dedicated outer pod (102) in FIG. 5A. The reticle in this step is stored in advance in the reticle storage cabinet system (600) and is to be taken out for various applications.

In step 1602, the reticle loading system (200) individually inspects the reticle transport pod (10) and the reticle storage pod (100), opens the inner pod and the outer pod of the reticle transport pod (10), opens the outer pod and the inner pod of the reticle storage pod (100), and lowers the outer bases of the reticle transport pod (10) and the reticle storage pod (100) to the reticle transfer environment (206).

In step 1604, the reticle is fetched from the base of the reticle storage pod (100), and the reticle is placed onto the base of the reticle transport pod (10). Similarly, the reticle loading system (200) transfers the reticle from the base of the reticle storage pod (100) to the base of the reticle transport pod (10) by the reticle clamping mechanism, and the reticle is moved in the reticle transfer environment (206).

In step 1606, the reticle transport pod (10) and the reticle storage pod (100) are restored to a closed state. At this point, the reticle transport pod (10) is loaded with the reticle, and the reticle storage pod (100) is an empty pod.

In step 1608, the reticle transport pod (10) loaded with the reticle is moved out of the reticle loading system (200) via the first port (202). Specifically, the first port (202) may coordinate with an OHT system to take out the reticle transport pod (10). The empty reticle storage pod (100) is delivered back to an appropriate area of the reticle storage cabinet system (600) to await the next use.

FIG. 17 shows a specific flowchart of reticle transfer of the present invention. The description below is given with reference to FIG. 14, wherein the left half is performed by the first lifting means (A), the right half is performed by the second lifting means (B), and the rest is performed together.

In step 1700A, the reticle transport pod (10) is loaded to the first lifting means (A) of the reticle loading system (200) via the first port (202), wherein the reticle transport pod (10) includes the inner pod and the outer pod accommodating the inner pod. Specifically, the lift of the first lifting means (A) resides at the height A0 to receive and carry the reticle transport pod (10).

In step 1700B, the reticle storage pod (100) is loaded from the reticle storage cabinet system (600) to the second lifting means (B) of the reticle loading system (200) via a connection channel, wherein the reticle storage pod (100) includes the dedicated inner pod and the dedicated outer pod accommodating the inner pod. Specifically, the lift of the second lifting means (B) resides at the height B0 to receive and carry the reticle storage pod (100).

In step 1702A, the cover of the outer pod of the reticle transport pod (10) is grasped, so that the cover of the outer pod and the base of the outer pod are separated in collateral as the lift of the first lifting means (A) descends from the height A0 to the height A1. When the lift is at the height A1, the cover of the outer pod is removed, and only the base of the outer pod and the inner pod remain on the lift.

In step 1702B, the cover of the outer pod of the reticle storage pod (100) is grasped, so that the cover of the outer pod and the base of the outer pod are separated in collateral as the lift of the second lifting means (B) descends from the height B0 to the height B1. When the lift is at the height B1, the cover of the outer pod is removed, and only the base of the outer pod and the inner pod remain on the lift.

In step 1704A, the cover of the inner pod of the reticle transport pod (10) is grasped, so that the cover of the inner pod and the base of the inner pod are separated in collateral as the lift of the first lifting means (A) descends from the height A1 to the height A2. When the lift is at the height A2, the cover of the inner pod is removed, and only the base of the outer pod and the base of the inner pod remain on the lift. While the lift descends from the height A0 to the height A2, the reticle loading system (200) may timely read the two-dimensional barcode of the inner pod, the two-dimensional barcode of the reticle and/or detect the state of the pellicle.

In step 1704B, the cover of the inner pod of the reticle storage pod (100) is grasped, so that the cover and the base of the inner pod are separated in collateral as the lift of the second lifting means (B) descends from the height B1 to the height B2. When the lift is at the height B2, the cover of the inner pod is removed, and only the base of the outer pod and the base of the inner pod remain on the lift. While the lift descends from the height B0 to the height B2, the reticle loading system (200) may timely read the two-dimensional barcode of the inner pod, the two-dimensional barcode of the reticle and/or detect the state of the pellicle.

In step 1706, a reticle is transferred between the base of the inner pod of the reticle transport pod (10) and the base of the inner pod of the reticle storage pod (100) by the reticle clamping mechanism of the reticle loading system (200). A specific embodiment of the reticle clamping mechanism may be referred from FIG. 19A to FIG. 19C and the associated description.

In step 1708A, the lift of the first lifting means (A) ascends from the height A2 to the height A1, so that the cover of the inner pod of the reticle transport pod (10) couples in collateral with the base of the inner pod.

In step 1708B, the lift of the second lifting means (B) ascends from the height B2 to the height B1, so that the cover of the inner pod of the reticle storage pod (100) couples in collateral with the base of the inner pod.

In step 1710A, the lift of the first lifting means (A) ascends from the height A1 to the height A0, so that the cover of the outer pod of the reticle transport pod (10) couples in collateral with the base of the outer pod.

In step 1710B, the lift of the second lifting means (B) ascends from the height B1 to the height B0, so that the cover of the outer pod of the reticle storage pod (100) couples in collateral with the base of the outer pod.

In step 1712A, the reticle transport pod (10) is moved out via the first port (202). The lift of the first lifting means (A) is higher than the height A0, and the reticle transport pod (10) is exposed at the first port (202) of the reticle loading system (200) to await subsequent operations of the OHT system.

In step 1712B, the reticle storage pod (100) is loaded to the reticle storage cabinet system (600) via the connection channel of the reticle storage cabinet system (600). The mechanical arm of the reticle storage cabinet system (600) may enter the reticle loading system (200) and fetch the reticle storage pod (100) from the second lifting means (B).

In the embodiment above, the first lifting means (A) and the second lifting means (B) may respectively perform customized operations for the reticle transport pod (10) and the reticle storage pod (100), for example, the first lifting means (A) may be configured to perform locking and unlocking of the outer pod of the reticle storage pod (100).

Figure 18:
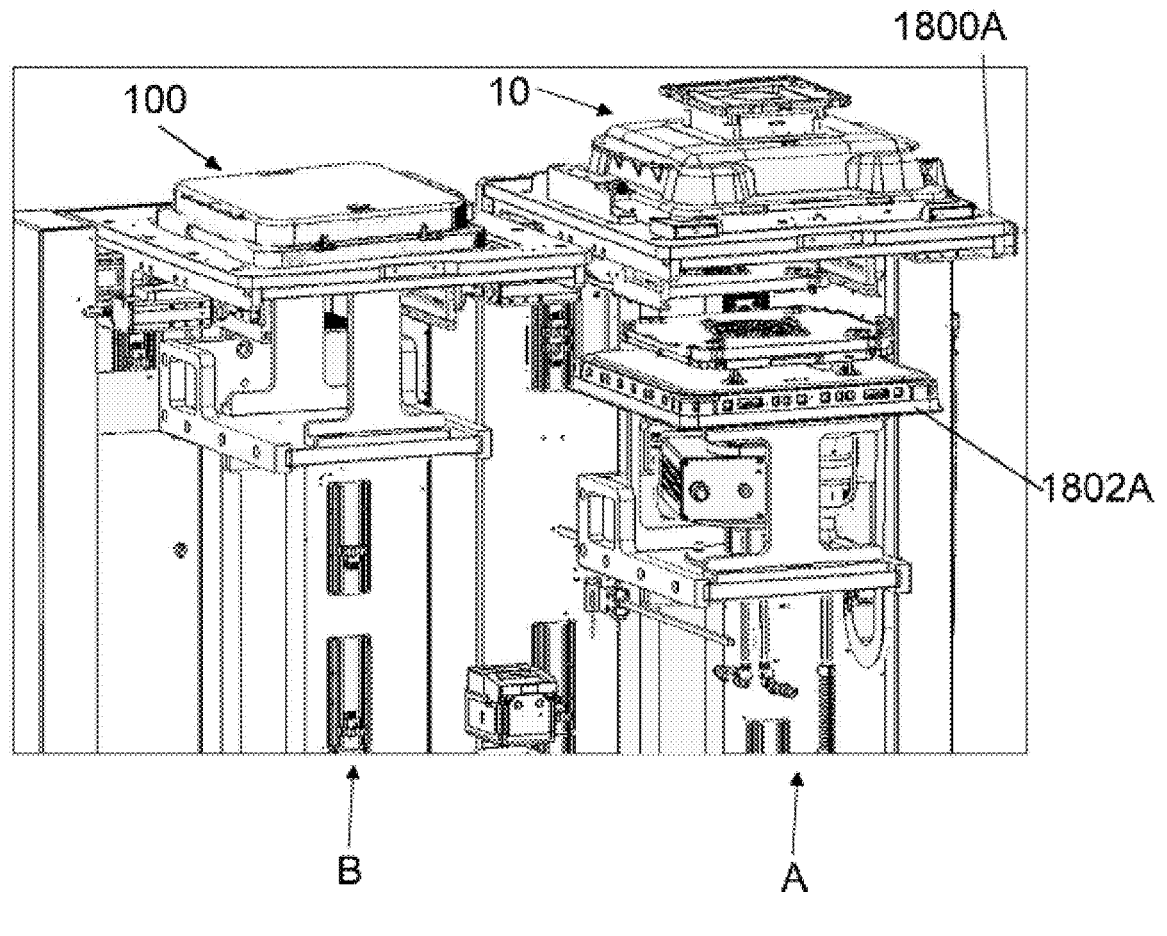
FIG. 18 is a diagram of a reticle loading system according to a specific embodiment of the present invention.

FIG. 18 shows a diagram of a reticle loading system according to a specific embodiment of the present invention, wherein the reticle loading system includes such as the first lifting means (A) and the second lifting means (B) in FIG. 14. It is seen that, the first lifting means (A) has an outer pod cover support surface (1800A), which basically comes into contact with only the cover of the outer pod of the reticle transport pod (10), that is, the center of the outer pod cover support surface (1800A) basically has a hollow allowing falling of the base of the outer pod. The base of the outer pod of the reticle transport pod (10) is carried by a lift (1802A). Thus, when the outer pod of the reticle transport pod (10) is not locked, descending of the lift (1802A) can separate in collateral the cover and the base of the outer pod, so that the base of the outer pod descends together with the inner pod, achieving the object of opening pod. Pod closing is similar. When the lift (1802A) ascends to a height substantially leveled with the outer pod cover support surface (1800A), the cover of the outer pod of the reticle transport pod (10) is coupled in collateral with the base.

The second lifting means (B) may have a similar configuration to implement operations on the reticle storage pod (100). Despite that FIG. 18 shows only opening of the outer pod of the reticle transport pod (10), opening of the inner pod of the reticle transport pod (10) may also be opened by means of intervention of other mechanisms. The reticle storage pod (100) may also be opened and closed by the same mechanisms. Moreover, the reticle loading system (200) may be provided with an appropriate identification device or sensing unit therein, so as to timely identify associated information such as an RFID or two-dimensional barcode on the pod when the reticle transport pod (10) and the reticle storage pod (100) are opened.

Figure 19A:
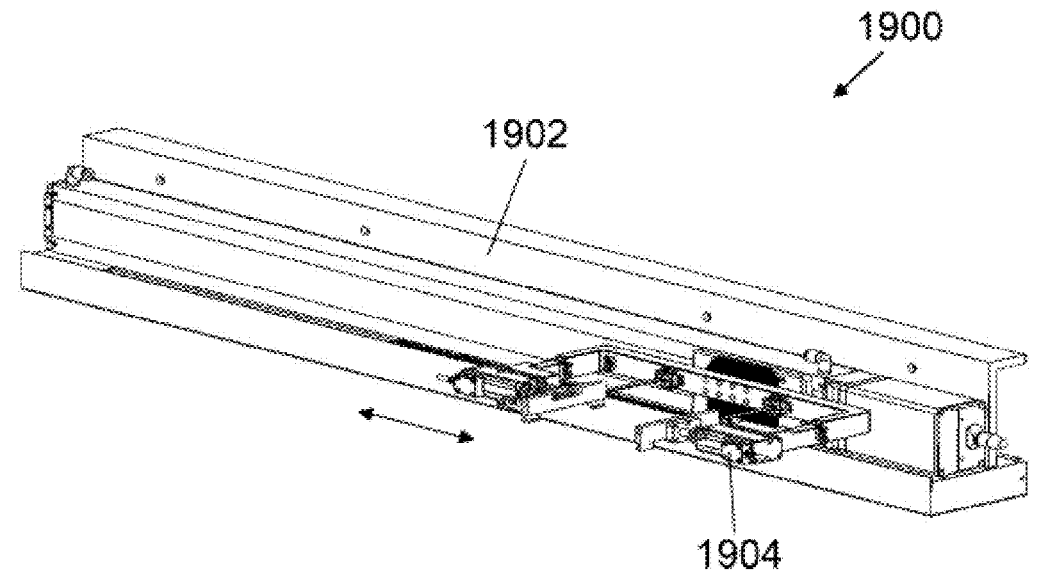
FIG. 19A is a diagram of a reticle clamping mechanism used in a reticle loading system according to a specific embodiment of the present invention.
Figure 19B:
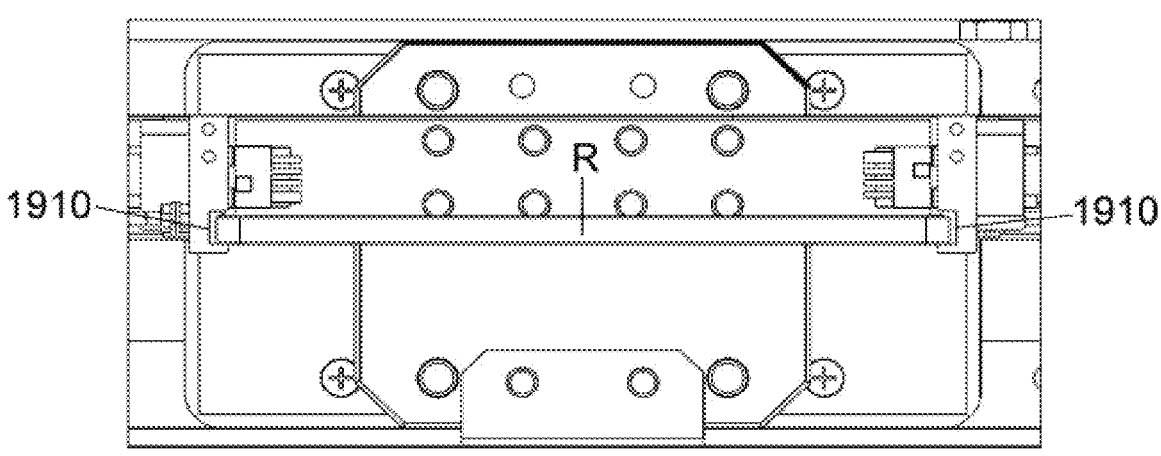
FIG. 19B is a front view of the reticle clamping mechanism.
Figure 19C:
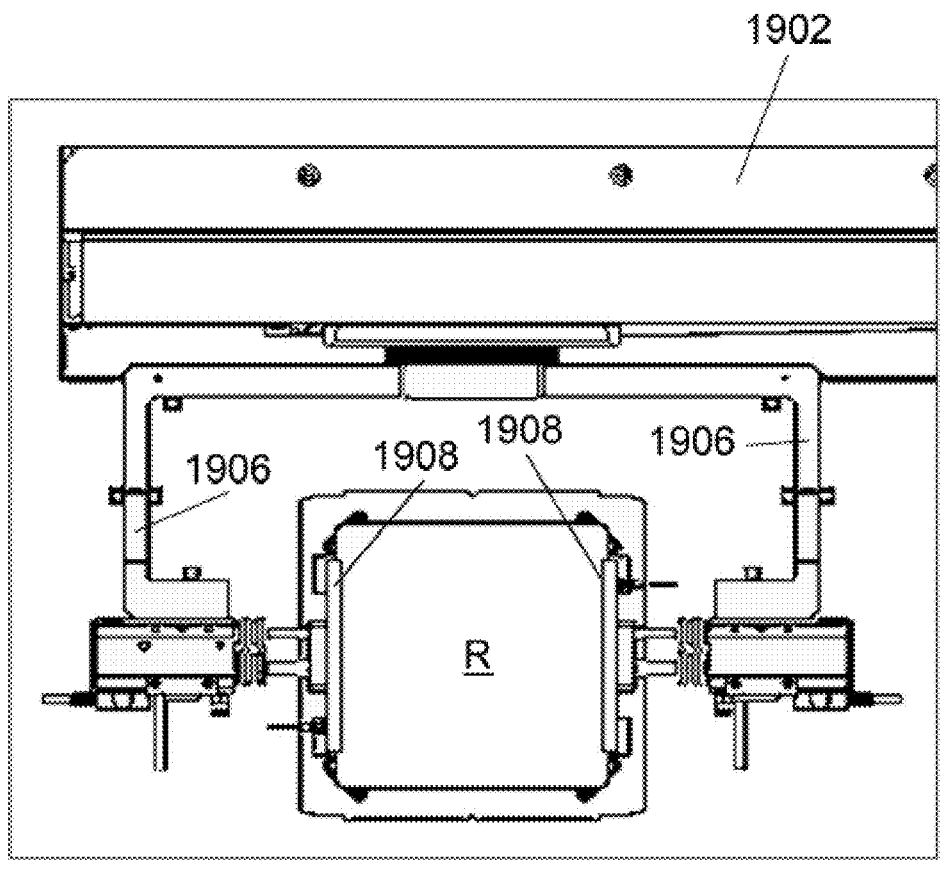
FIG. 19C is a top view of the reticle clamping mechanism.
Figure 20:
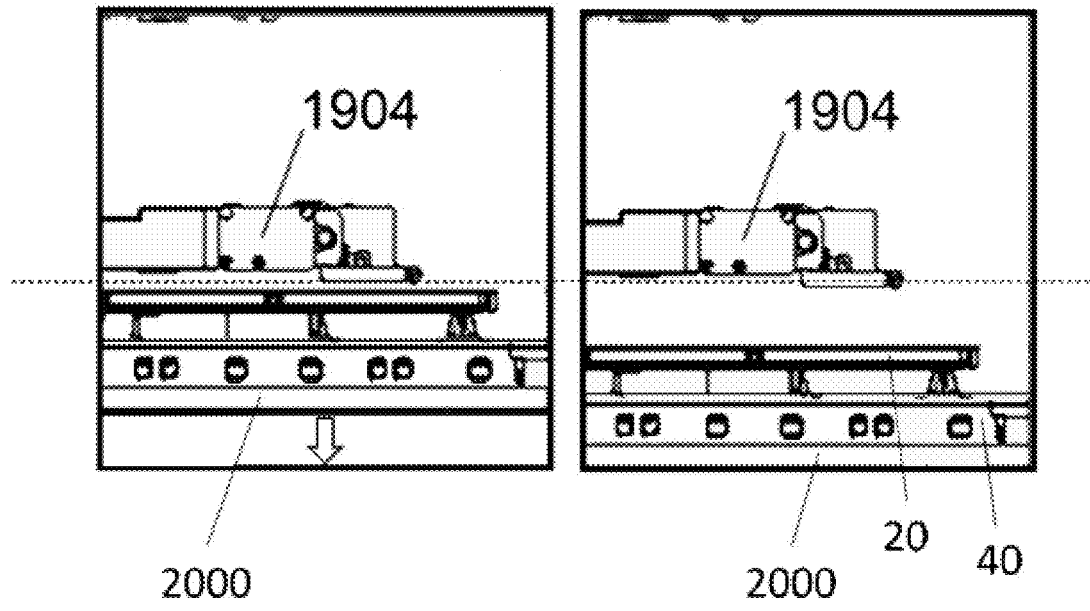
FIG. 20 is a diagram of coordination of the reticle clamping mechanism and a lift.

FIG. 19A, FIG. 19B and FIG. 19C show diagrams of a reticle clamping mechanism (1900) used in a reticle loading system according to specific embodiments of the present invention. The reticle clamping mechanism (1900) is configured in, for example, the reticle transfer environment (206) in FIG. 14, and has a track (1902) and a clamp assembly (1904). The track (1902) is fixed on an inner side of the reticle loading system (200), and as shown in FIG. 20, the clamp assembly (1904) is controlled to be able to move horizontally on the track (1902). The clamp assembly (1904) has a pair of clamp arms (1906) and a pair of contact plates (1908). The pair of contact plates (1908) can be driven and approach each other, and are coupled with a periphery of the reticle (R) via engaging portions (1910), thus achieving the object of clamping the reticle (R). The reticle clamping mechanism (1900) does not have an ability to move vertically, and the reticle (R) can depart from the base only if the lift descends.

FIG. 20 shows a side view of coordination of the reticle clamping mechanism (1900) and a lift (2000). The lift (2000) carrying the outer base (40) of the outer pod (12), the base (20) of the inner pod (11) and the reticle (not shown) descends to below the reticle clamping mechanism (1900), as shown on the right of FIG. 20. Next, the clamp assembly (1904) moves horizontally to above the reticle (R) carried by the lift (2000). The lift (2000) ascends to a height at which the reticle can be clamped, as shown on the left of FIG. 20. The lift (2000) descends after the clamp assembly (1904) clamps the reticle. The clamp assembly (1904) moves horizontally to above another lift (not shown). Similarly, the another lift ascends to a height at which the base of the inner pod can receive the reticle. The clamp assembly (1904) releases reticle to complete the transfer. In a period in which the reticle clamp mechanism (1900) is not required to operate, the clamp assembly (1904) may move to between the two lifting means to prevent operation interference. In FIG. 20, the dotted line indicates that the clamp assembly (1904) is kept at the same height during the moving process.

Figure 21:
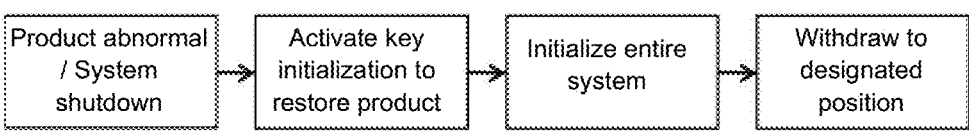
FIG. 21 is an example of an anomaly processing procedure of a reticle loading system.

FIG. 21 shows an example of an anomaly processing procedure of a reticle loading system, and more particularly, an anomaly processing procedure of the reticle transport pod (10) loaded by the lift of the first lifting means (A) or the second lifting means (B) in FIG. 14.

In case of loading anomaly of the reticle transport pod (10), and system shutdown, the reticle loading system (200) may display an anomaly state and detect whether an initialization key is activated. Once the initialization key is activated, the entire reticle loading system (200) is initialized. The lift restores the reticle transport pod (10) to the height A0.

In case of loading anomaly of the reticle storage pod (100), and system shutdown, the reticle loading system (200) may display an anomaly state and detect whether an initialization key is activated. Once the initialization key is activated, the entire reticle loading system (200) is initialized. The lift restores the reticle storage pod (100) to the height B0.

In case of transfer anomaly of the lifts of the first lifting means (A) and the second lifting means (B) located at the heights A2 and B2, and system shutdown, the reticle loading system (200) may display an anomaly state and detect whether an initialization key is activated. Once the initialization key is activated, the entire reticle loading system (200) is initialized. The reticle clamping mechanism (1900) places the reticle in the inner pod of the reticle transport pod (10) or the inner pod of the reticle storage pod (100). The lifts of the first lifting means (A) and the second lifting means (B) are respectively restored to the heights A0 and B0.

Figure 22:
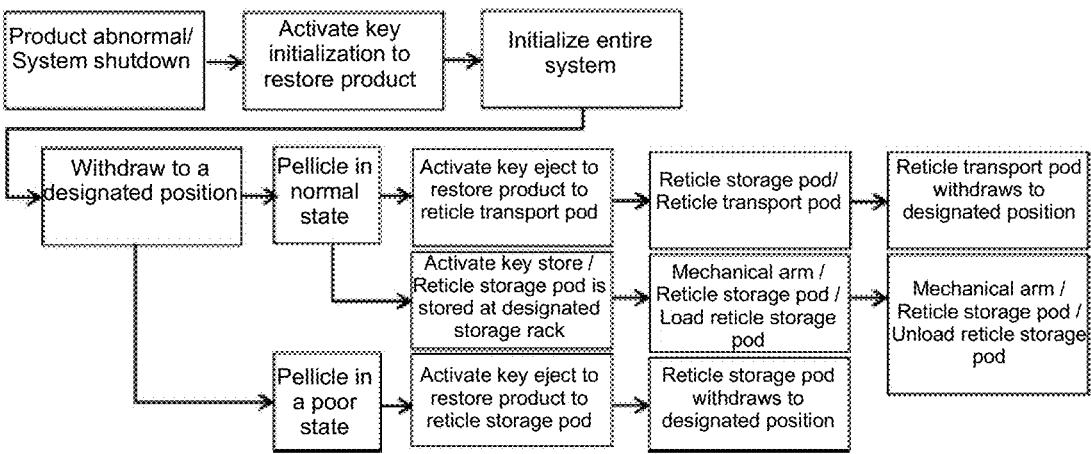
FIG. 22 is an example of another anomaly processing procedure of a reticle loading system.

FIG. 22 is an example of another anomaly processing procedure of the reticle loading system (200), and further includes checking of a state of the pellicle. The reticle loading system (200) may further detect whether a key eject is activated to perform various operations, so as to restore the reticle to the reticle transport pod (10) or the reticle storage pod (100), or to restore the reticle storage pod (100) to a designated storage rack.

Figure 23:
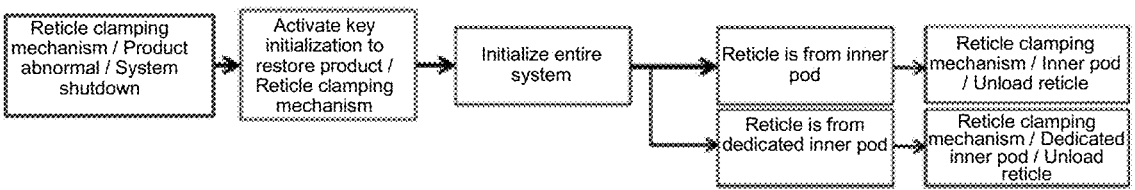
FIG. 23 is an example of an anomaly processing procedure of the reticle clamping mechanism.

FIG. 23 shows an anomaly processing procedure of the reticle clamping mechanism. Depending on whether the reticle is from the inner pod of the reticle transport pod (10) or the inner pod of the reticle storage pod (100), the reticle clamping mechanism (1900) may restore the reticle to the inner pod of the reticle transport pod (10) or the inner pod of the reticle storage pod (100), and then restore the reticle transport pod (10) or the reticle storage pod (100) to a position designated by an initialization procedure.

Figure 24:
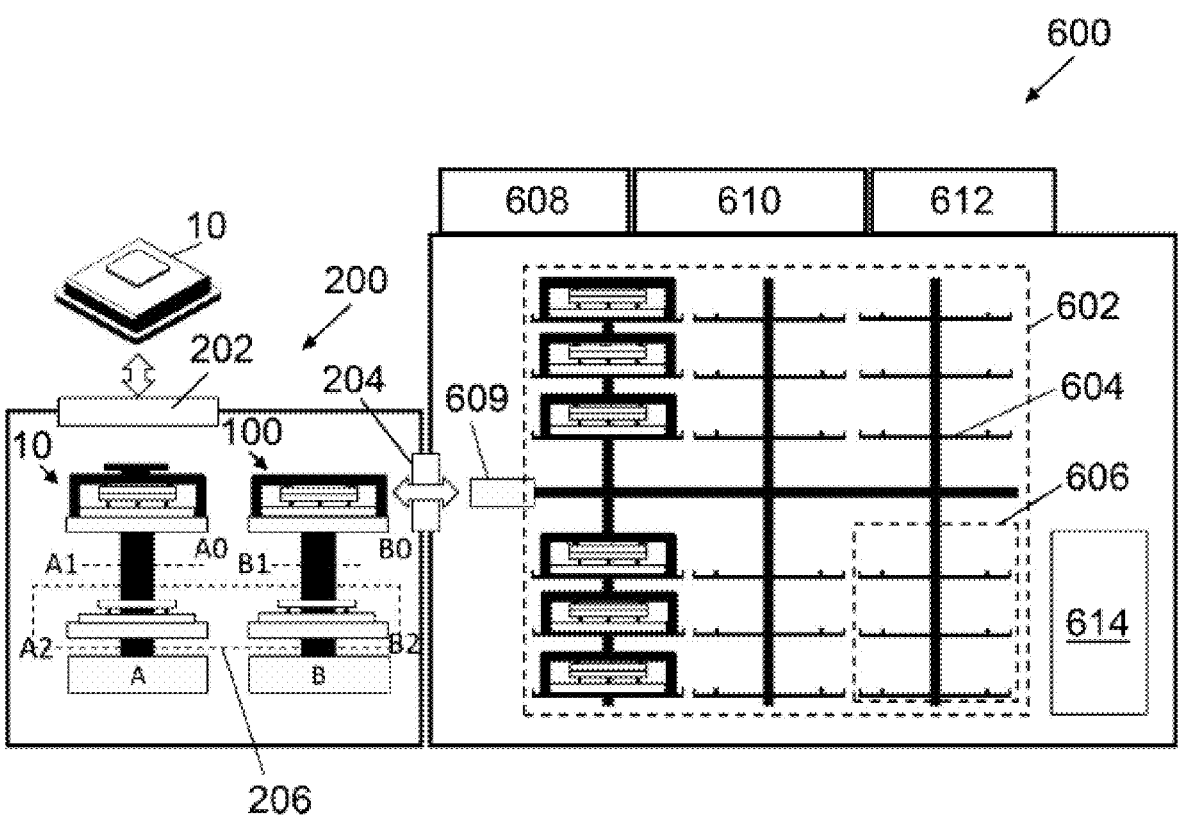
FIG. 24 is a block schematic diagram of a reticle loading system and a reticle storage system of the present invention.

FIG. 24 shows a block schematic diagram of a reticle loading system and a reticle storage cabinet system of the present invention. The reticle storage cabinet system (600) includes one or more storage cabinets (602). The cabinet (602) includes a plurality of storage racks (604) stacked vertically. The storage cabinet (602) can substantially be divided into an upper region and a lower region. Each storage rack (604) of the storage cabinet (602) may be placed with one dedicated reticle storage pod (100), which consists of a dedicated outer pod and a dedicated inner pod, wherein the dedicated outer pod is suitable for accommodating and securing the dedicated inner pod, and the dedicated inner pod is suitable for accommodating and securing a reticle. The dedicated inner pod and the dedicated outer pod may respectively correspond to the dedicated inner pod (101) and the dedicated outer pod (102) in FIG. 5A.

Part of the storage racks (604) of the storage cabinet (602) may be planned as a buffering zone (606). The buffering zone (606) is for storing the reticle storage pod (100) that has been cleaned, or the reticle storage pod (100) that has been used. The cleaned reticle storage pod (100) is an empty pod, and awaits to receive and store a reticle provided to the reticle loading system (200). The used reticle storage pod (100) refers to an empty pod returned from the reticle loading system (200), and has been exposed to an environment with a lower level of cleanliness during the process of reticle transfer and thus contains contamination risks.

The reticle storage cabinet system (600) includes a management means (608), which is primarily configured to manage information of reticles stored in the storage cabinet (602) and monitor ambient temperature and humidity in the storage cabinet (602). For example, an oxygen detection unit is used to detect the ambient oxygen concentration in the cabinet. Preferably, the environment in the storage cabinet (602) satisfies Class 10 cleanliness, and a filled gas satisfies the Class 1 cleanliness. The reticle storage cabinet system (600) further includes a control means (610), which controls a mechanical arm (609) to transport the reticle storage pod to a designated common storage zone or the storage rack (604) of the buffer zone (606). The reticle storage cabinet system (600) further includes a mass flow control means (612), which is in charge of control of various mass flows of the storage cabinet (602), and in particular, a non-reactive gas connected to the individual storage racks (604). For example, a mass flow controller is used to control the mass flow of one or more nitrogen pipelines. The mass flow control means (612) further includes a fan-filter unit (FFU) disposed at a top portion of the reticle storage cabinet system (600), and an exhaust module disposed at a bottom portion of the reticle storage cabinet system (600).

The reticle storage cabinet system (600) further includes a cleaning device (614), which is close to the buffer zone (606) so as to provide clean reticle storage pods (100) to the storage cabinet (602), and to receive used reticle storage pods (100) from the storage cabinet (602).

Figure 25:
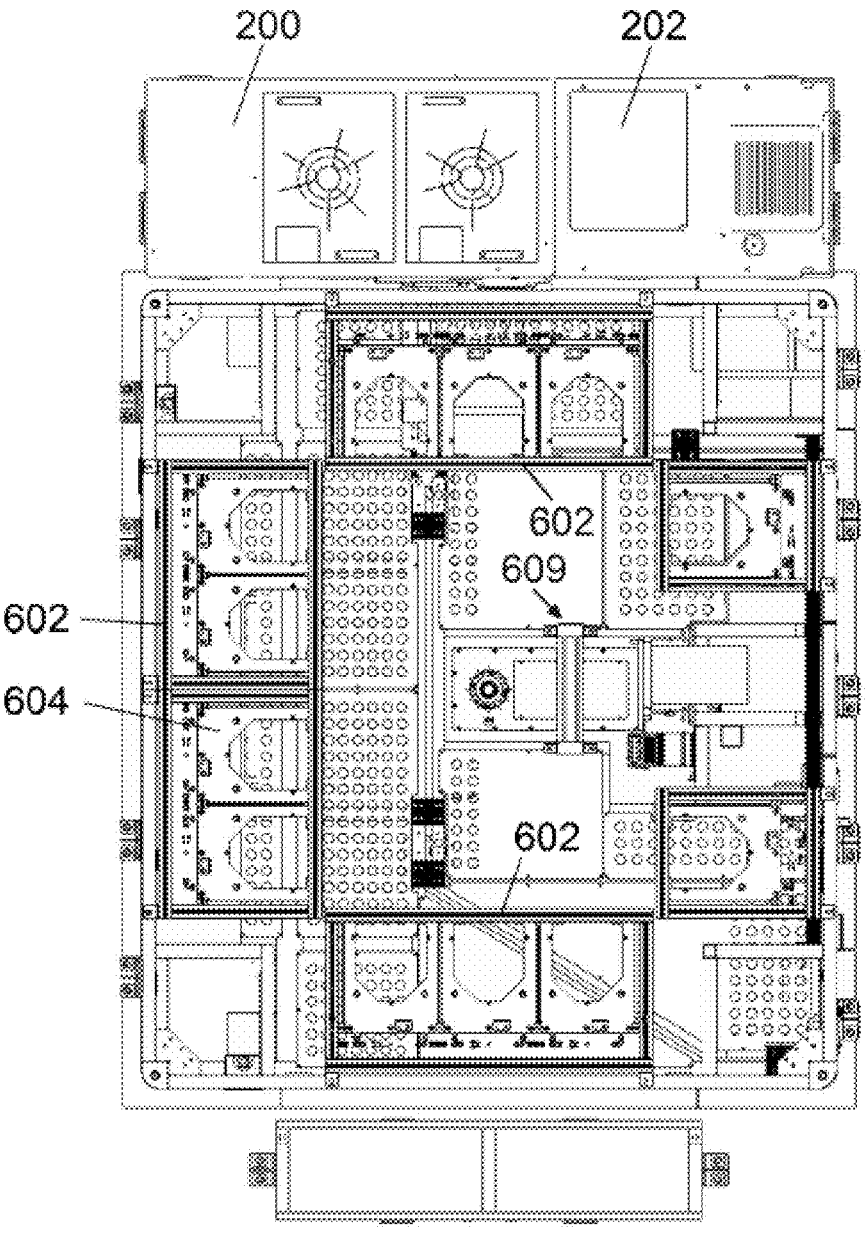
FIG. 25 is a top view of a reticle storage system of the present invention and shows a specific configuration inside the reticle storage system.

FIG. 25 shows a top view of the reticle storage cabinet system (600) of the present invention and shows a specific configuration inside the reticle storage cabinet system. The storage cabinets (602) are primarily placed along an inner wall surface of the reticle storage cabinet system (600), and a mechanical arm (609) is located at the center of the reticle storage cabinet system (600) and can access each storage rack (604) of these storage cabinets (602).

Figure 26A:
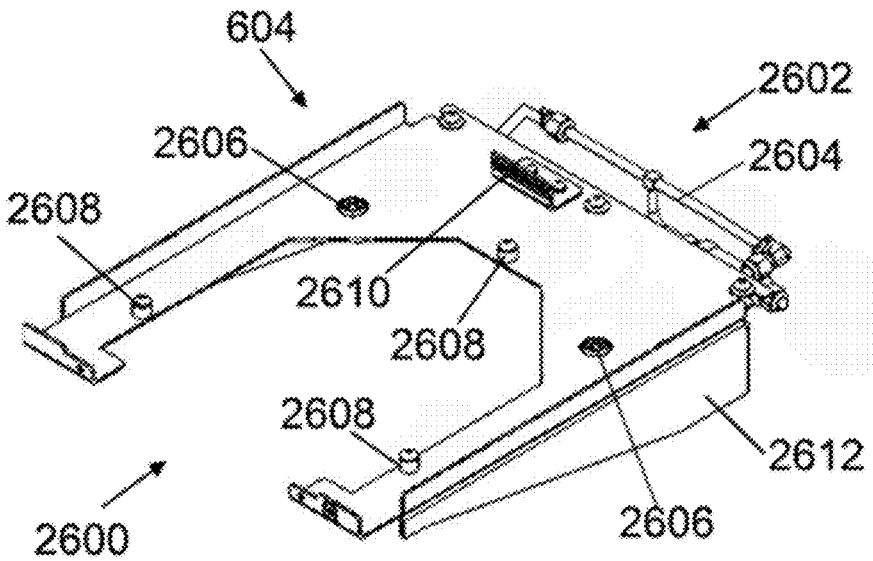
FIG. 26A is a three-dimensional diagram of storage rack according to a specific embodiment of the present invention.
Figure 26B:
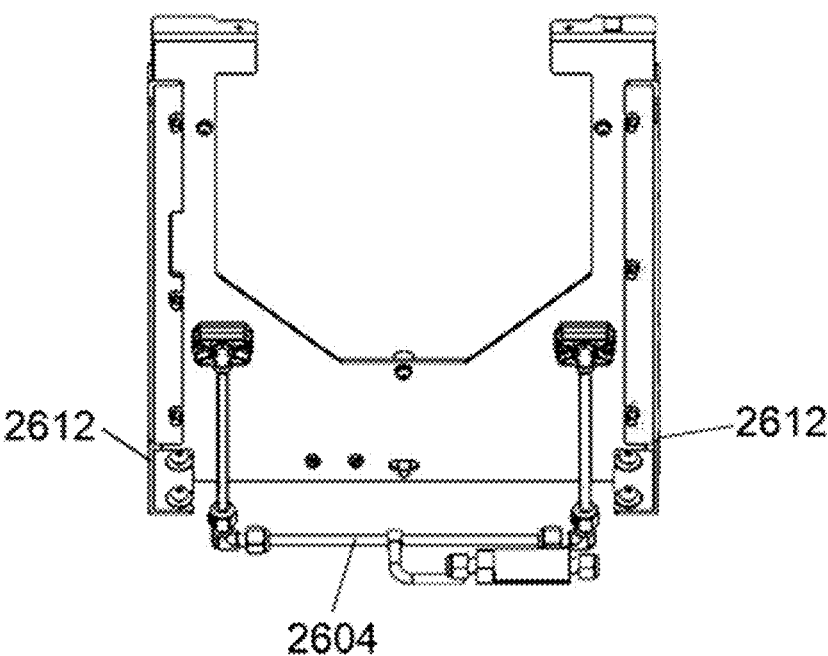
FIG. 26B is a diagram of a configuration of a bottom portion of a storage rack.

FIG. 26A shows a three-dimensional diagram of the storage rack (604) according to a specific embodiment of the present invention. FIG. 26B shows a diagram of a configuration of a bottom portion of the storage rack (604).

Each storage rack (604) is a tablet rack having a front end (2600) and a rear end (2602). The rack has a carrier surface facing upward and a lower surface facing downward. A notch is formed at the front end (2600) of the rack. The notch provides a space for the mechanical arm (609) to operate, allowing the mechanical arm (609) to smoothly place the reticle storage pod (100) on the storage rack (604) or take the reticle storage pod (100) off the storage rack (604). The rear end (2602) of the rack is configured with a nitrogen inflation pipeline (2604), of which an upstream is connected to a nitrogen source and a downstream is connected to a pair of nozzles (2606) of the tablet rack to simultaneously provide nitrogen.

The carrier surface of each storage rack (604) is provided with three kinematic coupling pins (2608) for supporting the bottom portion of the reticle storage pod (100). Two of the coupling pins (2608) are close to the front end (2600) and are located on two sides of the notch, and the other coupling pin (2608) is located on the rear end (2602) of the rack, so that the storage rack (604) is primarily supported and the reticle storage pod (100) is positioned by these three coupling pins (2608). Specifically, these three coupling pins (2608) respectively correspond to the positioning slots (163) of the outer base shown in FIG. 5C or the positioning slots (132) of the base (130) show in FIG. 5I, depending on whether the storage rack (604) supports the outer pod or the inner pod of the dedicated pod.

The carrier surface of the storage rack (604) is further provided with a stop portion (2610) for limiting the reticle storage pod (100). Preferably, the stop portion (2610) may be labeled with information of identification of the mechanical arm (609). The information may also be labeled at the front end (2600) of the storage rack (604). As shown, sidewalls for limiting the reticle storage pod (100) may further be formed on two sides of the rack. The two sides of the rack of the storage rack (604) is secured at a wall surface or a vertical branch of a frame by a pair of connection arms (2612), so as to establish vertical stacking of the plurality of storage racks (604). The coupling pins (2608), the stop portion (2610) and the sidewalls may be in a PEEK plastic material to reduce particles that may be generated due to abrasion.

Figure 27A:
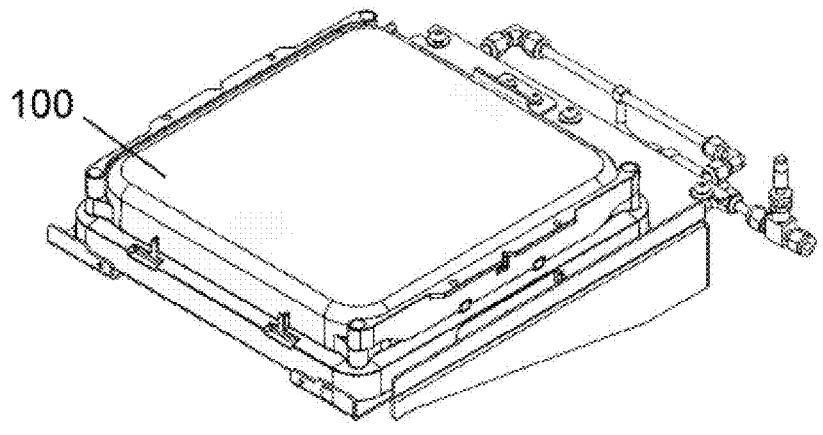
FIG. 27A is a diagram of the storage rack having a reticle storage pod.
Figure 27B:
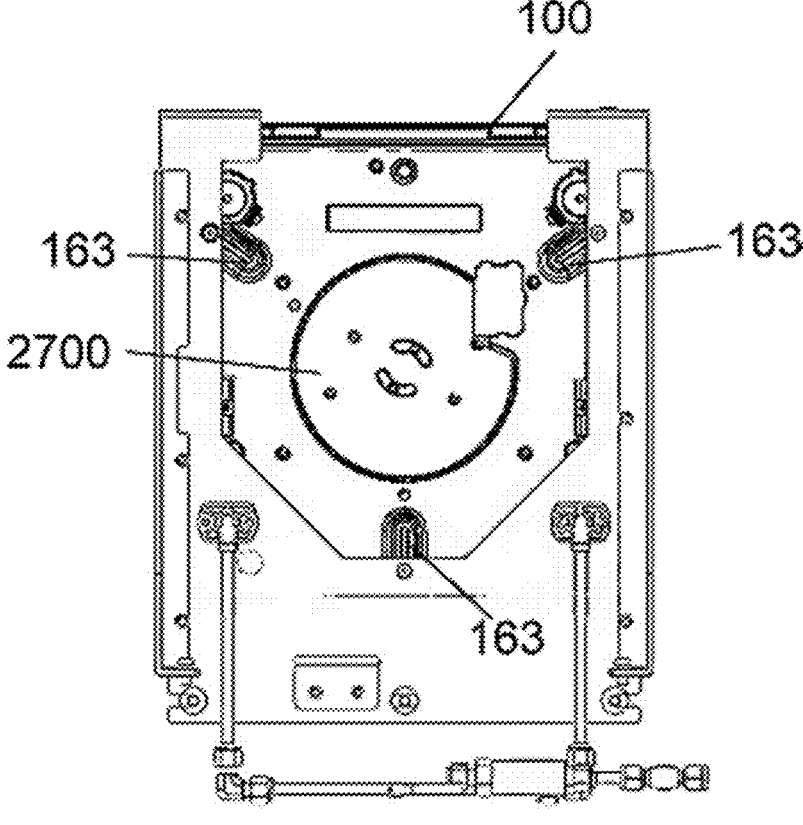
FIG. 27B is a diagram viewed from a bottom portion when the storage rack has a reticle storage pod.
Figure 27C:
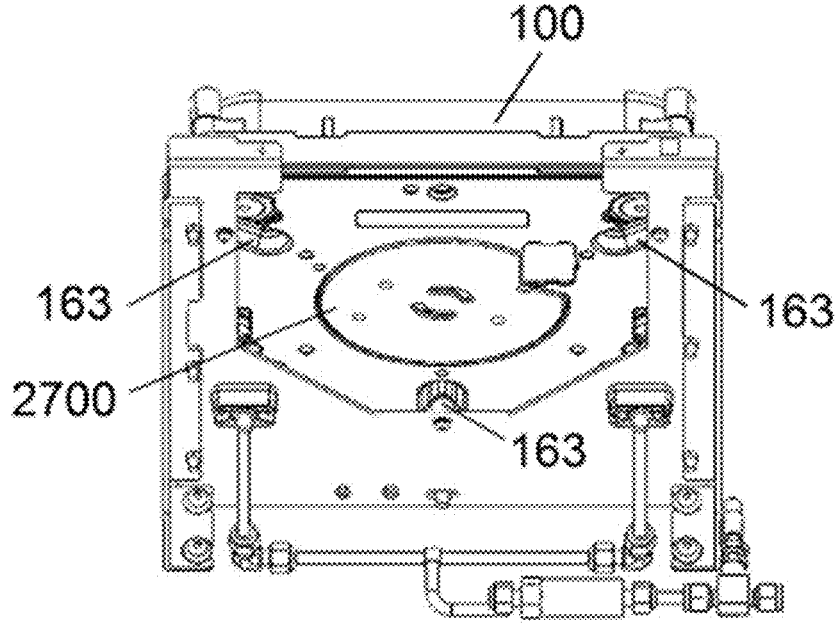
FIG. 27C is a diagram viewed from another angle when the storage rack has a reticle storage pod.

FIG. 27A shows a diagram of the storage rack (604) having the reticle storage pod (100). FIG. 27B shows a diagram viewed from a bottom portion when the storage rack (604) has the reticle storage pod (100). FIG. 27C shows a diagram viewed from another angle when the storage rack (604) has the reticle storage pod (100).

As shown in FIG. 5A, between the dedicated inner pod (101) and the dedicated outer pod (102) included in the reticle storage pod (100), the dedicated outer pod (102) has an outer cover (150) and an outer base (160). A bottom portion of the outer base (160) is configured with a latch mechanism (2700) for locking or unlocking the outer cover (150) and the outer base (160) with or from each other. When the reticle storage pod (100) is loaded by the lift of the reticle loading system (200) in FIG. 14, an operation mechanism provided in the second lifting means (B) can coordinate with the latch mechanism (2700) of the outer base (160) so as to lock or unlock the dedicated outer pod (102).

When the reticle storage pod (100) is placed on the designated storage rack (604), the coupling pins (2608) of the storage rack (604) coordinates with the positioning slots (163) at the bottom portion of the reticle storage pod (100), so as to position the reticle storage pod (100) on the storage rack (604). Specifically, the coupling pins (2608) of the storage rack (604) are located on an outer end of the corresponding positioning slot (163), that is, on one end away from the latch mechanism (2700), and the inner end of each positioning slot (163) close to the latch mechanism (2700) is exposed by the notch, so that the coupling pins (2604) of the mechanical arm (609) can be engaged with a proximal end of the corresponding slot (163) when the mechanical arm (609) approaches the bottom portion of the reticle storage pod (100).

Figure 28A:
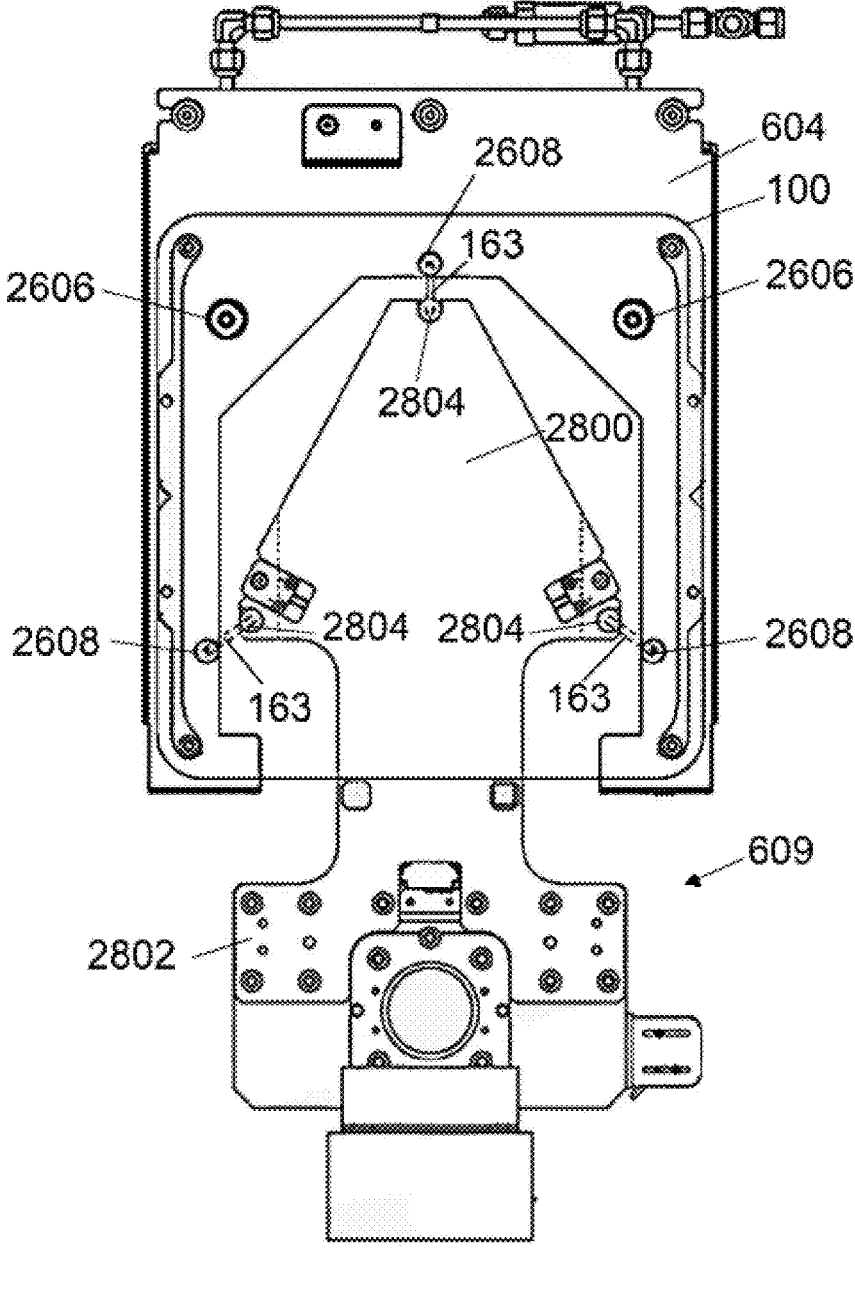
FIG. 28A is a top view of the storage rack and a mechanical arm according to a specific embodiment, wherein the mechanical arm is located below the reticle storage pod, and a positioning slot at a bottom portion of the reticle storage pod on the storage rack is indicated by a dotted line.
Figure 28B:
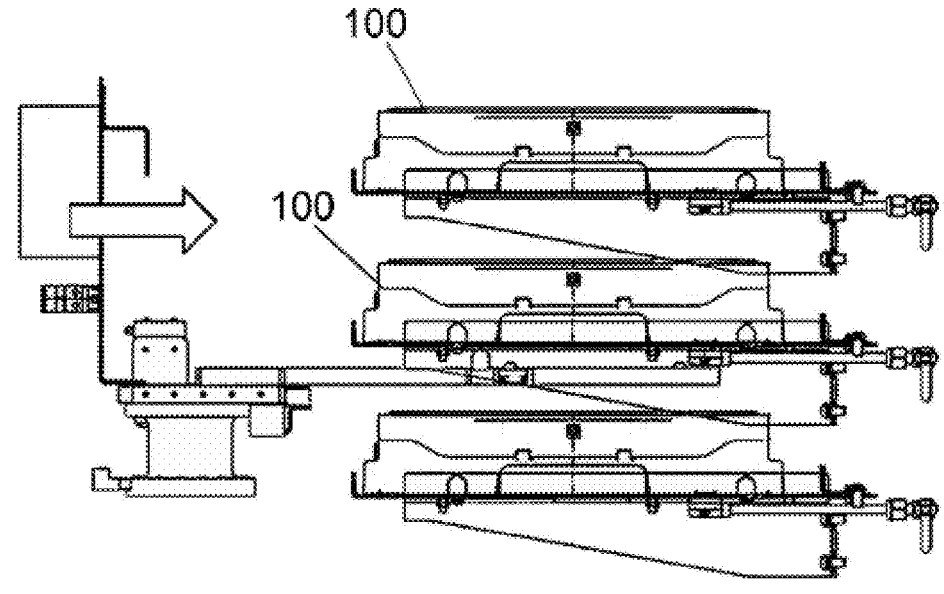
FIG. 28B is a side diagram of a mechanical arm entering below the storage rack and picking up a reticle storage pod.
Figure 28C:
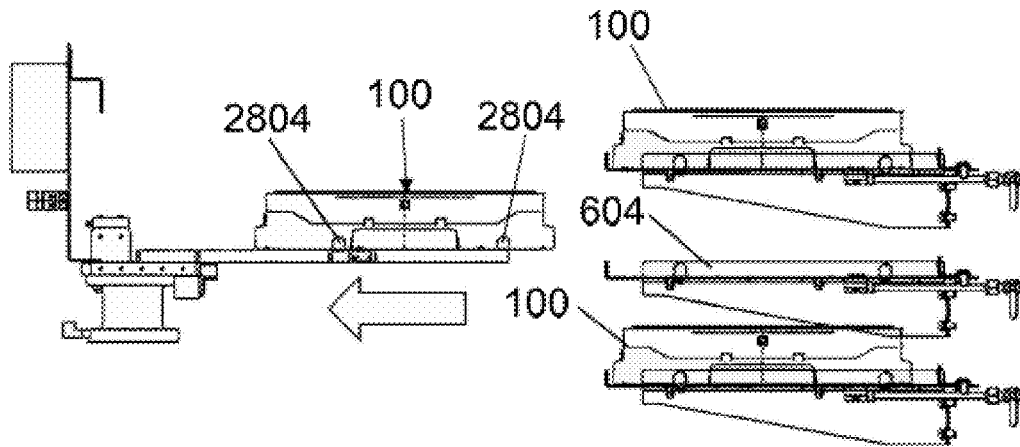
FIG. 28C is a side view of a mechanical arm taking off a reticle storage pod from a storage rack.

FIG. 28C shows a top view of the storage rack (604) and the mechanical arm (609) according to a specific embodiment, wherein the mechanical arm (609) is located below the reticle storage pod (100), and the positioning slot (163) at the bottom portion of the reticle storage pod (100) on the storage rack (604) is indicated by a dotted line. FIG. 28B shows a side diagram of the mechanical arm (609) entering below the storage rack (604) and picking up the reticle storage pod (100). FIG. 28C shows a side view of the mechanical arm (609) taking off the reticle storage pod (100) from the storage rack (604).

The mechanical arm (609) has a front end (2800) and a rear end (2802). The front end (2800) is basically an arrow-shaped tablet, and its carrier surface facing upward has three positioning pins (2804). The three positioning pins (2804) exactly correspond with the inner ends of the positioning slots (163) at the bottom portion of the reticle storage pod (100), and the positioning pins (2808) of the storage rack (604) are correspondingly engaged with the outer ends of the positioning slots (163). In other words, the positioning slots (163) at the bottom portion of the reticle storage pod (100) of the present invention at least extend from a range of the tablet rack of the storage rack (604) to a range of the notch; however, the present invention is not limited to the example above. The rear end (2802) is connected a transmission mechanism, and so the mechanical arm (609) is capable of at least moving horizontally and vertically.

As shown in FIG. 28A and FIG. 28B, when the mechanical arm (609) approaches the reticle storage pod (100), the front end (2802) of the mechanical arm (609) first extends to below the notch of the target storage rack (604), and the positioning pins (2804) of the mechanical arm (609) are aligned with the corresponding positioning slots (163) at the bottom portion of the reticle storage pod (100).

The mechanical arm (609) ascends so that the positioning pins (2804) are engaged with the positioning slots (163) at the bottom portion of the reticle storage pod (100). The mechanical arm (609) continues ascending to lift the reticle storage pod (100) off the storage rack (604), and the ascending height at least exceeds the height of the front end (2600) of the storage rack (604), so as to allow the mechanical arm (609) to withdraw from the storage rack (604), as shown in FIG. 28C.

Once a minimum space for the mechanical arm (609) to access each reticle storage pod (100) is ensured, the height between upper and lower storage racks (604) can be minimized, so as to achieve maximum storage efficiency.

Figure 29:
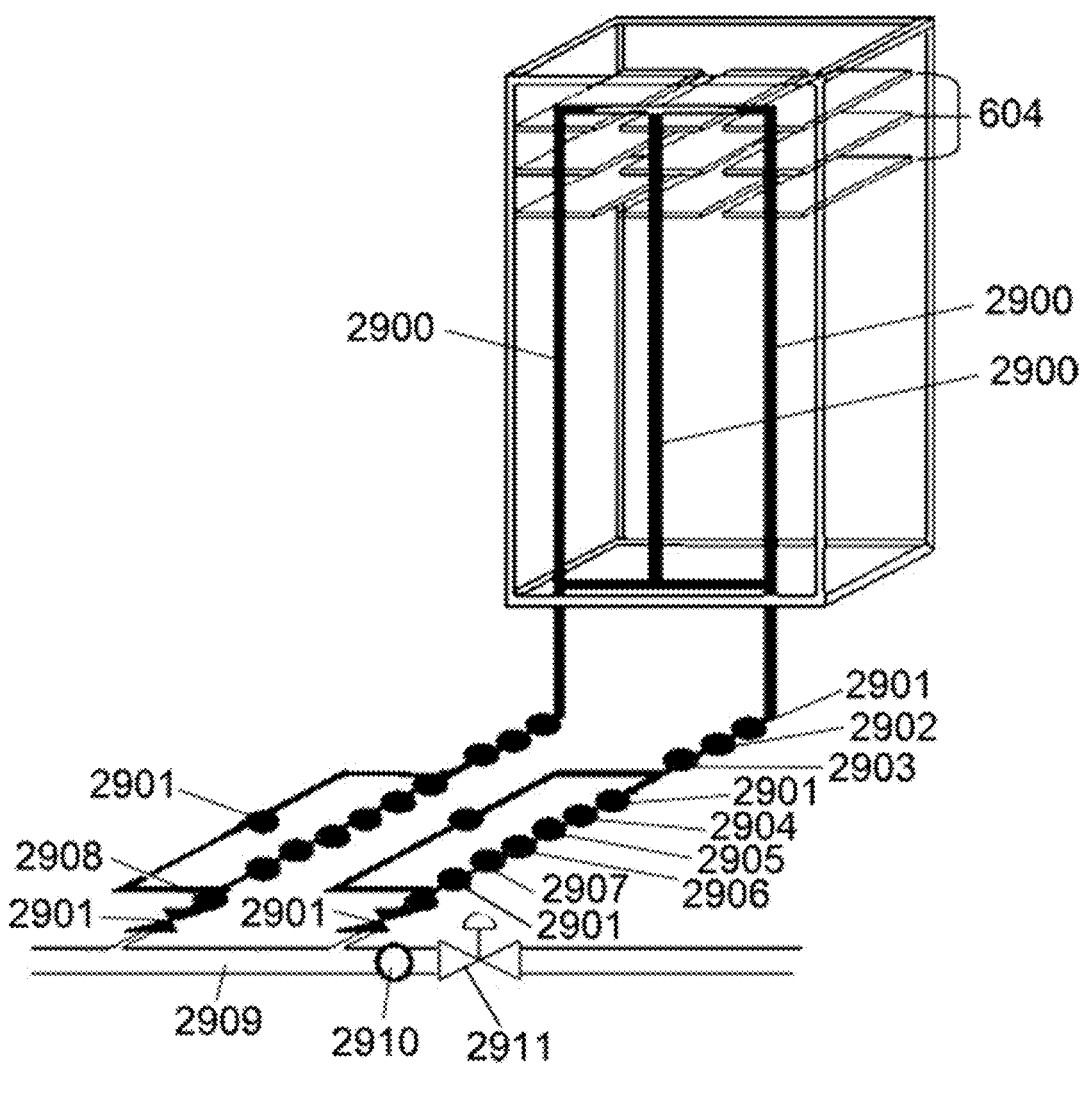
FIG. 29 is a diagram of an upstream air supply pipeline of the storage rack and a mass flow control means thereof.

FIG. 29 shows a diagram of an upstream air supply pipeline (2900) of the storage rack (604) and a mass flow control means thereof. A downstream of the air supply pipeline (2900) is connected to such as the inflation pipeline (2604) in FIG. 26A. Thus, nitrogen can be supplied into the pod via the nozzles (2606) of the storage rack (604) and the two corresponding air valves (162) of the reticle storage pod (100) in FIG. 5C. The other two unconnected air valves (162) of the reticle storage pod (100) discharge the air inside the pod, and so a reticle accommodating space of the reticle storage pod 9100) located on the storage rack (604) has convective gases. The mass flow control means at the upstream of each air supply pipeline (2900) may include a ball valve (2901), a mass flow display (2902), a restrictor valve (2903), a filter (2904), a hydrometer/thermometer (2905), a mechanical pressure gauge (2906), an electronic pressure gauge (2907), a pressure regulator (2908), and a main pipeline (2909) having a pressure gauge (2910) and an air valve (2911); however, the present invention is not limited to the example above.

FIG. 30 shows a diagram of connection to an upstream air supply pipeline of the storage rack (604) according to two specific embodiments. In a configuration having a mass flow controller (3000), one or more sensors provided on the storage rack (604) may transmit detection signals according to whether the reticle storage pod (100) is on the storage rack (604), so that the mass flow controller (3000) accordingly controls the mass flow of gas entering the storage rack (604). For example, nitrogen is supplied when the storage rack (604) has a dedicated pod, and supply of nitrogen is cut off when there is not dedicated pod on the storage rack (604). In a configuration having a needle valve (3002), the mass flow of gas supplied to the storage rack (604) may be manually adjusted, or a state of continuous gas supply can be maintained. Regardless of which type of gas is used, a filter (3001) ensures reduced impurities in the gas.

Figure 31:
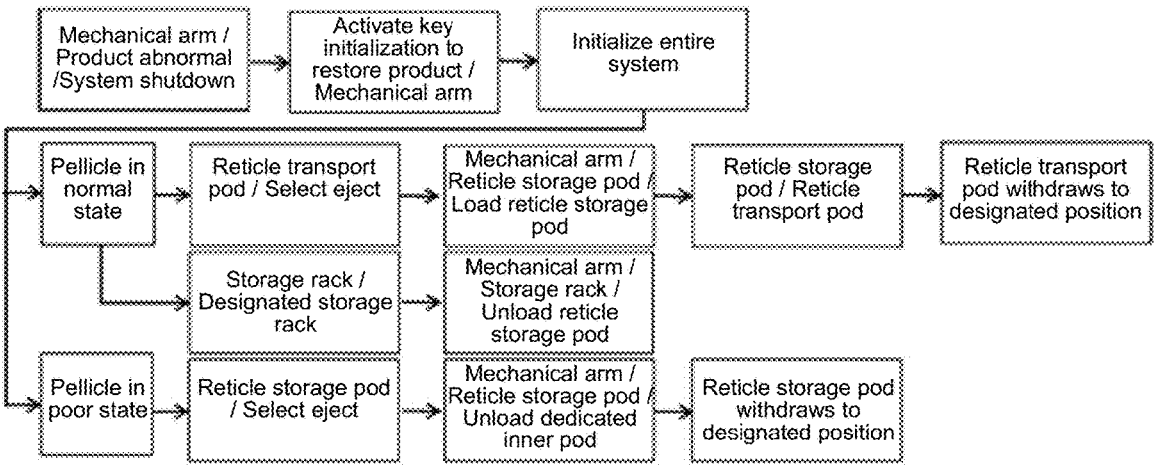
FIG. 31 is an example of an anomaly processing procedure of a mechanical arm of a reticle storage cabinet system.

FIG. 31 shows an example of an anomaly processing procedure of the mechanical arm (609) of the reticle storage cabinet system (600), including checking a state of the pellicle, and selectively prompting a reticle transport pod (non-dedicated pod) or a reticle storage pod (dedicated pod) to perform a predetermined operation according to the state of the pellicle to restore to a designated position.

Figure 32:
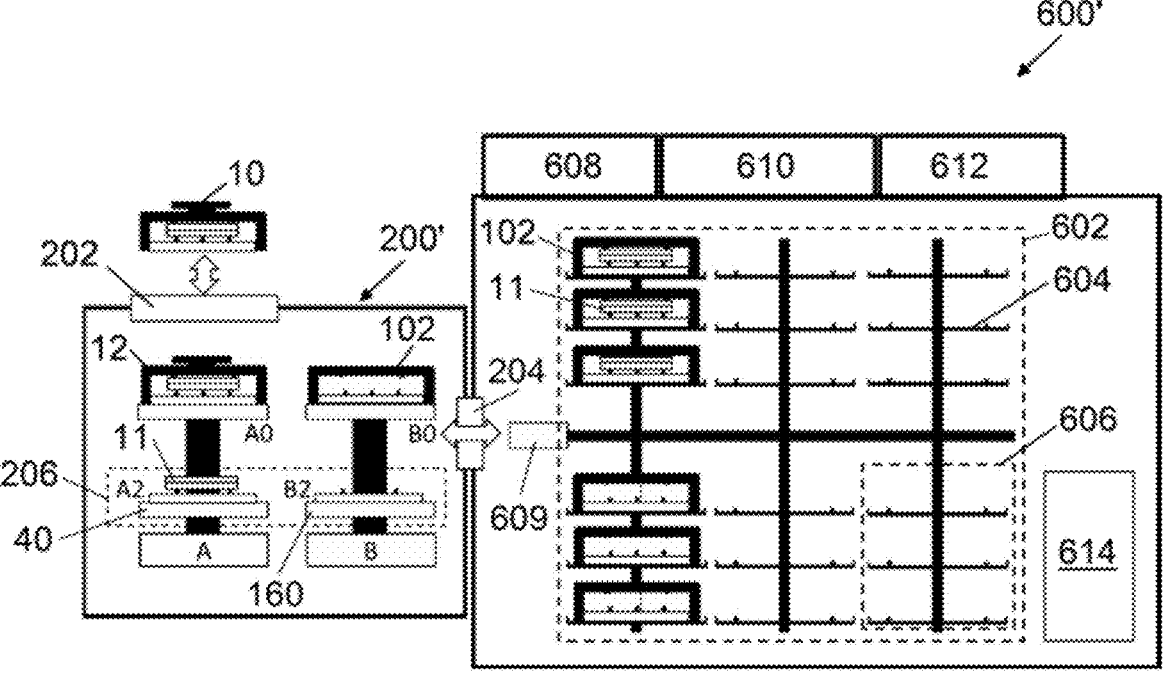
FIG. 32 is a schematic diagram of a reticle loading device and a reticle storage system according to another embodiment of the present invention.

FIG. 32 shows a schematic diagram of a reticle loading device (200') and a reticle storage cabinet system (600') according to another embodiment of the present invention. Each storage rack (604) of the storage cabinet (602) of this embodiment provides only the dedicated outer pod (102) of the dedicated reticle storage pod (100) shown in FIG. 5A, but does not provide the dedicated inner pod (101) of the reticle storage pod (100). However, the dedicated outer pod (102) may accommodate an inner pod obtained from the reticle loading system (200'), that is, the inner pod (11) of the non-dedicated reticle transport pod (10) shown in FIG. 1. Thus, the purpose of the reticle loading system (200') of this embodiment is to transfer an inner pod having a reticle accommodated therein. In addition, the remaining configuration is the same as that of the embodiment in FIG. 24, and the associated details are omitted herein. Details associated with the reticle loading system (200') and the reticle storage cabinet system (600') are to be described shortly.

The reason why the reticle storage cabinet system (600') of this embodiment does not provide a dedicated inner pod is that the dedicated outer pod (102) of the reticle storage pod (100) of the present invention has the hold-down mechanism as shown in FIG. 8A, and is compatible with a non-dedicated inner pod. As shown in FIG. 8A and FIG. 11B, when the dedicated outer pod (102) of the storage cabinet (602) accommodates the non-dedicated inner pod (11), the horseshoe-shaped hold-down rib (153) of the dedicated outer pod (102) surrounds and limits the cap (34), and the hold-down column (154) presses against the hold-down pin (32) on the cover (30) of the inner pod (11), thereby implementing storage of the non-dedicated inner pod (11) and the reticle. One benefit of the above is that, the reticle is not exposed in an environment outside the pod during the transfer process, and so risks of being contaminated by particles are reduced.

Figure 33:
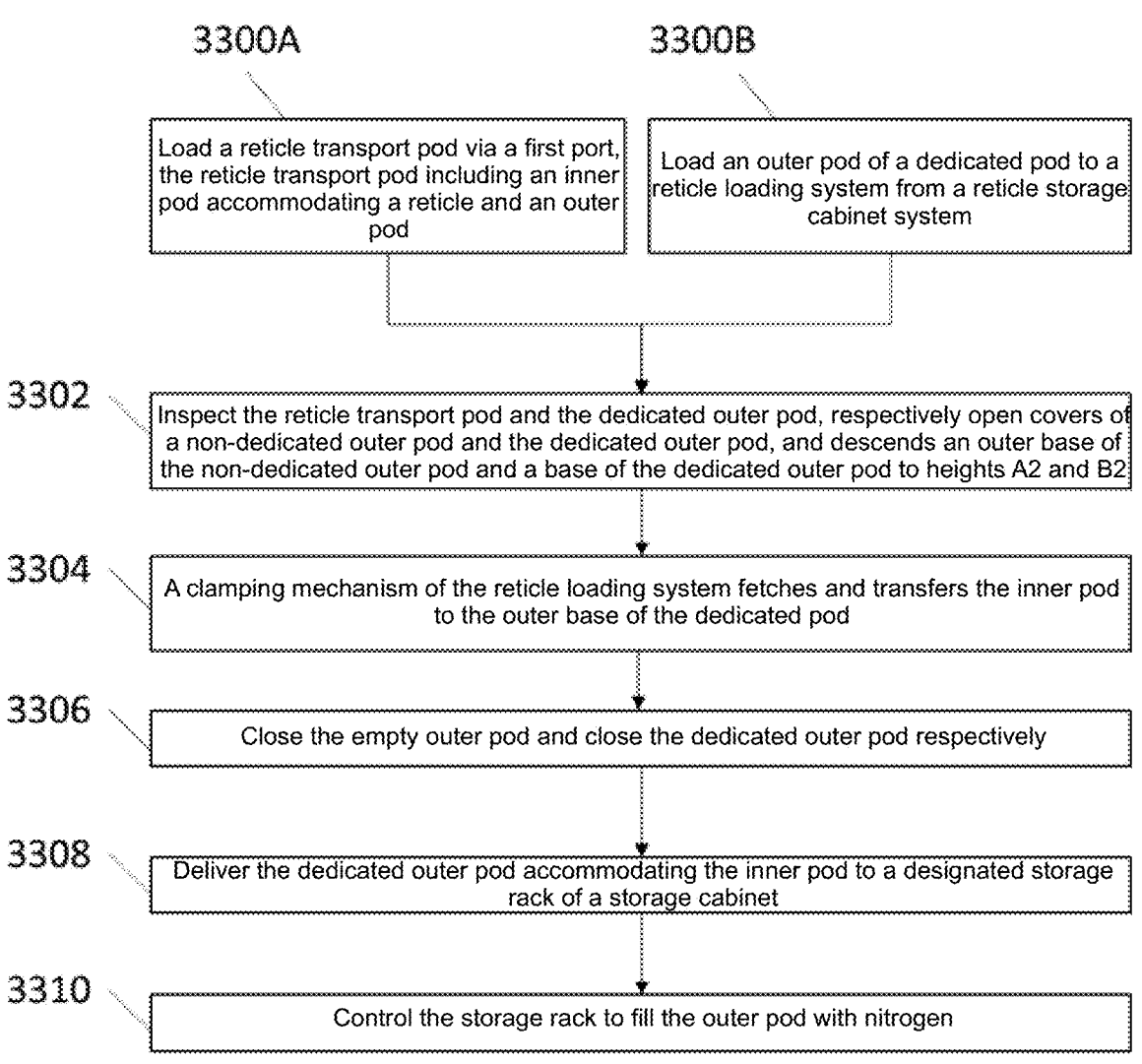
FIG. 33 is a flowchart of loading of a reticle according to the embodiment in FIG. 32.

FIG. 33 shows a flowchart of loading of a reticle according to the embodiment in FIG. 32, wherein the left half is performed by the first lifting means (A) and the right half is performed by the second lifting means (B).

In step 3300A, the reticle transport pod (10) is loaded to the reticle loading system (200') by an OHT system or manually via the first port (202), wherein the reticle transport pod (10) includes the inner pod (11) accommodating the reticle and the outer pod (12). The loaded reticle transport pod (10) is received by the lift of the first lifting means (A) at the height A0.

In step S3300B, the dedicated outer pod (102) is loaded from the reticle storage cabinet system (600') to the reticle loading system (200') via the second port (204), wherein the loaded dedicated outer pod (102) is an empty pod not accommodating any inner pod. Specifically, the mechanical arm (609) of the reticle storage cabinet system (600') places the dedicated outer pod (102) on the lift of the second lifting means (B), that is, at a position of the height B0.

In step 3302, the reticle transport pod (10) and the dedicated outer pod (102) are inspected, for example, identifying information labeled on the pod or in the pod and a state of the pellicle. The lifts of the first lifting means (A) and the second lifting means (B) are respectively descended to the heights A2 and B2. During the descending process, the non-dedicated outer pod (12) and the dedicated outer pod (102) are opened in collateral by means of similar mechanisms. At the heights A2 and B2, the lift of the first lifting means (A) carries only the inner pod (11) of the outer base (40), the lift of the second lifting means (B) carries only the outer base (160) of the dedicated pod, and both are located in the reticle transfer environment (206). It should be understood that, the inner pod (11) does not need to be opened in this embodiment, and so the reticle transfer environment (206) only needs to be satisfy a level of cleanliness for transferring the inner pod. In addition, because the inner pod (11) does not need to be opened to transfer the reticle in this embodiment, compared to the embodiment in FIG. 14, operations associated with the heights A1 and B1 can be omitted for the first lifting means (A) and the second lifting means (B).

In step 3304, the clamp mechanism of the reticle loading system (200') fetches the inner pod (11) and transfers the inner pod (11) onto the outer base (160) of a dedicated pod. The clamp mechanism may be similar to the configuration in FIG. 19A, and is further suitable for the inner pod (11). The operations of the clamp mechanism are similar to those in the description associated with FIG. 20.

In step 3306, once the transfer of the inner pod (11) is complete, the lifts of the first lifting means (A) and the second lifting means (B) ascend to the heights A0 and B0, so that the non-dedicated outer pod (12) is closed in collateral, and the dedicated outer pod (102) is closed in collateral and accommodates the inner pod (11).

In step 3308, the dedicated outer pod (102) accommodating the inner pod (11) is stored on the designated storage rack (604) of the storage cabinet (602). The reticle storage cabinet system (600') may designate the target storage rack (604) according to a shortest movement route of the mechanical arm (609).

In step 3310, the storage rack (604) fills the dedicated outer pod (102) with nitrogen. Similarly, the dedicated outer pod (102) and the storage rack (604) of this embodiment can be configured to those of the embodiments in FIG. 27A and FIG. 27B, so as to implement the filling of a gas.

Figure 34:
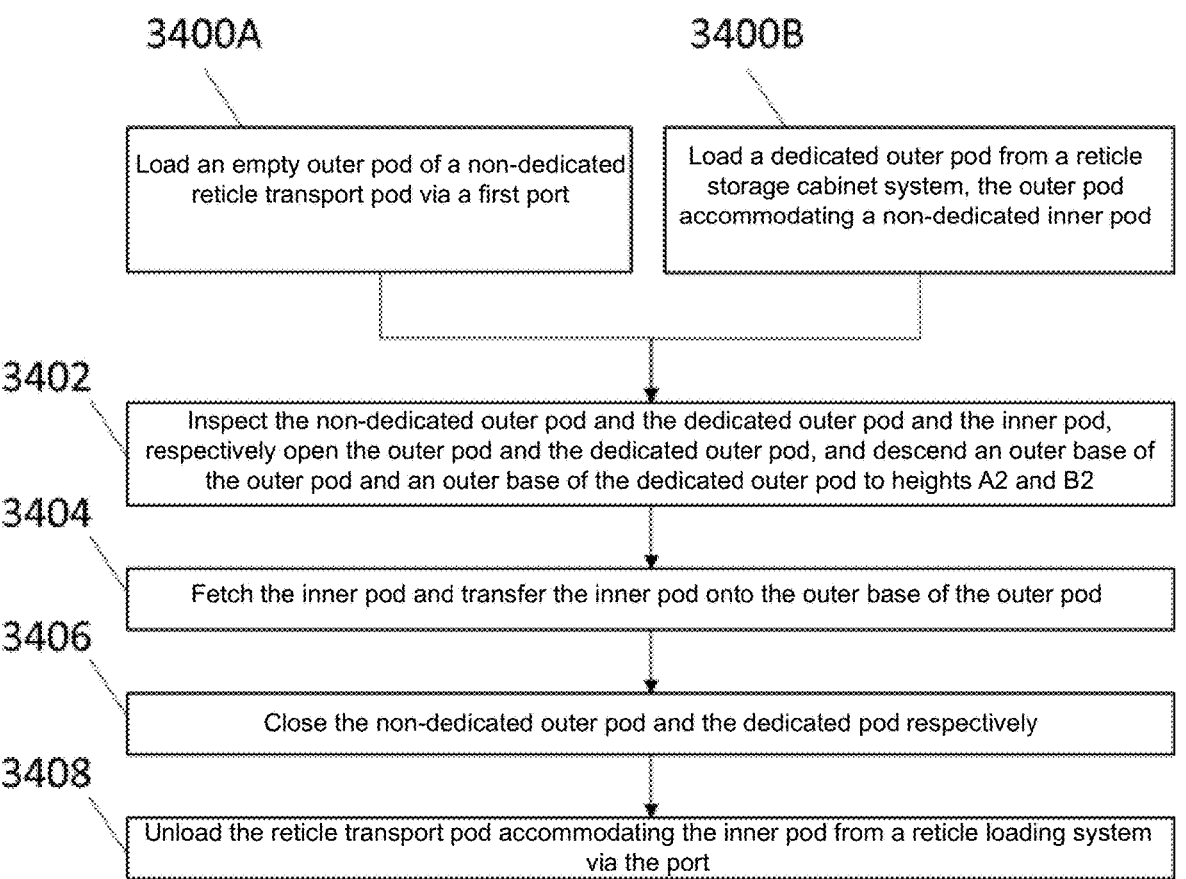
FIG. 34 is a flowchart of unloading of a reticle according to the embodiment in FIG. 32.

FIG. 34 shows a flowchart of unloading a reticle according to the embodiment in FIG. 32, wherein the left half is performed by the first lifting means (A) and the right half is performed by the second lifting means (B).

In step 3400A, the empty outer pod (12) of the non-dedicated transport pod (10) is loaded via the first port (202). The loaded outer pod (12) does not contain any inner pod, and is carried by the lift of the first lifting means (A) at the height A0.

In step 3400B, the dedicated outer pod (102) is loaded from the reticle storage cabinet system (600') via the second port (204), wherein the loaded dedicated outer pod (102) accommodates the inner pod (11) containing a reticle. The loaded dedicated outer pod (102) and the inner pod (11) are carried by the lift of the second lifting means (B) at the height B0.

In step 3402, similarly, the non-dedicated outer pod (12) as well as the dedicated outer pod (102) and the inner pod (11) are inspected by means of the first lifting means (A) and the second lifting means (B). The outer pod (12) and the dedicated outer pod (102) are opened, and the outer base (40) of the outer pod (12) and the outer base (160) of the dedicated outer pod (102) are descended to the heights A2 and B2, so as to locate the inner pod (11) in the reticle transfer environment (206).

In step 3404, the inner pod (11) is fetched and transferred onto the outer base (40) of the outer pod (12). The transfer is performed in the reticle transfer environment (206) or another environment having a level of cleanliness suitable for transferring the inner pod.

In step 3406, the lifts of the first lifting means (A) and the second lifting means (B) are ascended to the heights A0 and B0, so that the non-dedicated outer pod (12) is closed in collateral and accommodates the inner pod (11), and the dedicated outer pod (102) is closed in collateral. At this point, the closed dedicated outer pod (102) is an empty pod, and the non-dedicated inner pod (11) and the outer pod (12) form the reticle transport pod (10).

In step 3408, the first lifting means (A) moves the reticle transport pod (10) out of the reticle loading system (200') via the first port (202), and delivers the reticle transport pod (10) to various processing environments.

FIG. 35 shows a flowchart of transferring the inner pod (11) according to the embodiment in FIG. 32, wherein the left half is performed by the first lifting means (A) and the right half is performed by the second lifting means (B).

In steps 3500A and 3500B, the first lifting means (A) receives the outer pod (12) of the loaded non-dedicated reticle transport pod (10) at the height A0, and the second lifting means (B) receives the dedicated outer pod (102) of the loaded dedicated reticle storage pod (100) at the height B0. Either between the non-dedicated outer pod (12) and the dedicated outer pod (102) accommodates the inner pod (11) having the reticle, and the inner pod (11) is structurally compatible with the non-dedicated outer pod (12) and the dedicated outer pod (102).

In steps 3502A and 3502B, the first lifting means (A) and the second lifting means (B) respectively perform operations to unlock the non-dedicated outer pod (12) and the dedicated outer pod (102). After unlocking, the first lifting means (A) and the second lifting means (B) respectively grasp the outer covers of the non-dedicated outer pod (12) and the dedicated outer pod (102), and the lifts are descended from the heights A0 and B0 to the heights A2 and B2, so that the non-dedicated outer pod (12) and the dedicated outer pod (102) are opened in collateral during the descending process.

In steps 3504A and 3504B, the first lifting means (A) and the second lifting means (B) respectively perform operations to identify information labeled on the non-dedicated outer pod (12), the dedicated outer pod (102), the accommodated inner pod (11) and/or the reticle during the descending process, such as a two-dimensional barcode and a state of a pellicle. If an identification result does not match an expected target, the reticle loading system (200') can perform an associated anomaly processing procedure.

In step 3506, for example, the reticle clamping mechanism (1900) in FIG. 19A transfers the inner pod (11) between the non-dedicated outer base (40) and the dedicated outer base (160). For example, the clamping arms (1906) and the contact plates (1908) of the reticle clamping mechanism (1900) in FIG. 19A may be adaptively modified with respect to dimensions and structure of the inner pod (11), so as to implement transfer of the inner pod (11).

In steps 3508A and 3508B, the first lifting means (A) and the second lifting means (B) respectively perform operations to ascend the lifts from the heights A2 and B2 to the heights A0 and B0, so that the non-dedicated outer pod (12) and the dedicated outer pod (102) are closed in collateral, and further lock the two.

In steps 3510A and 3510B, the empty non-dedicated outer pod (12) or the reticle transport pod (10) having the inner pod (11) may be moved out of the reticle loading system (200') via the first port (202), while the empty dedicated outer pod (102) or the dedicated outer pod (102) accommodating the non-dedicated inner pod (11) may be returned to the reticle storage cabinet system (600') via the second port (204).

Figure 36:
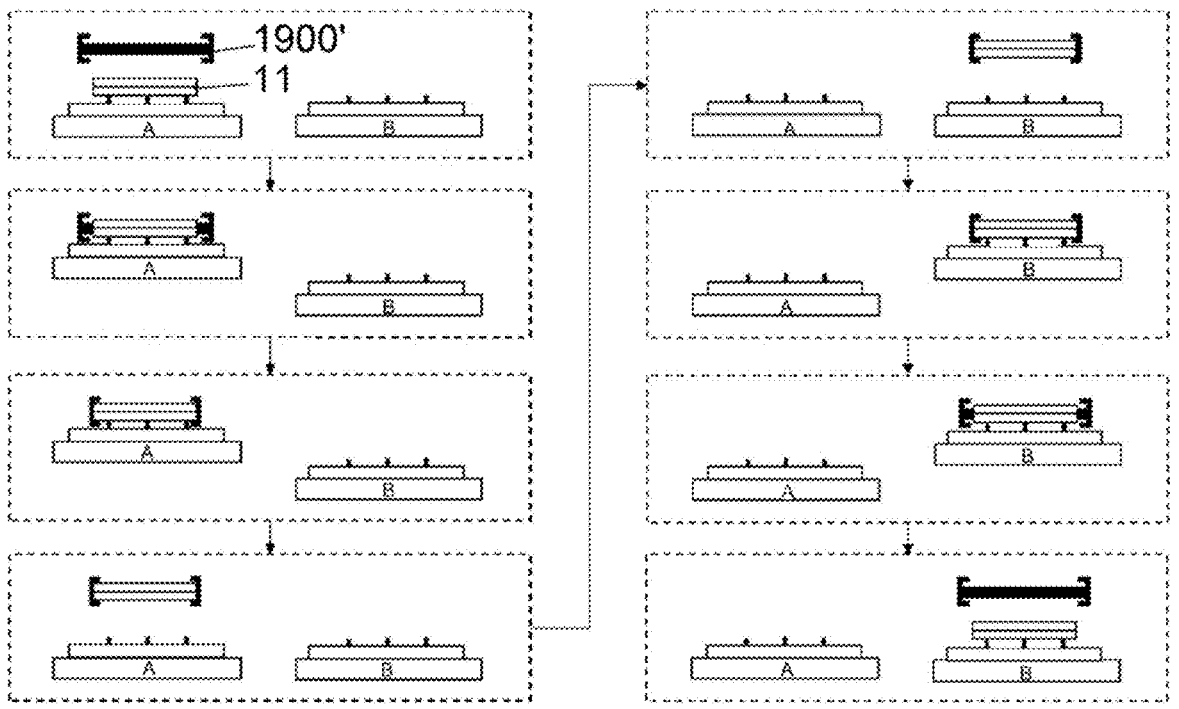
FIG. 36 is a flowchart of transferring an inner pod.

FIG. 36 shows a flowchart of transferring the inner pod (11). In this period, the operations of the first lifting means (A) and the second lifting means (B) are performed in the reticle transfer environment (206) or another environment satisfying a required level of cleanliness.

As shown in the drawing, the lifts both descend to below a reticle clamping mechanism (1900'). The clamping mechanism (1900') moves horizontally to above the inner pod (11). When the inner pod clamping mechanism (1900') does not ascend or move, the lift of the first lifting means (A) ascends to a height at which the inner pod (11) can be clamped. Once the inner pod (11) is clamped, the lift descends to complete the separation. The inner pod (11) is horizontally moved to the lift of the second lifting means (B). The lift of the second lifting means (B) ascends to carry the inner pod (11), and the at same time the reticle clamping mechanism (1900') releases to implement transfer of the inner pod (11).

Figure 37:
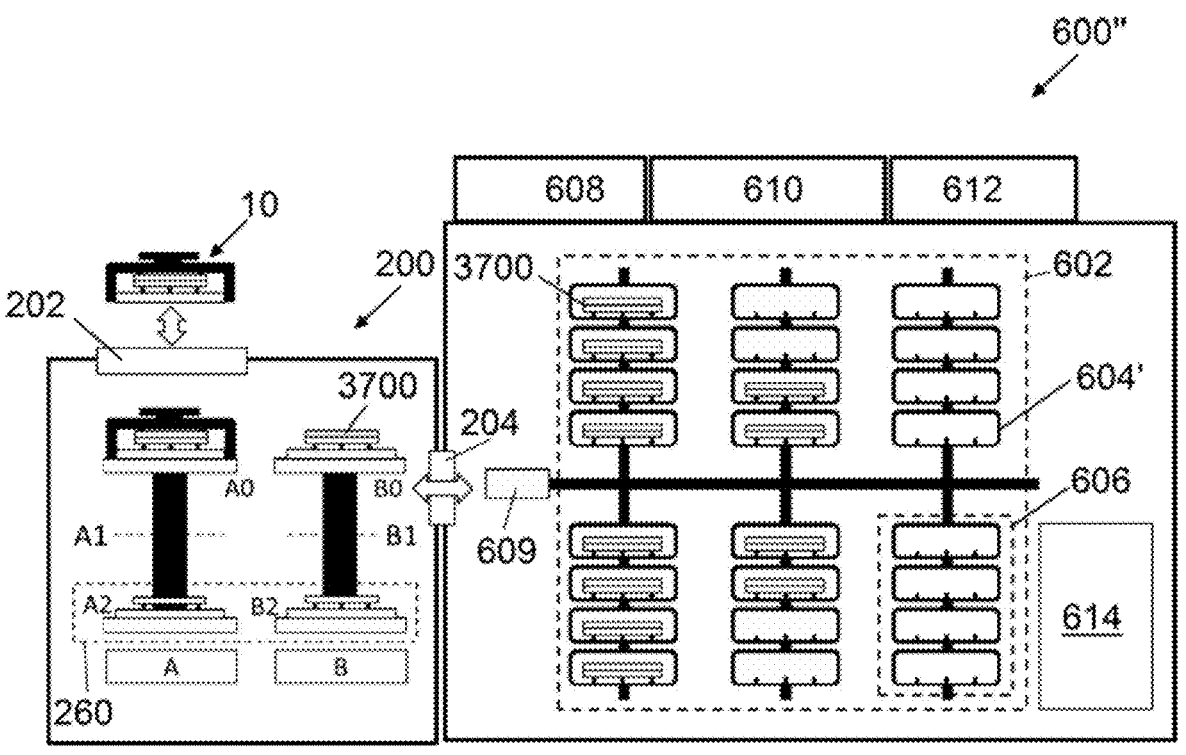
FIG. 37 is a schematic diagram of a reticle loading device and a reticle storage system according to another embodiment of the present invention.

FIG. 37 shows a schematic diagram of the reticle loading device (200) and a reticle storage cabinet system (600'') according to another embodiment of the present invention, wherein the configuration of the reticle storage cabinet system (600'') is substantially the same as that in the foregoing embodiments, and primarily differs in that the storage cabinet (602) provides a plurality of storage chambers (604'). Each storage chamber (604') may store a dedicated dual pod, as the reticle storage pod (100) shown in FIG. 5A. Alternatively, each storage chamber (604') may store a single pod (3700). Such single pod (3700) primarily consists of a cover and a base, and is for accommodating a reticle obtained from the reticle transport pod (10).

Figure 38A:
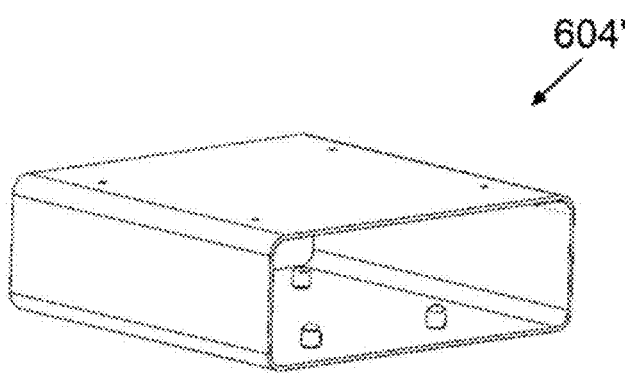
FIG. 38A is a diagram of a storage chamber according to a specific embodiment of the present invention.
Figure 38B:
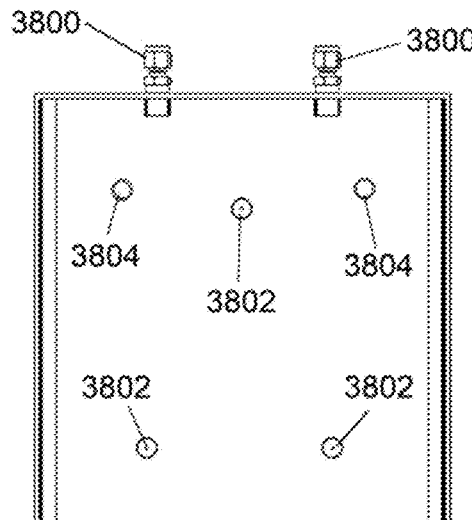
FIG. 38B is a diagram of a configuration of an upward facing carrier surface on an inner side of a storage chamber.
Figure 38C:
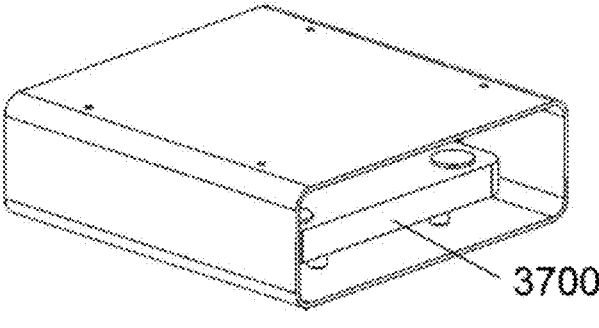
FIG. 38C is a diagram of a single pod in a storage chamber.
Figure 38D:
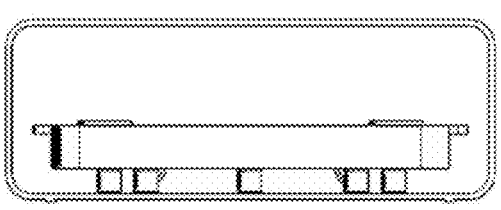
FIG. 38D is a diagram of a carrier surface mechanism of a storage chamber supporting a bottom portion of a single pod.

FIG. 38A shows a diagram of the storage chamber (604') according to a specific embodiment of the present invention. FIG. 38B shows a diagram of a configuration of an upward facing carrier surface on an inner side of the storage chamber (604'). FIG. 38C shows a diagram of the single pod (3700) included in the storage chamber (604'). FIG. 38D shows a diagram of a carrier surface mechanism of the storage chamber (604') supporting a bottom of the single pod (3700).

These storage chambers (604') may be fixed on a frame of the storage cabinet (602) by similar means so as to establish a vertical stacked form. Each storage chamber (604') is basically a pod having an opening, and provides a storage space sufficient for accommodating the single pod (3700). The opening allows the mechanical arm (609) to access the single pod (3700). The storage chamber (604') has its back surface provided with two connectors (3800), and its upstream connected to a nitrogen source to thereby fill the storage chamber (604') with nitrogen. The upward facing carrier surface on the inner side of the storage chamber (604') is provided with three kinematic coupling pins (3802) and two auxiliary guide pins (3804) for positioning and supporting the single pod (3700). In another embodiment, the opening of the storage chamber (604') may be provided with a valve, so as to prevent the single pod (3700) from falling off and maintain the nitrogen condition in the storage chamber (604').

Figure 39A:
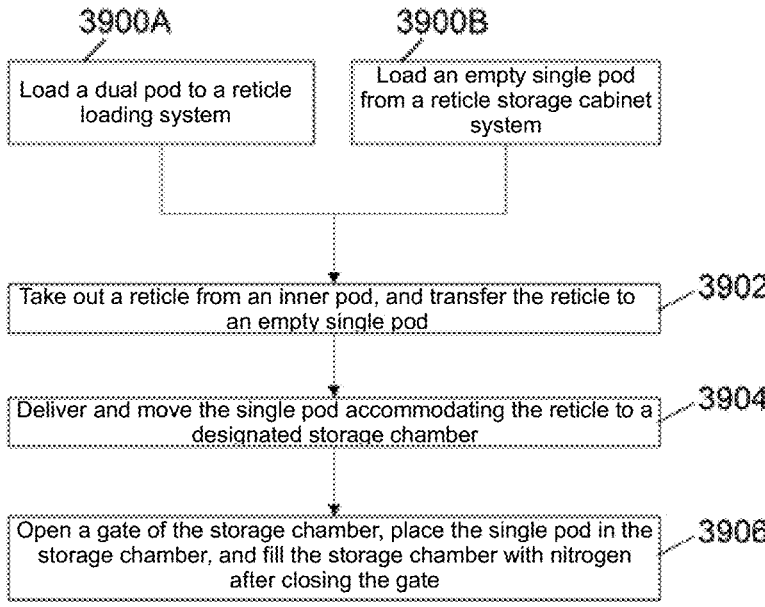
FIG. 39A is a flowchart of loading a reticle according to the embodiment in FIG. 37.
Figure 39B:
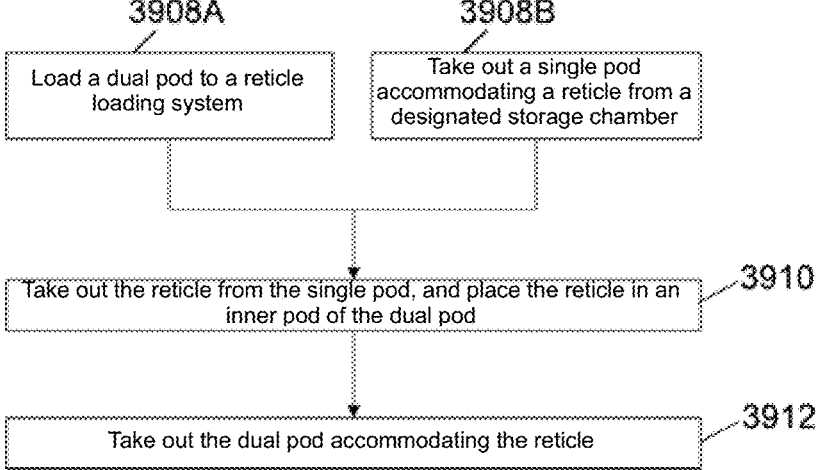
FIG. 39B is a flowchart of unloading a reticle according to the embodiment in FIG. 37.

FIG. 39A shows a flowchart of loading a reticle according to the embodiment in FIG. 37. FIG. 39B shows a flowchart unloading of a reticle according to the embodiment in FIG. 37.

In step 3900A, a dual pod is loaded onto the lift of the first lifting means (A) of the reticle loading system (200) via the first port (202), wherein the reticle transport pod (10)

includes the inner pod accommodating a reticle and the outer pod accommodating the inner pod.

In step 3900B, an empty single pod (3700) is loaded from the reticle storage cabinet system (600") onto the lift of the second lifting means (B) via the second port (204).

In step 3902, the reticle accommodated in the inner pod of the reticle transport (10) is taken out and transferred to the empty single pod. Similar to the embodiment in FIG. 24, the outer pod and the inner pod are opened in collateral to expose the reticle during the descending process of the lift of the first lifting means (A) from the height A0 to the height A2, and the single pod (3700) is opened in collateral to expose the inner base during the descending process of the lift of the second lifting means (B) from the height B0 to the height B2. Next, the reticle clamping mechanism transfers the reticle from the inner pod base of the reticle transport pod (10) onto the base of the single pod (3700). Lastly, the lift of the second lifting means (B) ascends from the height B2 to the height B0, so as to accommodate in collateral the reticle in the single pod (3700).

In step 3904, the single pod (3700) accommodating the reticle is transported from the reticle loading system (200) to the reticle storage cabinet system (600") and is moved according to the designated storage chamber (604') of the storage cabinet (602). Preferably, the designated storage chamber (604') is determined by a shortest route of the mechanical arm (609).

In step 3906, the mechanical arm (609) opens a gate of the storage chamber (604') and places the single pod (3700) in the storage chamber (604'). The storage chamber (604') is filled with nitrogen after closing the gate to complete storage of the reticle. In an embodiment without the gate, the mechanical arm (609) is not required to open the gate. The gate may be replaced by continuously filling by nitrogen.

In step 3908A, the empty dual pod (for example, the reticle transport pod (10)) or the empty single pod (3700) is loaded to the lift of the first lifting means (A) of the reticle loading system (200).

In step 3908B, the mechanical arm (609) takes out the single pod (3700) accommodating the designated reticle from the designated storage chamber (604') and loads the single pod (3700) to the lift of the second lifting means (B) of the reticle loading system (200).

In step 3910, the first lifting means (A) and the second lifting means (B) respectively descends the inner pod base of the reticle transport pod (10) and the reticle of the single pod (3700) to the reticle transfer environment (206), so as to transfer the reticle in the single pod to the reticle transport pod (10).

In step 3912, the reticle transport pod (10) accommodating the reticle is taken out via the first port (204) by the OHT system and forwarded to a destination station.

FIG. 40 shows a specific flowchart of unloading a reticle according to the embodiment in FIG. 37, wherein the left half is steps performed by the first lifting means (A) and the right half is steps performed by the second lifting means (B). In step 4000A, a dual pod (for example, the reticle transport pod (10)) is loaded to the lift of the first lifting means (A) via the first port (202). In step 4000B, a single pod (3700) is loaded from the reticle storage cabinet system (600") to the lift of the second lifting means (B). In step 4002A, the cover of the outer pod is grasped, the outer pod is unlocked, and the lift of the first lifting means (A) is descended from the height A0 to the height A1. In step 4002B, the cover of the single pod (3700) is grasped at the height B0 or B1, and the lift carrying the base of the single pod (3700) is descended from the height B0 to the height B1. In step 4004A, the lift carrying the base of the inner pod is descended from the height A1 to the height A2. In step 4004B, the lift carrying the base of the single pod (3700) is descended from the position B1 to the position B2. In step 4006, the reticle clamping mechanism transfers the reticle between the base of the inner pod and the base of the single pod (3700). In step 4008A, the inner pod is closed in collateral once the lift ascends from the height A2 to the height A1. In step 4008A, the single pod (3700) is closed in collateral once the lift ascends from the position B2 to the position B1. In step 4010A, the outer pod is closed in collateral and locked once the lift ascends from the height A1 to the height A0. In step 4010B, the lift ascends from the position B1 to the position B0. In step 4012A, the dual pod is taken out from the OHT system. In step 4012B, the single pod (3700) returns to the reticle storage cabinet system (600").

Regardless of whether a reticle is eventually stored by a single pod or a dual pod, the storage environment is critical for storage of the reticle. A storage chamber having a gate is beneficial for maintaining conditions of a storage environment. It should be noted that the operation options of the gate are also limited by an internal configuration of a cabinet system. An example of an operation mechanism for a gate of a storage chamber of a cabinet system of the present invention is given below.

FIG. 41A shows an example of an interaction process of mechanical arms (4100 and 4102) and a storage chamber (4104) to place a pod (P) to the storage chamber (4104). FIG. 41B shows an example of an interaction process of the mechanical arms (4100 and 4102) and the storage chamber (4104) to take out a pod (P) from the storage chamber (4104). The storage chamber (4104) shown has a gate, and a front end (4102) of the mechanical arm can be configured to interact with the gate of the storage chamber (4104). For example, the front end (4102) of the mechanical arm may have a predetermined mechanism for extending into a notch at a bottom portion of the gate and to lift open the gate to expose a space of the storage chamber (4104); however, the present invention is not limited to the example above. More specifically, the mechanical arm can consist of at least two parts; one of which is a grasp mechanism (41000 and the other is an interaction mechanism (4102) for the gate, and the two are operable independently. As shown in FIG. 41A, a part of the mechanical arm first lifts open the gate, and the other part then places the pod (P). Once having completed the placing, the gate is restored to a closed state. The process in FIG. 41B is in reverse.

Figure 42B:
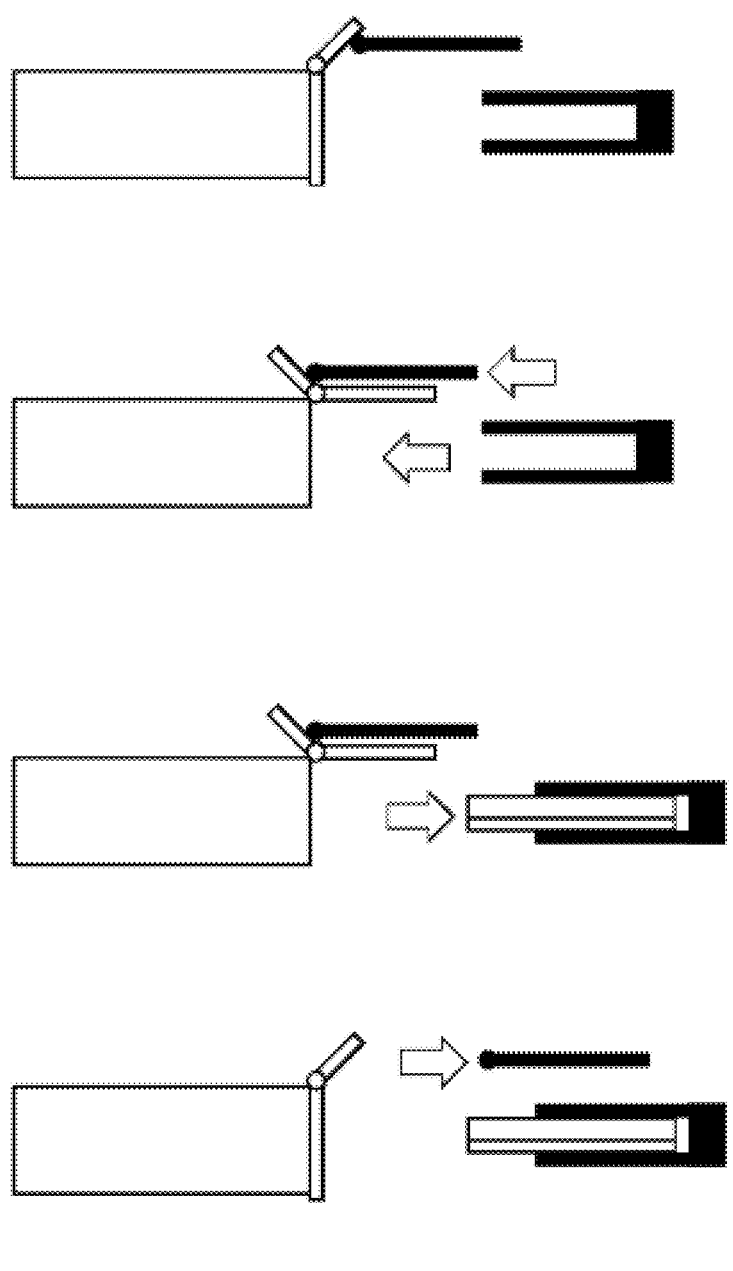
FIG. 42B is an example of a mechanical arm and a storage chamber of a cabinet system to take out a pod from the storage chamber according to another interaction embodiment.

FIG. 42A shows an example of a mechanical arm and a storage chamber of a cabinet system to place a pod to the storage chamber according to another interaction embodiment. FIG. 42B shows an example of a mechanical arm and a storage chamber of a cabinet system to take out a pod from the storage chamber according to another interaction embodiment. The mechanical arm of this embodiment includes two independent parts, that is, a grasp portion (4200) and a push portion (4202). The grasp portion (4200) is for carrying or clamping a pod (P), and can access the space of the storage chamber (4204). The storage chamber (4204) has a pivotal gate (4206). The push portion (4202) can extend forward relative to the grasp portion (4200) so as to push a plate (4208) on the gate (4206), so that the gate (4206) is lifted open in a leveraged manner to allow the grasp portion (4200) to forward the pod (P) into the storage chamber (4204). After completing the above, the push portion (4208) then recedes to allow the gate (4206) to be restored to a closed state.

Figure 43:
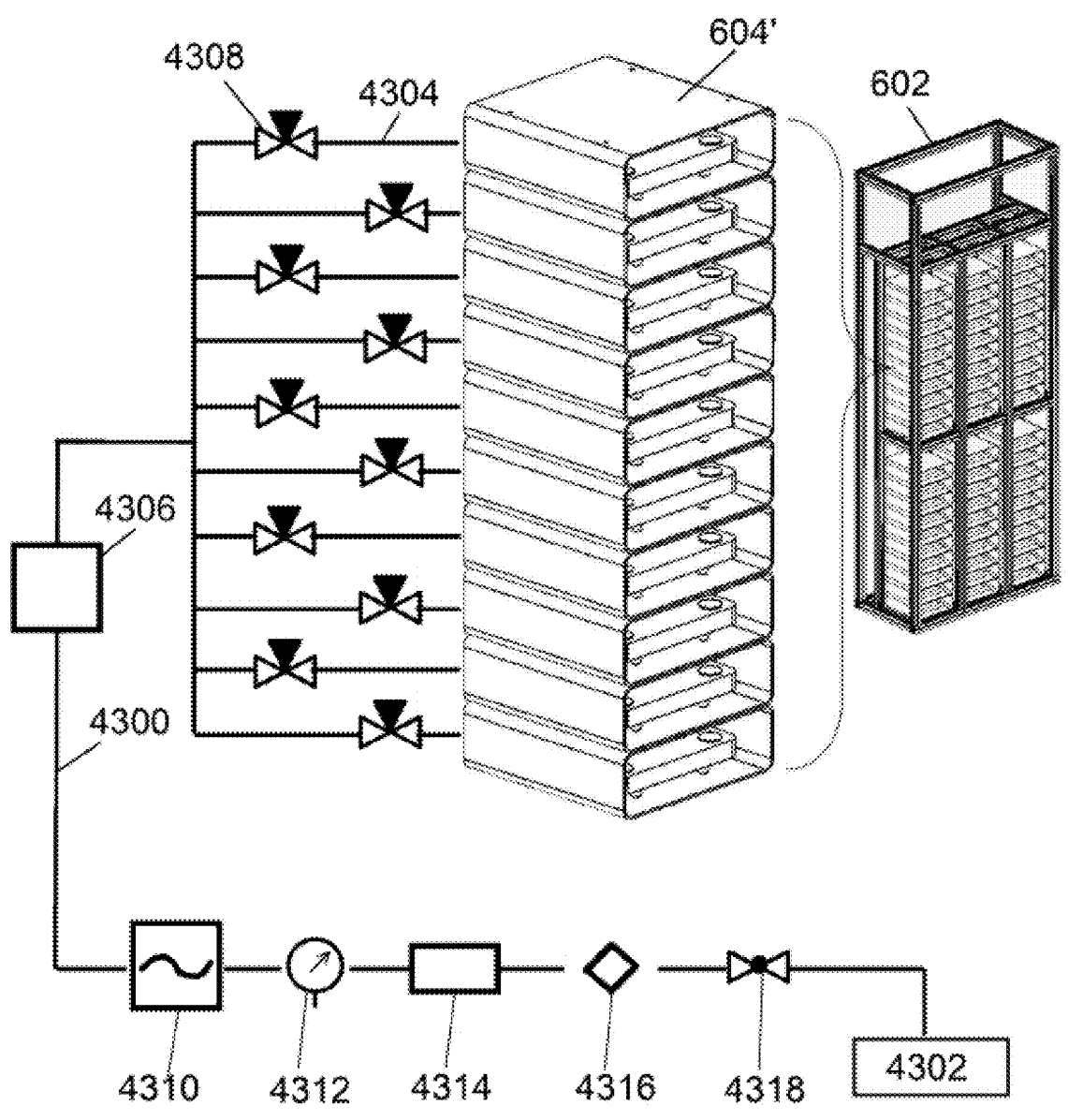
FIG. 43 is a schematic diagram of a reticle storage cabinet pipeline inflation system according to an embodiment of the present invention.

FIG. 43 shows a schematic diagram of a reticle storage cabinet pipeline inflation system according to an embodiment of the present invention. At least one main pipeline (4300) has an upstream connected to a nitrogen source (4302) and a downstream connected to a plurality of branch pipelines (4304). Each of the branch pipelines (4304) is connected to one corresponding storage chamber (604') in the storage cabinet (602). At least one mass flow controller (4306) is connected to the main pipeline (4300). When a reticle pod is placed in a designated in a storage chamber (604') of the storage cabinet (602), the mass flow controller (4306) accordingly determines opening/closing of a predetermined valve so as to fill a designated storage chamber (604') with nitrogen. For example, the mass flow controller (4306) may be configured to monitor the mass flow of a gas of the main pipeline (4306), and control opening/closing of a regulator valve (4308) on each branch pipeline (4304), wherein the regulator valve (4308) can be used to regulate a flow speed of a gas of each branch pipeline (4304). As shown in the drawing, an upstream end of the main pipeline (4300) may include a particle filter (4310), a pressure gauge (4312), a pressure sensor (4314), a regulator (4316) and a ball valve (4318); however, the present invention is not limited to the example above.

Figure 44:
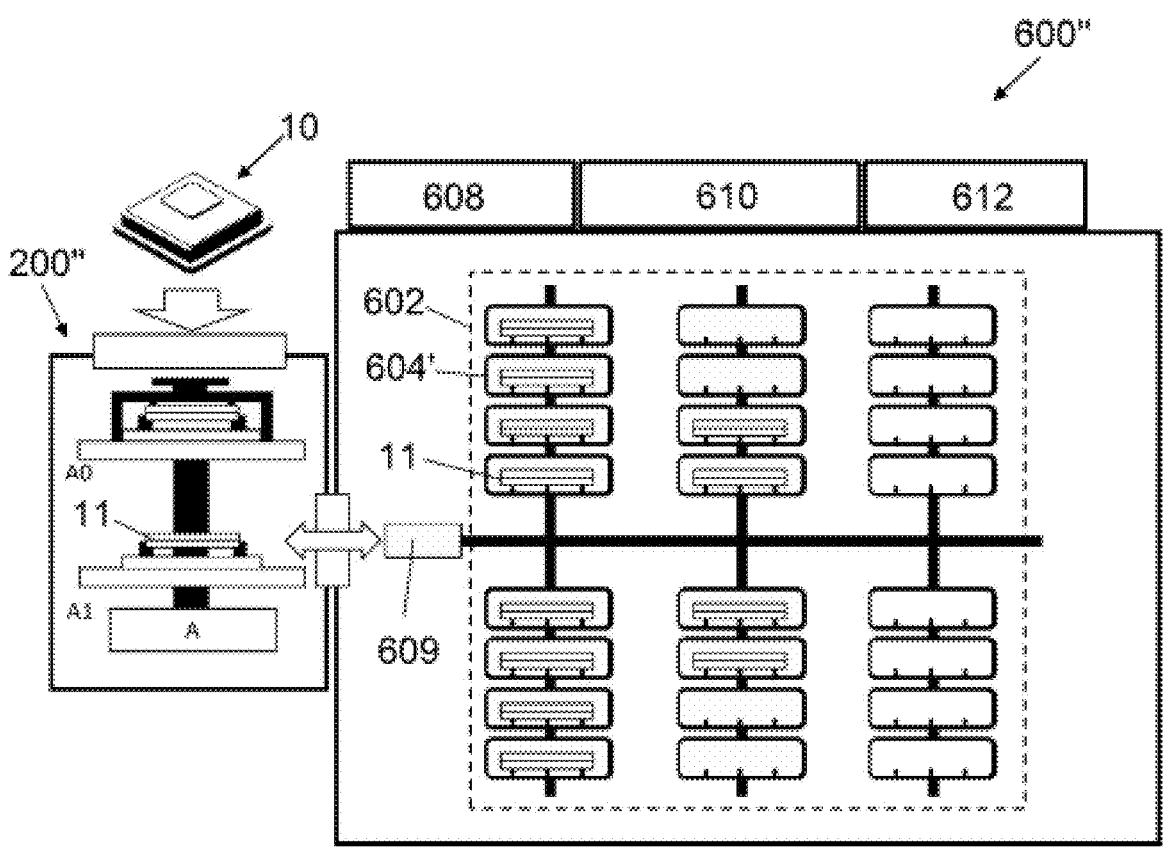
FIG. 44 is a schematic diagram of a reticle loading device and a reticle storage system according to another embodiment of the present invention.

FIG. 44 shows a schematic diagram of a reticle loading system and a reticle storage cabinet system according to another embodiment of the present invention. Compared to the foregoing embodiments, it is seen that a reticle loading system (200") of this embodiment implements transfer of a reticle by only one lifting means (A). Similarly, the reticle transport pod (10) is opened during the descending process from the height A0 to the height A1, and the inner pod (11) is eventually exposed. The inner pod (11) at the height A1 is allowed to interact with the mechanical arm (609) and is thus clamped, so that the route for transfer of a reticle is further shortened, thus reducing risks of swaying the reticle.

FIG. 45A shows a flowchart of loading a reticle according to the embodiment in FIG. 44. FIG. 45B shows a flowchart unloading of a reticle according to the embodiment in FIG. 44. In step 4500, a dual pod (for example, the reticle transport pod (10)) is loaded to the lift, wherein the dual pod includes the inner pod (11) accommodating a reticle and an outer pod accommodating the inner pod (11). In step 4502, the inner pod of the dual pod is exposed at the height A1, that is, the reticle transfer environment. In step 4504, the inner pod (11) is transported to a designated storage chamber (604') of the storage cabinet (602). In step 4506, the gate of the designated storage chamber (604') is opened to place in the inner pod (11), and the storage chamber (604') is filled with nitrogen after closing the gate, thus completing the storage. In step 4508, an outer pod (for example, the outer pod (12) in FIG. 1) of a dual pod is loaded to the lift, wherein the outer pod includes a cover and a base. In step 4510, the lift descends to open the outer pod in collateral, and the base is placed at the height A1. In step 4512, the inner pod (11) accommodating the reticle is taken out from the designated storage chamber (604') of the storage cabinet (602), and the inner pod is unloaded and placed on the base located at the height A1. In step 4514, the lift ascends to close the dual pod in collateral and lock the dual pod. In step 4516, the dual pod is taken out.

FIG. 46A shows another flowchart of loading a reticle according to the embodiment in FIG. 44. FIG. 46B shows another flowchart of unloading a reticle according to the embodiment in FIG. 44. In step 4600, a dual pod is loaded to the lift via a port, wherein the dual pod includes an inner pod (11) and an outer pod accommodating the inner pod. In step 4602, the cover of the outer pod is grasped, and the lift carrying the inner pod (11) and the base of the outer pod is descended from the height A0 to the height A1, thereby opening the outer pod in collateral. In step 4604, while the lift descends from the height A0 to the height A1, a two-dimensional barcode on the inner pod (11) is read and a state of a pellicle is identified by an identification means. In step 4606, a mechanical arm of the cabinet system (600") takes away the inner pod (11) carried by the base of the outer pod, such that only the outer pod of the dual pod remains on the reticle loading system (200"). In step 4608, the outer pod of the dual pod is closed in collateral and is locked while the lift ascends from the height A1 to the height A0. In step 4610, the outer pod of the dual pod is taken out via the port. In step 4612, the outer pod of a dual pod is loaded to the lift via the port, so as to receive an inner pod (11) in the reticle storage cabinet system (600"). In step 4614, the cover of the outer pod is grasped, and the lift carrying the base of the outer pod is descended from the height A0 to the height A1, thereby opening the outer pod in collateral. In step 4616, the mechanical arm of the reticle storage cabinet system (600") places a designated inner pod (11) on a base of the outer pod of the lift. In step 4618, while the lift ascends from the height A1 to the height A0, a two-dimensional barcode on the inner pod (11) is read and a state of a pellicle is identified by an identification means. In step 4620, the dual pod is closed in collateral and locked once the lift ascends from the height A1 to the height A0. In step 4622, the dual pod is taken out via the port.

What is claimed is:

1. A reticle storage cabinet system, comprising:
    a storage cabinet, including multiple storage racks, each of the multiple storage racks being adapted for carrying a dedicated reticle storage pod; and
    a mechanical arm, configured to cooperate with the storage cabinet to move said dedicated reticle storage pod;
    wherein said dedicated reticle storage pod is dedicated for storage and movement within the storage cabinet;
    wherein the storage cabinet includes a buffer zone which is configured for placement of one or more cleaned or used dedicated reticle storage pods;
    wherein each of the multiple storage racks is a tablet rack having a front end and a rear end, the front end of the storage rack has a notch configured to cooperate with a front end of the mechanical arm, the rear end of the storage rack has a stop portion configured to restrict one side of said dedicated reticle storage pod, and the stop portion has an identifiable information configured to be read during an interaction between a front end of the mechanical arm and the storage rack.

2. The reticle storage cabinet system according to claim 1, further comprising:
    a port, configured to connect with a reticle loading system.

3. The reticle storage cabinet system according to claim 1, further comprising:
    a cleaning device, configured to be adjacent the buffer zone.

4. The reticle storage cabinet system according to claim 1, further comprising:
    a management means, configured to manage reticle information and detect the temperature and humidity of the storage cabinet.

5. The reticle storage cabinet system according to claim 1, further comprising:
    a gas control means configured to control a supply of non-reactive gas to said storage rack.

6. A reticle storage cabinet system, adapted to store one or more dedicated reticle storage pod, the system comprising:

a storage rack, configured to carry a dedicated reticle storage pod, and being a tablet rack having a front end and a rear end;

wherein the front end of the storage rack has a notch configured to cooperate with a front end of a mechanical arm;

wherein the rear end of the storage rack has a stop portion configured to restrict one side of said dedicated reticle storage pod, and the stop portion has an identifiable information configured to be read during an interaction between a front end of the mechanical arm and the storage rack.

7. The reticle storage cabinet system according to claim 6, wherein an upward surface of the storage rack has multiple coupling pins for coupling a bottom of said dedicated reticle storage pod so as to position said dedicated reticle storage pod on the storage rack.

8. The reticle storage cabinet system according to claim 6, wherein an upward surface of the storage rack has multiple nozzles for connecting with a bottom of said dedicated reticle storage pod so as to supply a non-reactive gas to said dedicated reticle storage pod.

9. The reticle storage cabinet system according to claim 7, wherein the storage rack has a pair of connection arms, and the storage rack is positioned in a space via the pair of connection arms.

10. A reticle storage cabinet system, adapted to store one or more dedicated reticle storage pod which is a single pod, the system comprising:

a storage chamber, being a pod having an opening for accommodating a single pod composed of a cover and a base;

wherein an upward surface of the storage chamber has multiple kinematic coupling pins;

wherein the storage chamber has multiple connectors for connecting the storage chamber to a non-reactive gas source.

11. The reticle storage cabinet system according to claim 10, wherein the opening of the storage chamber is provided with a gate operable with a front end of a mechanical arm to open, and when the gate is opened, the storage chamber allows an access of a grasp mechanism of the mechanical arm to the single pod accommodated therein.

12. The reticle storage cabinet system according to claim 11, wherein the gate has a plate operable with the front end of the mechanical arm to open the gate, and when the gate is opened, the storage chamber allows the access of the grasp mechanism of the mechanical arm to the single pod accommodated therein.

13. A method for loading reticle, comprising:

providing a reticle storage cabinet system having a storage cabinet including a plurality of storage racks adapted to store one or more dedicated reticle storage pods, said dedicated reticle storage pod dedicated for the storage and movement in the storage cabinet;

retrieving, by a mechanical arm, an empty dedicated reticle storage pod from one of the plurality of storage racks of the storage cabinet, and moving the empty dedicated reticle storage pod out of the reticle storage cabinet system, such that the empty dedicated reticle storage pod outside the system receives a reticle; and receiving and storing, by the mechanical arm, the dedicated reticle storage pod with the reticle contained therein to a vacant spot of the storage cabinet;

wherein one of the plurality of storage racks is a tablet rack or a storage chamber;

wherein the storage rack being the tablet rack has a front end and a rear end, the front end of the storage rack has a notch configured to cooperate with a front end of the mechanical arm, the rear end of the storage rack has a stop portion configured to restrict one side of said dedicated reticle storage pod, and the stop portion has an identifiable information which is readable during an interaction between the front end of the mechanical arm and the storage rack;

wherein the storage rack being the storage chamber has a gate which is operatable by the mechanical arm during another interaction between the front end of the mechanical arm and the storage chamber.

14. The method for loading reticle according to claim 13, further comprising:

supplying a non-reactive gas to a storage rack or chamber in response to having the dedicated reticle storage pod with the reticle stored in the storage rack-or chamber.

15. The method for loading reticle according to claim 13, further comprising:

transferring, by the front end of the mechanical arm, the dedicated reticle storage pod with the reticle to a vacant storage rack.

16. The method for loading reticle according to claim 14, further comprising:

operating the front end of the mechanical arm with the gate of the storage chamber to open the gate;

transferring, by a grasp mechanism of the mechanical arm, the dedicated reticle storage pod with the reticle to a vacant storage chamber.

17. A method for unloading reticle, comprising:

providing a reticle storage cabinet system having a storage cabinet including a plurality of storage racks adapted to store one or more dedicated reticle storage pods;

retrieving, by a mechanical arm, a dedicated reticle storage pod containing a reticle from one of the plurality of storage racks of the storage cabinet, and moving the dedicated reticle storage pod with reticle out of the reticle storage cabinet system, such that the reticle contained in the dedicated reticle storage pod is unloaded outside the system; and receiving and storing, by the mechanical arm, the dedicated reticle storage pod without the reticle to a vacant spot of the storage cabinet;

wherein one of the plurality of storage racks is a tablet rack or a storage chamber;

wherein the storage rack being the tablet rack has a front end and a rear end, the front end of the storage rack has a notch configured to cooperate with a front end of the mechanical arm, the rear end of the storage rack has a stop portion configured to restrict one side of said dedicated reticle storage pod, and the stop portion has an identifiable information which is readable during an interaction between the front end of the mechanical arm and the storage rack;

wherein the storage rack being the storage chamber has a gate which is operatable by the mechanical arm during another interaction between the front end of the mechanical arm and the storage chamber.

18. The method for loading reticle according to claim 17, further comprising:

transferring, by the front end of the mechanical arm, the dedicated reticle storage pod without the reticle to a vacant storage rack.

19. The method for loading reticle according to claim 18, further comprising:

operating the front end of the mechanical arm with the gate of the storage chamber to open the gate;

transferring, by a grasp mechanism of the mechanical arm, the dedicated reticle storage pod without the reticle to a vacant storage chamber.

\* \* \* \* \*